United States Patent [19]

Kameda et al.

[11] Patent Number: 5,644,136
[45] Date of Patent: Jul. 1, 1997

[54] SEAL MAKING DEVICE

[75] Inventors: Takanobu Kameda; Machiko Kano; Rui Kondoh; Kenji Watanabe; Tomoyuki Ichikawa; Yuichiro Taniguchi; Chieko Aida, all of Tokyo, Japan

[73] Assignee: King Jim Co., Ltd., Tokyo, Japan

[21] Appl. No.: 325,446

[22] PCT Filed: Mar. 15, 1994

[86] PCT No.: PCT/JP94/00409

§ 371 Date: Oct. 31, 1994

§ 102(e) Date: Oct. 31, 1994

[87] PCT Pub. No.: WO94/21469

PCT Pub. Date: Sep. 29, 1994

[30] Foreign Application Priority Data

| Mar. 15, 1993 | [JP] | Japan | 5-054090 |
| Mar. 15, 1993 | [JP] | Japan | 5-054091 |
| Mar. 29, 1993 | [JP] | Japan | 5-069499 |
| Mar. 29, 1993 | [JP] | Japan | 5-069500 |
| Apr. 2, 1993  | [JP] | Japan | 5-076565 |
| Apr. 12, 1993 | [JP] | Japan | 5-084305 |
| Apr. 19, 1993 | [JP] | Japan | 5-091018 |

[51] Int. Cl.$^6$ ................. B41K 1/00; G03F 7/00
[52] U.S. Cl. ........................................ 250/492.1
[58] Field of Search ............... 250/492.1, 316.1, 250/317.1, 318.1

[56] References Cited

U.S. PATENT DOCUMENTS

| 3,645,204 | 2/1972  | Gosnell .............. 250/492.1 |
| 4,393,411 | 7/1983  | Amtower ............. 358/302   |
| 4,695,528 | 9/1987  | Dabisch et al. ....... 250/317.1 |
| 4,709,149 | 11/1987 | Takahashi et al. ..... 250/318   |
| 4,714,957 | 12/1987 | Takano ............... 358/93    |

FOREIGN PATENT DOCUMENTS

| 46-22642  | 6/1971  | Japan . |
| 60-54434  | 3/1985  | Japan . |
| 62-52553  | 3/1987  | Japan . |
| 1-105271  | 4/1989  | Japan . |
| 2-179783  | 7/1990  | Japan . |
| 4-226778  | 8/1992  | Japan . |
| 4-332645  | 11/1992 | Japan . |
| 4-347681  | 12/1992 | Japan . |

Primary Examiner—Jack I. Berman
Attorney, Agent, or Firm—Oliff & Berridge

[57] ABSTRACT

An object of the present invention is to provide a seal making device, by which any other person other than a specialist can make a desired seal, door plate, name plate or the like easily and quickly.

The seal making device of the present invention employs a resin member on which an imprint figure is formed, and in which a part of the resin member physically stimulated by ultraviolet, laser beam, heat or the like has characteristics different from those of another part and one of the parts can be removed by the action of a predetermined kind of fluid. Further, in the seal making device, as an imprint figure transfer controlling unit controls an imprint figure writing unit as to whether or not a physical stimulation should be given to each minute unit area on a surface of the resin member according to an imprint figure read by an information processing unit, the imprint figure writing unit applies on the surface of the resin member the physical stimulation corresponding to the imprint figure to partially change characteristics of the resin member. Thereafter, the part of the resin member having changed characteristics, or the remaining part of the resin member is removed by using water or the like. Consequently, a seal or a relief or intaglio figure plate engraved with the desired figure is obtained.

23 Claims, 30 Drawing Sheets

F I G. 4
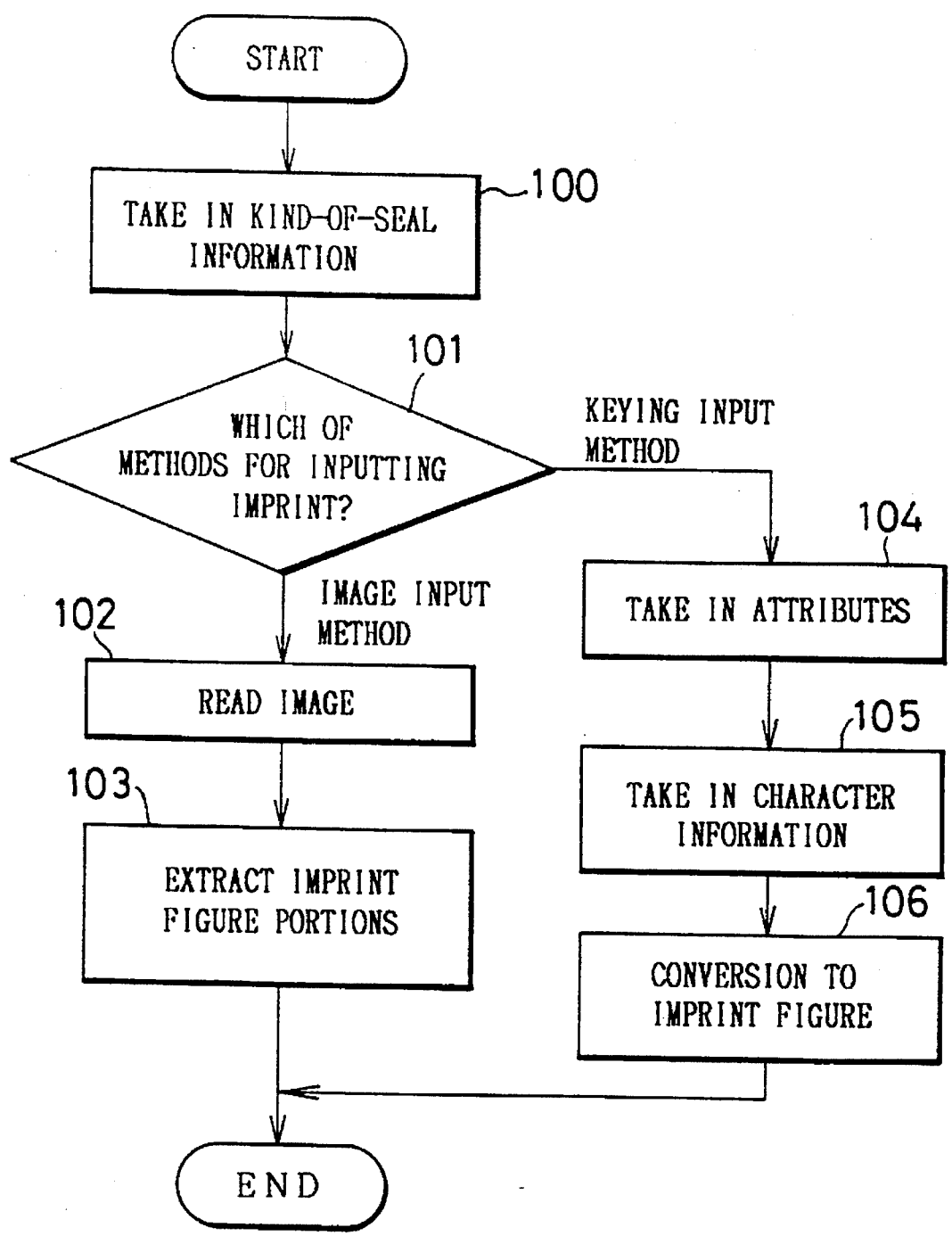

F I G. 2 0
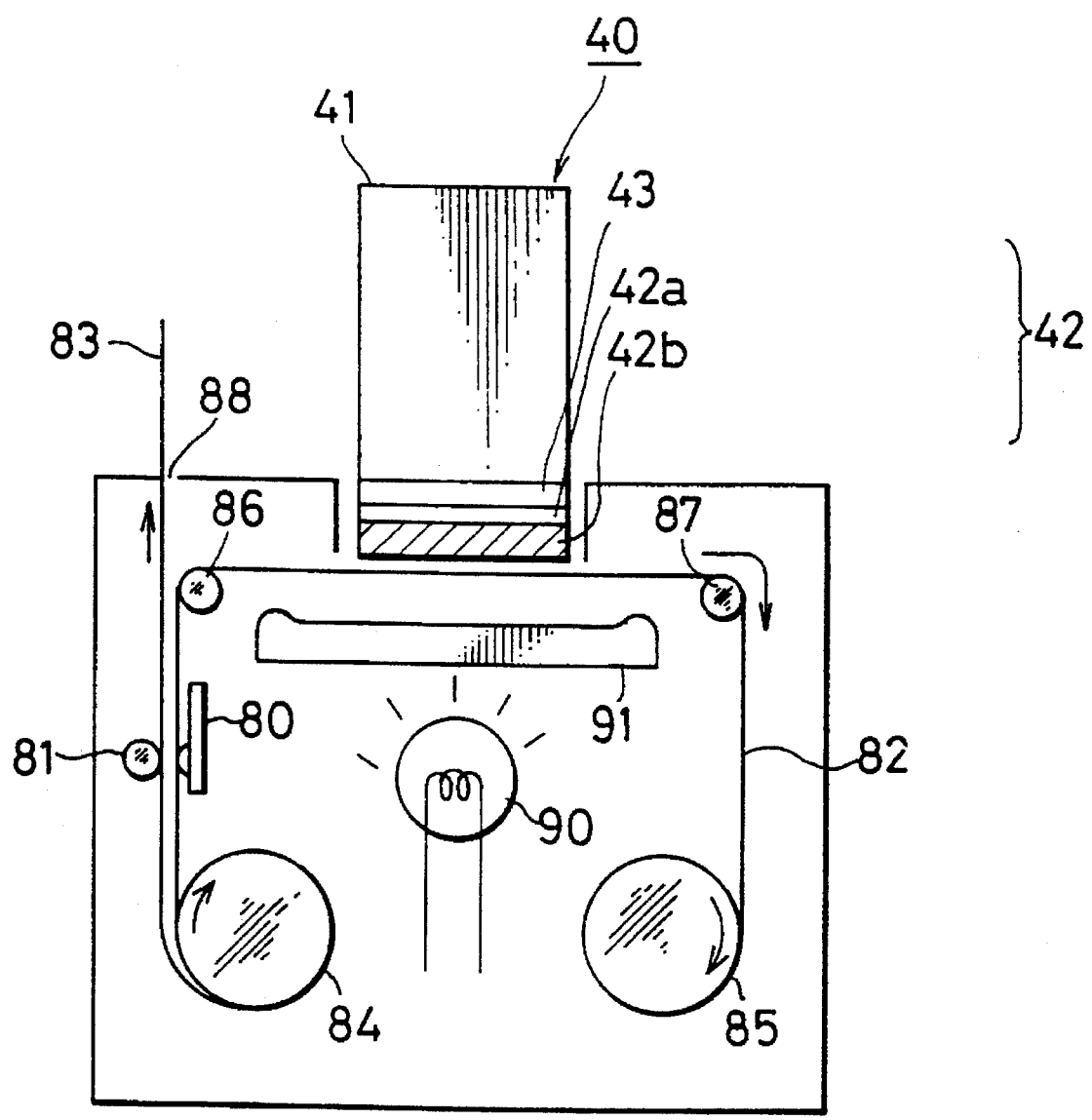

FIG. 32

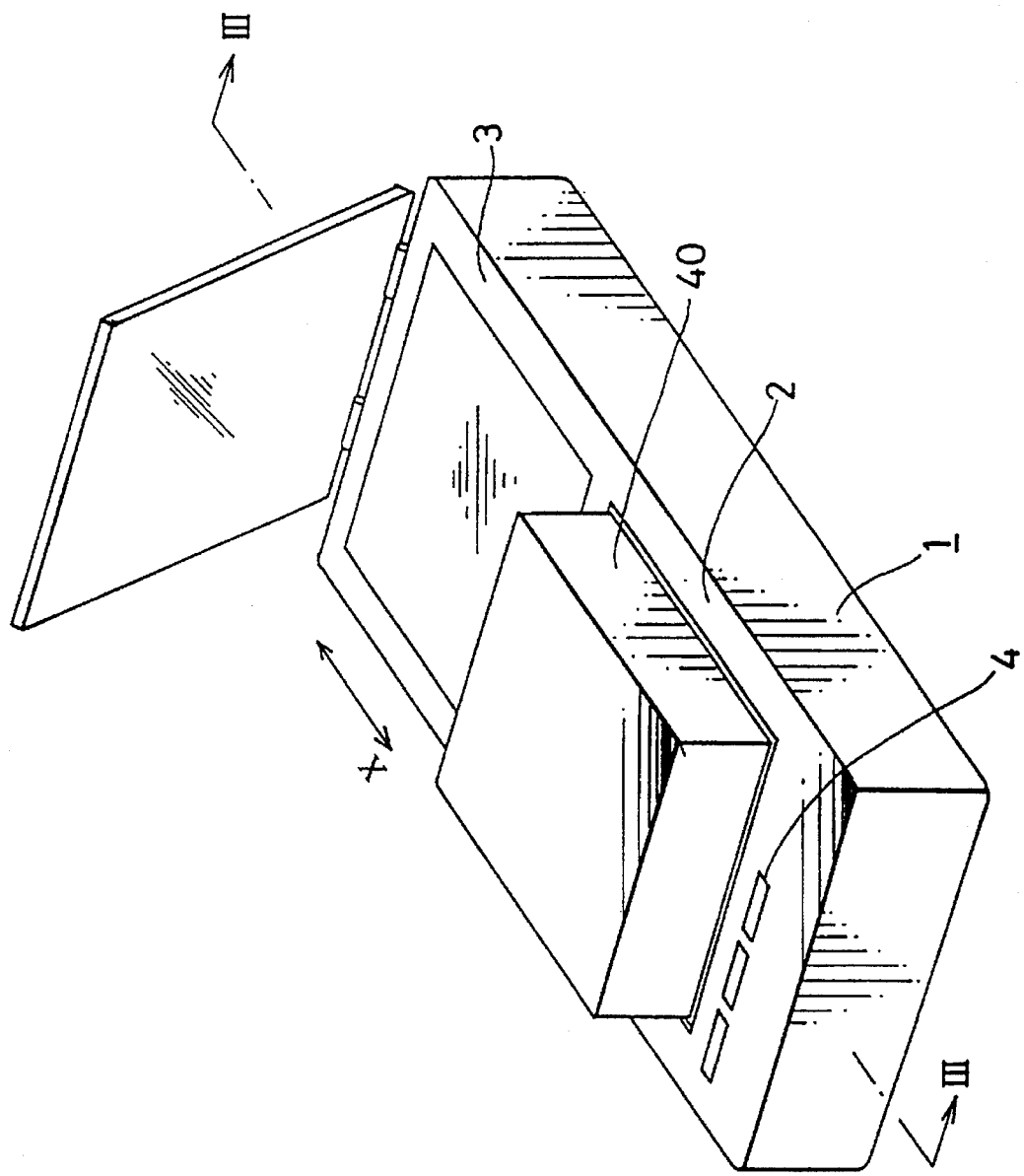

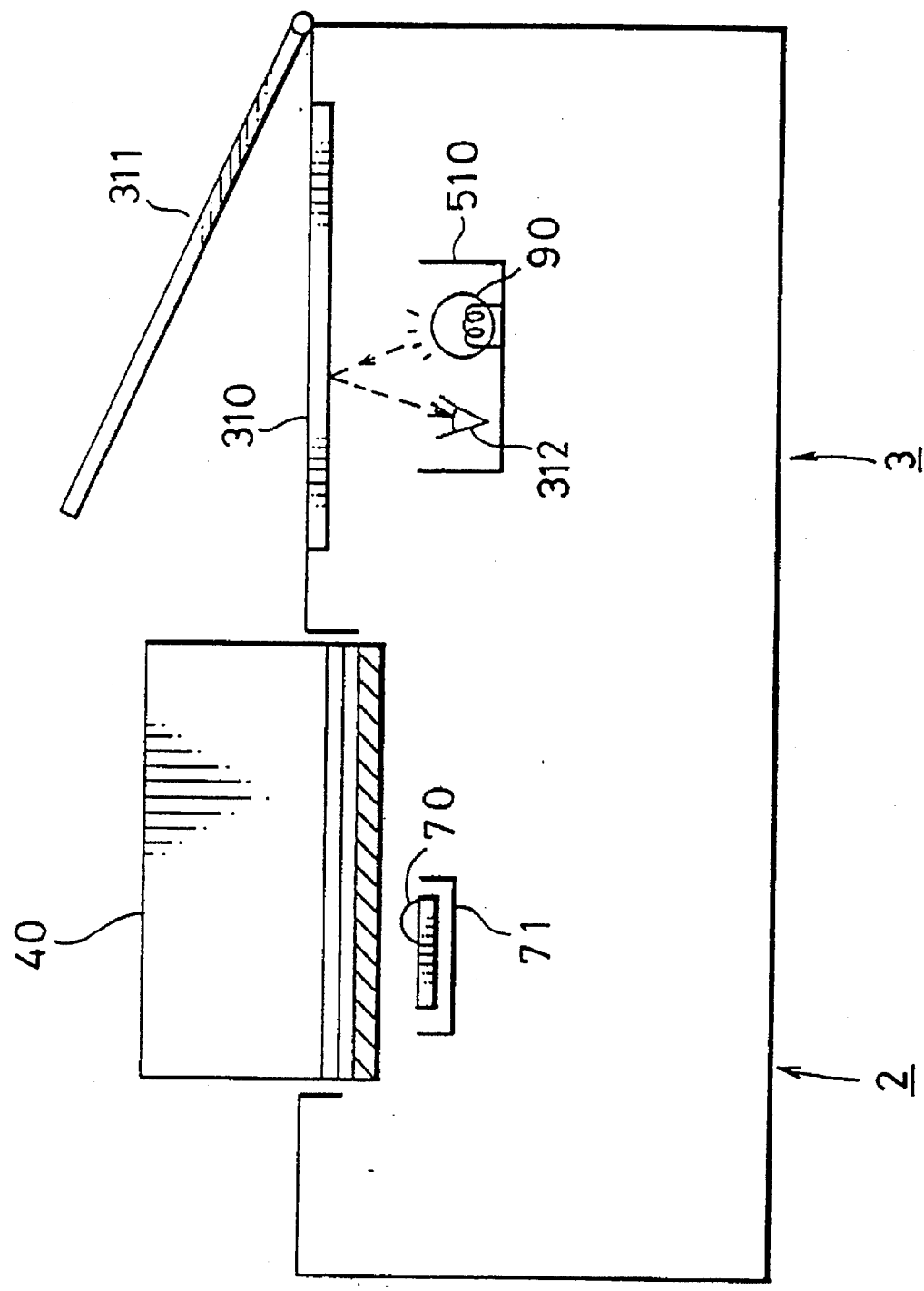

SEAL MAKING DEVICE

BACKGROUND OF THE INVENTION

This invention generally relates to a seal making device and more particularly to a seal making device, by which a person other than an expert and a professional can make a desired seal easily. In the instant specification, the term "seal making device" should be construed as including a relief or intaglio figure plate making device for making a plate, one or both of the front and back sides of which are engraved with relief or intaglio figures or patterns.

Seals in a broad sense, which include a seal engraved with a person's surname or full name, a larger stamp engraved with a mark indicating an office to which individuals belong and a signet, are usually made by experts or professionals. Further, no matter whether such seals are hand-made or machine-made, each of them is usually made by selectively incising a part of the surface of one end of a cylindrical or plate-like body.

Incidentally, a seal is sometimes made by forming, for example, a mold of a resin, on a surface of which is engraved with a relief or intaglio figure projecting or hollowing in inverse relation to the unevenness of the intaglio or relief figure engraved on a surface of the seal, and thereafter injecting a fluid material such as rubber into the mold and then solidifying the fluid material to form an engraved member having substantially the same unevenness as such an intaglio figure.

However, there are many kinds of seals which corporations and individuals wish to have. For instance, a seal indicating an addressee to which letters are frequently mailed, a stamp indicating a title of account, and a seal which is given to a new employee, are often required by them. In case of requesting an expert or a professional to make such a seal, stamp or badge, money matters and the term of making a seal or the like sometimes come into problem.

Further, recently, relief or intaglio figures are sometimes formed on the surfaces of, for example, a doorplate mounted on a door of a person's private room, a plate put up at an entrance of a building and a decoration worn on a person's chest, similarly as in the aforesaid cases of the seals or the like. In such cases, similar matters and problems often occur.

Therefore, there is a demand for a person other than an expert and a professional to make a desired seal or the like easily. Previously, a seal making device (strictly speaking, a seal making kit), by which a person other than an expert and a professional can make a seal, has been on the market.

This conventional seal making device (not shown) employs a film of the ultraviolet sensitive type, an ultraviolet irradiating unit, a planar ultraviolet setting resin member and a stock. Further, a seal is made by using this conventional seal making device as will be described later. Incidentally, the ultraviolet irradiating unit comprises a casing in which an ultraviolet fluorescent lamp is provided, a timer by which a user sets a time to light the ultraviolet lamp, a transparent plate mounted on the top surface of the casing and transmitting ultraviolet light, and an openable lid for preventing the transmitted ultraviolet light from coming out of the transparent plate. Furthermore, the ultraviolet setting resin member comprises a base layer, which is not sensitive to ultraviolet light, and an ultraviolet setting resin layer. Incidentally, the base layer is thinner than the ultraviolet setting resin layer.

In the case of making a seal by using this conventional seal making device, first, characters or patterns (hereunder referred to as an imprint figure), which should be transferred onto paper if the seal is completed and the completed seal is impressed thereon, are drafted on ultraviolet transmittable paper such as tracing paper and thus an original picture of the imprint figure is drawn up.

Thereafter, the original picture and the film of the ultraviolet sensitive type are piled up on the transparent plate of the ultraviolet irradiating unit. Then, the lid is closed. Further, a time for irradiating ultraviolet light is set according to the quality of paper, on which the original picture is drafted, by using the timer. Subsequently, ultraviolet light is irradiated from the ultraviolet lamp onto the film for the set time. The film exposed in this manner is then washed a predetermined liquid (in the case of the device being on the market, this liquid is water) so as to obtain a negative film on which the imprint figure is reversed. Namely, on this negative film, the dark tone portions of the imprint figure appear transparent to ultraviolet light and the remaining portions thereof appear brown (namely, the color obtained as the result of ultraviolet absorption).

Next, this negative film and the ultraviolet setting resin member are piled up on the transparent plate of the ultraviolet irradiating unit. Then, the lid is closed and ultraviolet light is irradiated from the ultraviolet lamp onto the film for a predetermined time. This results in that portions (corresponding to the dark tone portions of the imprint figure), on which the ultraviolet light is irradiated, of the ultraviolet setting resin member are hardened. In contrast, the remaining portions of the ultraviolet setting resin member do not become hard. Upon completion of such a setting processing, the ultraviolet setting resin member is washed by the predetermined liquid (in the case of the device being on the market, this liquid is water) to remove the portions thereof, which do not become hard. Thereby, the engraved member, in which the hardened portions (corresponding to the imprint figure) of the ultraviolet setting resin layer project from the base layers of the remaining portions of the ultraviolet setting resin member, is completed. Subsequently, the fixation of the engraved member completed in this way is performed by further irradiating ultraviolet light thereon.

Then, this engraved member is fitted to the stock. Thus the seal is completed.

This conventional seal making device, however, has drawbacks in that a maker should perform a very large number of operations which include the operation of making an original picture and thus the efficiency is low and the time required for making a seal is long.

These drawbacks are mainly due to the fact that although information on an imprint figure is included in an original picture, this information can not be utilized directly for making the engraved member, namely, a negative film should be made as an intermediate product.

Further, excepting a case that an original picture is made by handwriting an imprint figure intentionally, when the original picture is made by using a predetermined typestyle or typeface, a maker comes to use what is called a word processor or the like. Moreover, it becomes necessary to copy the imprint figure made by the word processor onto ultraviolet transmittable paper by using an electronic copying machine or the like. Thus, the operation of making an original picture requires much time and trouble.

Additionally, it is also necessary to set an ultraviolet irradiating time according to the thickness of ultraviolet transmittible paper and the dark tone of a draft of the original picture. This operation requires skill to some extent.

The present invention is accomplished in the light of the aforesaid problems of the conventional seal making device. It is, accordingly, an object of the present invention to provide a seal making device by which a person other than a specialist in making a seal can make a desired seal easily in a short time.

SUMMARY OF THE INVENTION

The aforesaid object of the present invention is achieved by providing a seal making device which comprises: imprint figure information generating unit for generating imprint figure information; a resin member intended to form a imprint figure thereon, and having property that a part thereof having suffered external physical stimulation changes in characteristics thereof whereby one of the part having suffered the physical stimulation and a part having suffered no physical stimulation can be removed by a physical or chemical action; imprint figure writing unit for selectively giving physical stimulation to the resin member; and imprint figure transfer controlling unit for controlling the imprint figure writing unit in accordance with the imprint figure information generated by the imprint figure information generating unit to thereby give the physical stimulation to a predetermined position on the resin member.

Further, a resin which changes characteristics thereof when receiving light of a wavelength within a predetermined range, for example, ultraviolet light can be cited as a material of a preferred embodiment of the resin member. Moreover, a resin which changes characteristics thereof when receiving heat can be cited as a material of another preferred embodiment of the resin member.

Furthermore, the imprint figure information generating unit generates an imprint figure information signal representing a relief or intaglio figure used as a source of the imprint figure by, for example, reading an image of the relief or intaglio figure. Then, the imprint figure transfer controlling unit gives physical stimulation such as ultraviolet light to the resin member. This results in change of the characteristics of a portion of the resin member having suffered the physical stimulation. Thereafter, one of a portion of the resin member having suffered the physical stimulation, and another portion thereof having suffered no physical stimulation is removed by the physical or chemical action of washing. As a consequence, the relief or intaglio figure is formed on the surface of the resin member in accordance with the imprint figure information.

Therefore, in the case of the device of the present invention, it is not necessary to make an intermediate product such as a negative film. Thus a seal can be made easily and quickly.

BRIEF DESCRIPTION OF DRAWINGS

FIG. 4 is a flowchart for illustrating an imprint-figure-information input operation of the first embodiment of the present invention.

FIG. 20 is a block diagram for illustrating the configuration of an optical system for transferring an imprint of a fourth embodiment of the present invention.

FIG. 32 is a schematic sectional view of a light ray irradiation portion 2 taken on line I—I of FIG. 31.

FIG. 34 is a perspective view of the appearance of a seal making device in the case of the ninth embodiment of the present invention. FIG. 35 is a schematic sectional view of a light ray irradiation portion 2 and an image reading portion 3 taken on line III—III of FIG. 34.

DETAILED DESCRIPTION OF PREFERRED EMBODIMENT

Hereinafter, a seal making device, namely, a first embodiment of the present invention will be described in detail by referring to the accompanying drawings.

Figure 1:
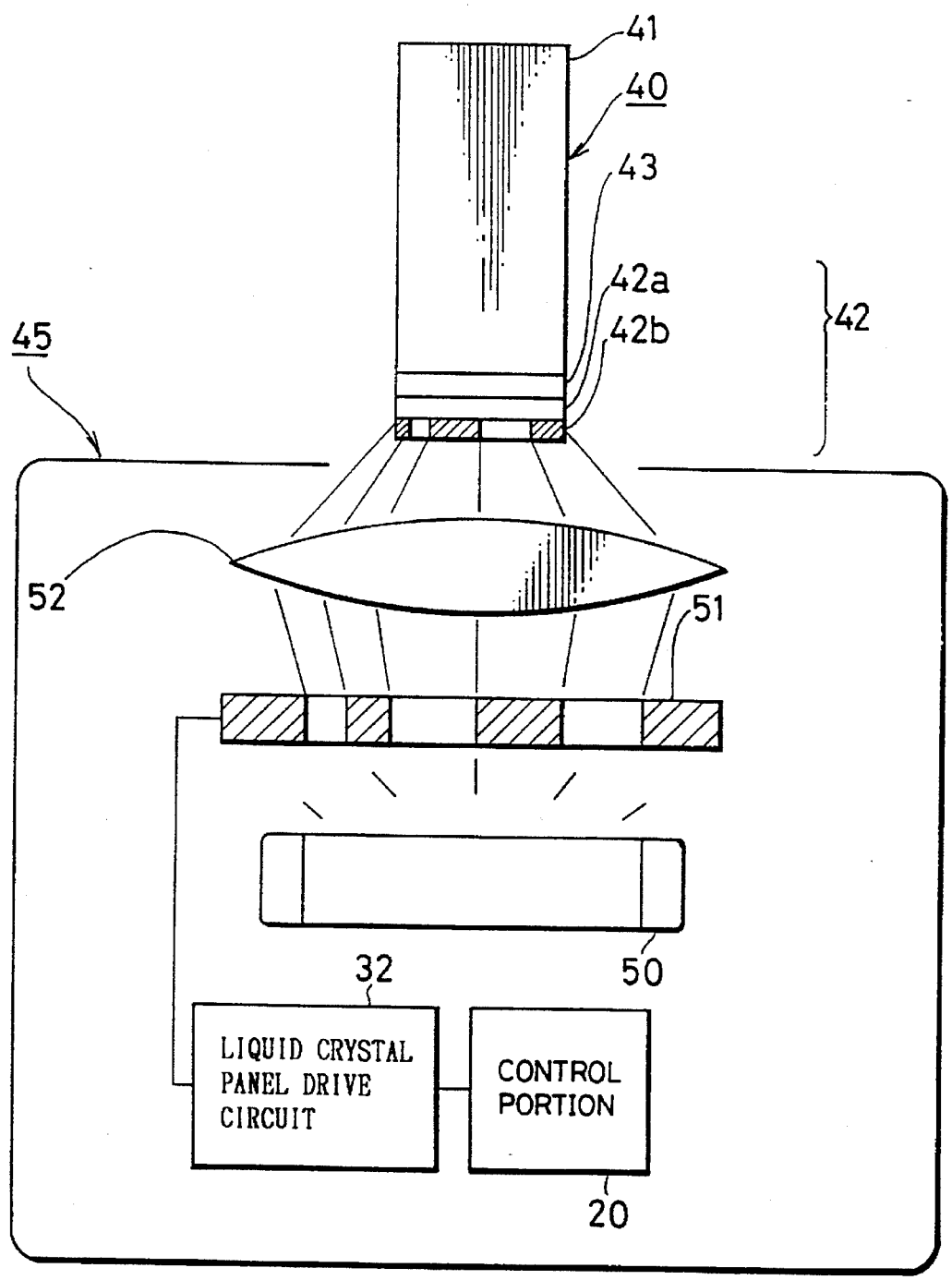
FIG. 1 is a block diagram for illustrating the configuration of an optical system for transferring an imprint of a first embodiment of the present invention.
Figure 5:
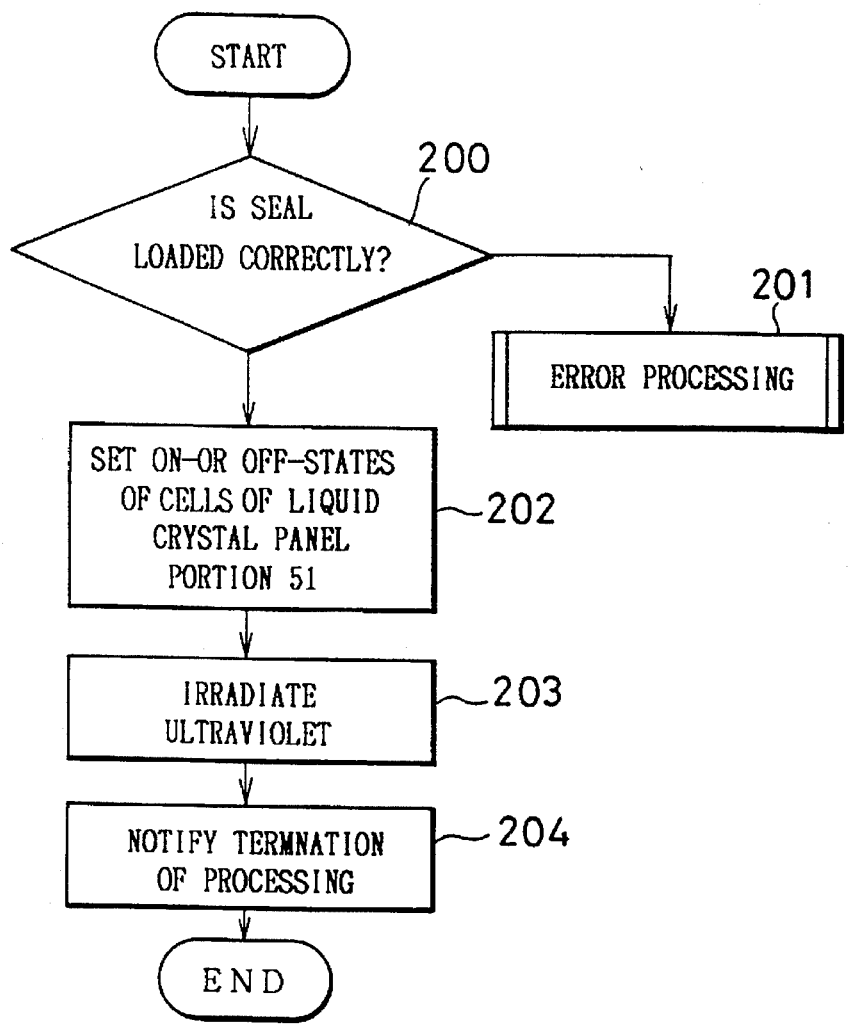
FIG. 5 is a flowchart for illustrating a process of transferring an imprint figure to the resin member of the first embodiment of the present invention.

This seal making device embodying the present invention comprises a main body 40 of a seal and a seal making unit 45. Further, the seal making unit is primarily comprised of an electrical system of FIG. 2 (which further comprises an information processing portion and an imprint transfer controlling portion) and an optical system for transferring an imprint, which is shown in FIG. 1. Incidentally, FIG. 1 also shows the structure of the main body 40 of a seal. Moreover, FIG. 3 is a perspective view of the appearance of this seal making device embodying the present invention. FIGS. 4 and 5 are flowcharts for illustrating fundamental processes for making a seal.

First, the electrical system of this embodiment of the present invention will be described hereinbelow by referring to FIG. 2.

This electrical system is mainly used to input imprint figure information and control the optical system for transferring an imprint and corresponds to a kind of an information processing system. Further, similarly as in the cases of other general purpose electronic information processing systems, this electrical system primarily comprises an input portion 10, a control portion 20 and an output portion 30. The control portion 20 performs a processing according to information input from the input portion 10 and a current processing stage or the like and controls the optical system for transferring an imprint, through the output portion 30 according to a result of the processing.

The input portion 10 comprises a keying input portion 11 which is provided with depressing keys, dialing keys or the like, an image reading portion 12 and a kind-of-seal detecting sensor 13. The keying input portion 11 is operative to generate character code data and various control data to be given to the control portion 20. Further, the image reading portion 12 is operative to read a draft and give image data to the control portion 20. Moreover, the kind-of-seal detecting sensor 13 is operative to detect a kind of the seal loaded into the device and give kind-of-seal information to the control portion 20. For example, each of the main body of the seal and a jig for loading thereof has a physical identification element such as a hole prescribing a kind of the seal. The kind-of-seal detecting sensor 13 reads the physical element and outputs the kind-of-seal information. Incidentally, the kind-of-seal sensor 13 may be omitted.

The output portion 30 is comprised of a drive circuit 31 for driving an ultraviolet irradiating light source 50 (to be described later), another drive circuit 32 for driving a liquid crystal panel portion 51 for transferring an imprint (to be described later) and a further drive circuit 33 for driving a display liquid crystal unit 34. Each of the drive circuits 31, 32 and 33 drives the corresponding portion or unit under the control of the control portion 20. Further, the display liquid crystal unit 34 corresponds to a display unit of an information processing system and is used to display a guidance message for a maker of a seal, imprint figure information or the like.

Incidentally, the ultraviolet irradiating light source 50, the liquid crystal panel 51 for transferring an imprint and drive control portions therefor will be described later (see FIG. 1).

The control portion 20 is comprised of, for example, a microcomputer, in which a CPU 21, a ROM 22, a RAM 23, a character generator ROM (hereunder abbreviated as a CG-ROM) 24, an input portion interface 25 and an output portion interface 26 are connected with one anther through a system bus 27.

In the ROM 22, there are stored various processing programs (see FIGS. 4 and 5) for making a seal, which should be executed by the CPU 21, a conversion table used for converting keyed code data into corresponding character codes and fixed data such as dictionary data used for kana-kanji conversion (for instance, converting a "kana"-code to a "kanji"-code) in the case of effecting Japanese word processing.

Further, the RAM 23 is used by the CPU 21 as a working memory, in which user input fixed data is stored.

Moreover, the CG-ROM 24 stores data representing dot-patterns of characters and symbols, which are prepared in the seal making unit. When inputting code data specifying a character or a symbol, the CG-ROM 24 outputs data representing a dot-pattern corresponding to the specified character or symbol. Incidentally, a CG-ROM for displaying data and another CG-ROM for transferring an imprint may be provided separately from each other.

Furthermore, the input portion interface 25 interfaces the input portion 10 with the control portion 20. On the other hand, the output portion interface 26 interfaces the output portion 30 with the control portion 20.

Additionally, the CPU 21 executes a processing program, which is determined according to an input signal issued from the input portion 10 and to a current stage of a processing, by utilizing the RAM 23 as a working storage area and, if necessary, properly using the fixed data stored in the ROM 22 or the RAM 23. Further, the CPU 21 causes the display liquid crystal unit 34 to display a processing situation and a result of the processing. Moreover, the CPU 21 drives the ultraviolet irradiating light source 50 and the liquid crystal panel portion 51 for transferring an imprint to make a seal.

Next, the configurations of the optical system and the main body of a seal will be described hereinbelow by referring to FIG. 1.

The main body 40 of the seal is comprised of a cylindrical stock 41 (which may be made of material other than wood), a sponge member which is mounted on an end portion of this stock 41 and is made of elastic material such as sponge or rubber suitable for absorbing a pressure and a resisting force when stamping paper with a seal and for making a convex portion of a seal face member get to fit well with the surface of paper and the seal face member 42 having a plate-like shape and provided on the surface of this sponge member 43. The seal face member 42 is comprised of a base layer 42a, which is insensitive to ultraviolet light, and an ultraviolet light setting resin layer 42b which is exposed to ultraviolet light. The thickness of the ultraviolet setting resin layer 42b is set to be equal to the height of a projection (namely, the convex portion) of the seal face member, to which seal or stamp ink adheres.

The main body 40 of the seal is detachably mounted on the seal making unit 45 by a fixture mechanism (not shown). Further, the main body 40 of the seal having, for example, a rectangular section is mounted thereon such that a corner of the rectangle is coincident with a reference point of an orthogonal coordinate system. Furthermore, the main body 40 of the seal having a circular or ellipsoidal section is loaded by way of a fixture jig into the seal making unit 45, similarly as in the case of the main body 40 of the seal having a rectangular section. Incidentally, it is preferable that when the main body of the seal is loaded thereinto, ultraviolet light is prevented from coming through the device.

The optical system for transmitting an imprint is comprised of the ultraviolet irradiating light source 50, the liquid crystal panel portion 51 for transferring an imprint, which can control the transmission of ultraviolet and an objective lens 52 (which is often implemented by a complex or compound lens), and the source 50, the panel portion 51 and the lens 52 are arranged in this order. Further, the ultraviolet setting resin layer 42b is an object to be irradiated. Incidentally, a diffusing plate may be provided between the light source 50 and the main body 40 of the seal, with the intention of uniforming the light rays.

The ultraviolet irradiating light source (for example, a fluorescent lamp) 50 performs light emission only for a period of time when an on-command is given by the light source drive circuit 31 thereto. This period of time for light emission is set to be a time enough for causing a setting in the ultraviolet setting resin layer 42b. Incidentally, the ultraviolet irradiating light source 50 may be turned on or off by using an on-off switch or the like. Namely, the turning-on or turning-off of the ultraviolet irradiating light source 50 may be controlled by the CPU 21.

The on-state and off-state of each of cells placed in a two-dimensional arrangement are established by the liquid crystal panel drive circuit 32 under the control of the control portion 20. Each cell set in an on-state transmits ultraviolet light emitted from the light source 50. In contrast, each cell set in an off-state prevents the transmission of the ultraviolet light emitted by the light source 50. Here, the turning-on and turning-off of each cell are effected such that an image represented by the cells becomes similar to the imprint figure, as will be explained later in the description of an operation of the device. Thus, an ultraviolet image transmitted by the liquid crystal panel portion 51 for transferring an imprint becomes an image of the imprint figure.

Incidentally, a liquid crystal panel is, generally, used in a display device and transmits visible light. However, there is a liquid crystal panel of the type that uses an ultraviolet region as a transmission region. The liquid crystal panel of such a type may be applied by itself or together with an ultraviolet transmitting filter to the liquid crystal panel portion 51 for transferring an imprint.

The objective lens 52 is used to form an ultraviolet image of the imprint figure on the ultraviolet setting resin layer 42b. Further, it is preferable that the focal plane of the objective lens 52 is slightly shifted from the surface of the ultraviolet setting resin layer 42b. If the focal plane of the objective lens 52 exactly coincides with the surface of the ultraviolet setting resin layer 42b, the contour of the imprint figure becomes rugged upon arranging the cells of the liquid crystal panel portion 51 for transferring an imprint. However, bundles of light emitted from the cells slightly overlap with one another if the focal plane of the objective lens 52 is shifted slightly from the surface of the ultraviolet setting resin layer 42b. Thereby, the contour of the imprint figure can be prevented from becoming notched.

Similarly as in the case of the conventional device, portions other than a set or hardened portion of the ultraviolet setting resin layer 42b can be removed therefrom by using a predetermined liquid (for example, water (incidentally, some kind of gas may be used instead of liquid)).

Figure 2:
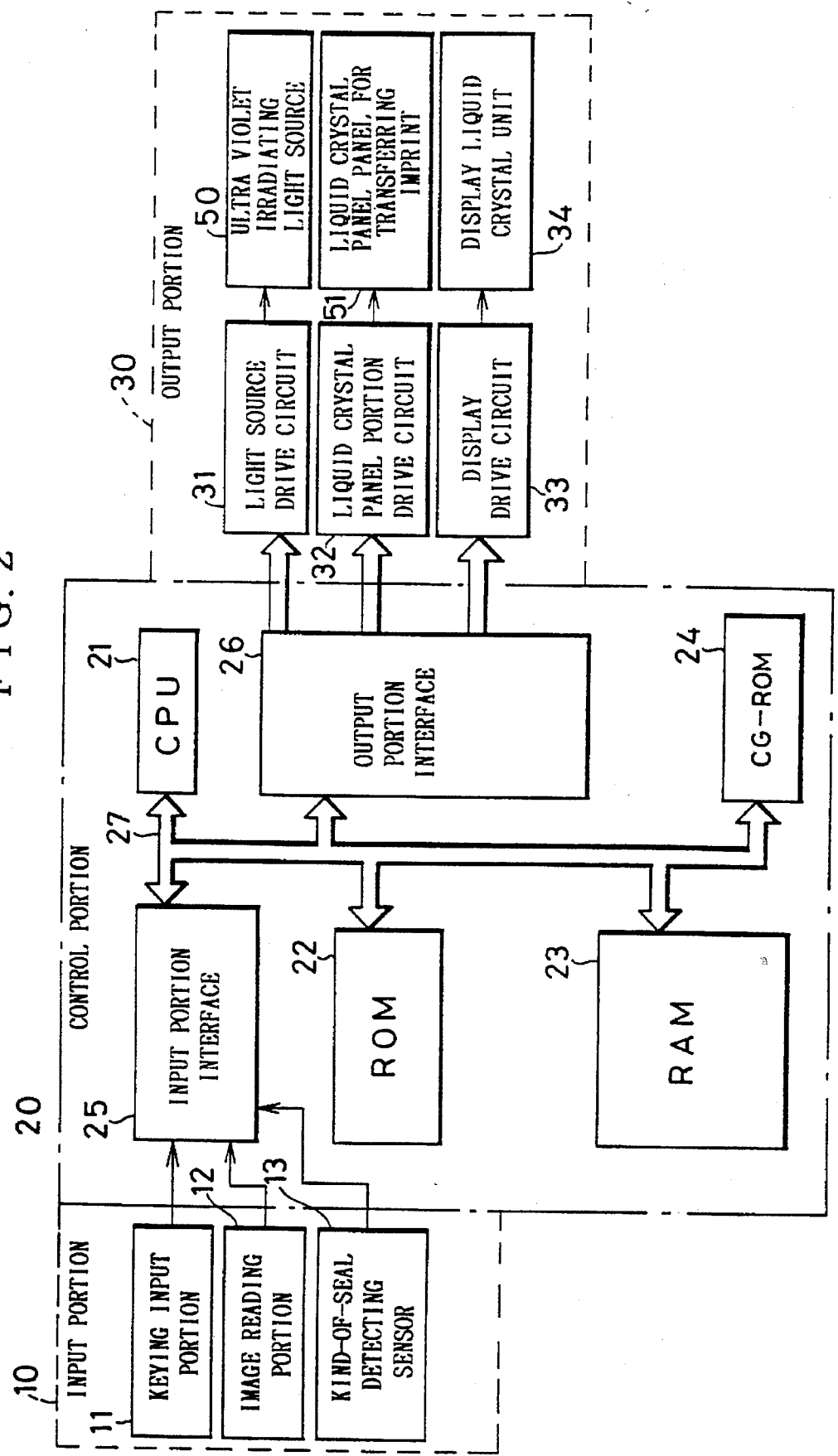
FIG. 2 is a block diagram for illustrating the configuration of an electrical system of the first embodiment of the present invention.
Figure 3:
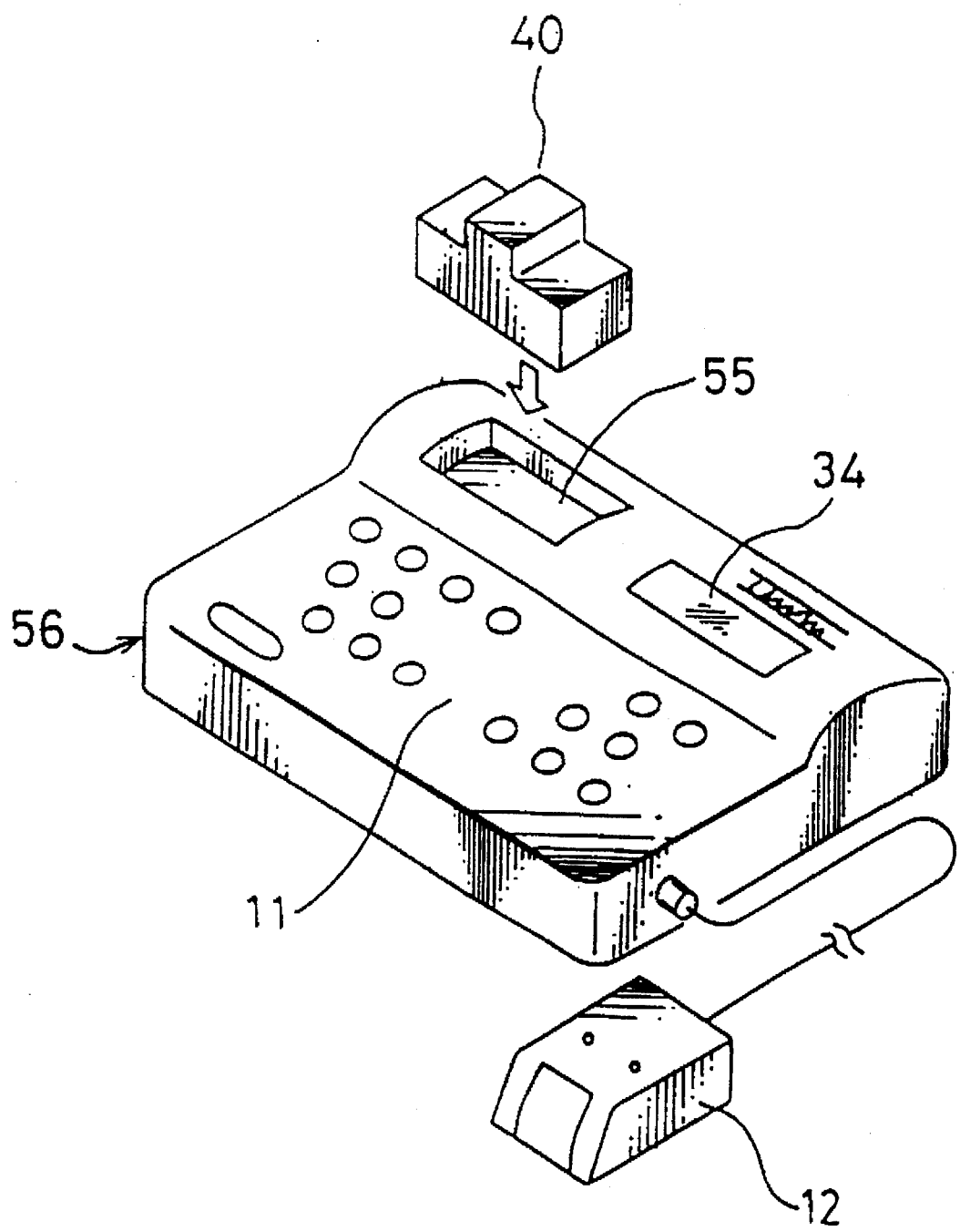
FIG. 3 is a perspective view of the appearance of a seal making device in the case of each of first to sixth embodiments of the present invention.

The seal making device having the electrical system of FIG. 2 and the optical system of FIG. 1 present an appearance as illustrated in, for instance, FIG. 3. In the case of the appearance of FIG. 3, the keying input portion 11, the display liquid crystal unit 34 and a fixture mechanism 55 for the main body 40 of the seal are placed at appropriate positions on a console panel, respectively. Further, the image reading portion 12 is connected to a main body 56 of the seal making unit.

Next, an example of an operation of reading the imprint figure information to be performed mainly by the CPU 21 will be described hereunder by referring to FIG. 4.

When it is ordered by the keying input portion 11 that an operation of reading the imprint figure information should be performed, the CPU 21 starts executing a program which is stored in the ROM 22 and is used for performing the operation of reading the imprint figure information as illustrated in FIG. 4. First, the CPU 21 causes the display liquid crystal unit 34 to display kind-of-seal information and reads the kind-of-seal information selected by a maker of a seal or an operator through the keying input portion 11 (step 100). Here, it is supposed that kinds of seals are defined on the basis of the shape of the face of the seal (for example, a rectangle, a circle and an ellipsoid) and the size of the face of the seal (for instance, a large size, a middle size and a small size) and that the kinds of seals to be handled by this seal making device are predetermined.

Next, the CPU 21 causes the display liquid crystal unit 34 to display a message inquiring which of a keying input method and an image input method the maker chooses. Then, the CPU 21 reads information on the input method selected by the maker from the keying input portion 11 and identifies the selected input method (step 101).

Here, if the image input method is selected, the CPU 21 causes the display liquid crystal unit 34 to display a message requesting the maker to set a draft in the image reading portion 12 and subsequently activate the image reading portion 12. Thereafter, the CPU 21 takes in image data read by the image reading portion 12 (step 102). Subsequently, the CPU 21 instructs the display liquid crystal unit 34 to display the read image and the contour of the face of a seal of the indicated kind while superposing the read image on the contour of the face. Further, the CPU 21 requests the maker to specify a portion of the read image to be used as an imprint figure. Then, the CPU 21 takes in data representing the indicated part to be used as the imprint figure. Moreover, the CPU 21 instructs the display liquid crystal unit 34 to display that part as an imprint figure image. Then, an operation of inputting the imprint figure information is terminated (step 103).

For example, when the maker manipulates a cursor key, the image of the contour of the face corresponding to the indicated kind of a seal is move to the direction indicated by the cursor key. When manipulating a defined key, a part of the read image surrounded by the displayed contour of the face of the seal at that time is input as an indicated imprint figure.

In contrast, in a case where the keying input method is identified as an selected method for inputting the imprint figure information, the CPU 21 causes the display liquid crystal unit 34 to display a message requesting the maker to specify attribute information representing the attributes of the imprint figure and thereafter takes in the specified attribute information of the imprint figure (step 104). Further, the information representing the attributes of the imprint figure includes, for example, information concerning whether or not the imprint is surrounded by a frame, information regarding which of column writing and horizontal writing should be used, information representing the number of lines, information representing the (absolute or relative) size of each character, information indicating which of what is called a negative engraving (corresponding to a reverse display) and what is called a positive engraving (corresponding to a non-reverse display) should be employed, information representing a typeface, information concerning whether or not the imprint figure should be intentionally made to be blurred as a whole, and information indicating the size of the contour of the imprint figure portion. The CPU 21 takes in these kinds of information as the attribute information. However, some attributes can not be designated due to constraints on, for example, the size of a designated seal. For instance, in the case of a small seal, a multi-line pattern is inhibited.

Thereafter, the CPU 21 prompts the maker with an indication displayed by the display liquid crystal unit 34 to input character information. Further, the character information inputted through the keying taken portion 11 is taken by the CPU 21 by performing a processing similar to that performed in an information processing system such as a word processor (step 105). Incidentally, the indication displayed in this input processing is not a representation like an imprint figure image. Further, when the termination of the inputting of the character information is directed, the CPU 21 performs a conversion processing on the input character information according to the indicated various attributes and subsequently, the CPU 21 instructs the display liquid crystal unit 34 to display the converted information as an imprint figure image in order to permit the maker to verify the imprint figure image. Then, the operation of inputting the imprint figure information is finished (step 106). Incidentally, the indication of the input characters may be changed to the indication of the imprint figure image of characters having been input until then and vice versa in response to the keying operation effected by the user.

When finishing the operation of inputting the imprint figure information, the maker of the seal may initiate an operation of transferring the imprint figure to the seal face member 42 immediately. Alternatively, the imprint figure may be once stored in the RAM 23 (or an external storage device).

For example, even in a situation that the imprint figure image is displayed on the screen of the display liquid crystal unit 34 (incidentally, such a situation includes a case that the imprint figure image stored in a storage device is read therefrom and displayed on the screen), the maker can instruct a transfer of the imprint figure onto the seal face member 42 by using the keying input portion 11. At that time, the CPU 21 can start executing a transfer processing program of FIG. 5, which is stored in the ROM 22, for transferring the imprint figure onto the seal face member 42.

The, first, the CPU 21 receives information delivered from the kind-of-seal detecting sensor 13 to verify whether or not the main body 40 of the seal is loaded into the seal making unit 45 and whether or not the kind of the main body 40 of the seal loaded into the unit 45 is matched with the indicated kind of the seal (step 200).

At that time, if it is detected that no seal is loaded into the unit 45 or that an erroneous kind of a seal is loaded thereinto, the CPU 21 performs an error processing, namely, the CPU 21 instructs the display liquid crystal unit 34 to display a message requesting the loading of a correct kind of a seal or the replacement of the main body 40 of the seal (step 201).

In contrast, if the validity of the main body 40 of the seal loaded into the unit is affirmed, the turning-on or turning-off of each of the cells of the liquid crystal panel portion 51 is established according to the imprint figure which is a current object to be transferred (step 202). In the case of this embodiment, each of the cells respectively corresponding to portions of the imprint figure are set to be in an on-state and in contrast, each of the cells corresponding to the background of the imprint figure are set to be in an off-state. Thereafter, the CPU 21 causes the ultraviolet irradiating light source 50 to emit light for a predetermined period of time (step 203). Further, when the predetermined period of time has elapsed, the CPU 21 instructs the display liquid crystal unit 34 to display messages indicating that the irradiation of the ultraviolet light is finished and that the ultraviolet setting resin layer 42b of the main body 40 of the seal should be washed by the predetermined liquid (or water) and finishes the operation of transferring the imprint figure, which comprises the sequence of the steps (step 204).

Upon completion of the transfer processing (namely, the setting processing), the maker washes the ultraviolet setting resin layer 42b by using the predetermined liquid. Thereby, portions of the layer 42b other than the hardened portions thereof are removed therefrom. As the result, convex and concave portions composing the relief or intaglio imprint figure are formed. Thus the seal is completed.

Incidentally, it is preferable that after the washing of the ultraviolet setting resin layer by using the predetermined liquid, the main body 40 of the seal is once again loaded into the seal making unit 45 and further ultraviolet light is irradiated again onto the main body 40 thereof to ensure the hardening of the setting resin layer. In such a case, each of the cells of the liquid crystal panel portion 51 is put into an open state.

Figure 9:
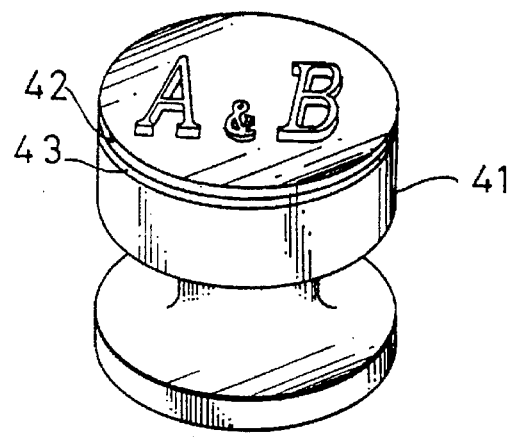
FIG. 9 is a perspective view of a stamp made by the first embodiment of the present invention.
Figure 10:
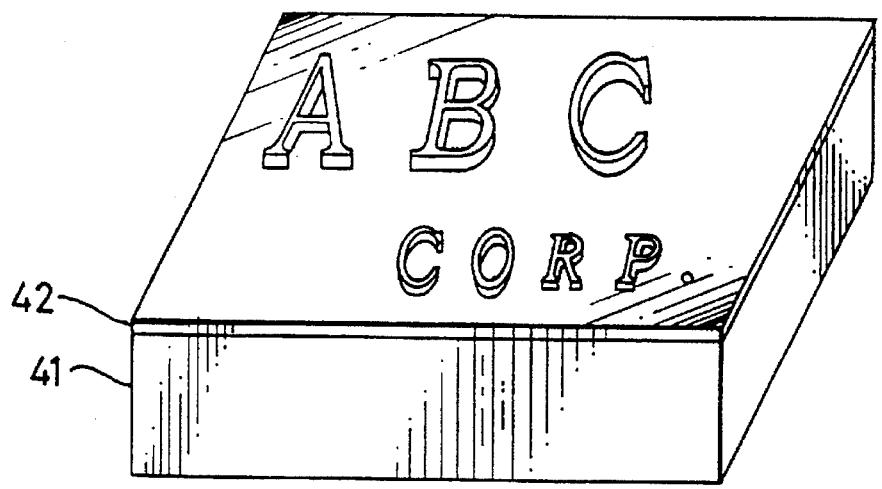
FIG. 10 is a perspective view of an example of a door plate or a badge indicating a company, which is made by the first embodiment of the present invention.
Figure 11:
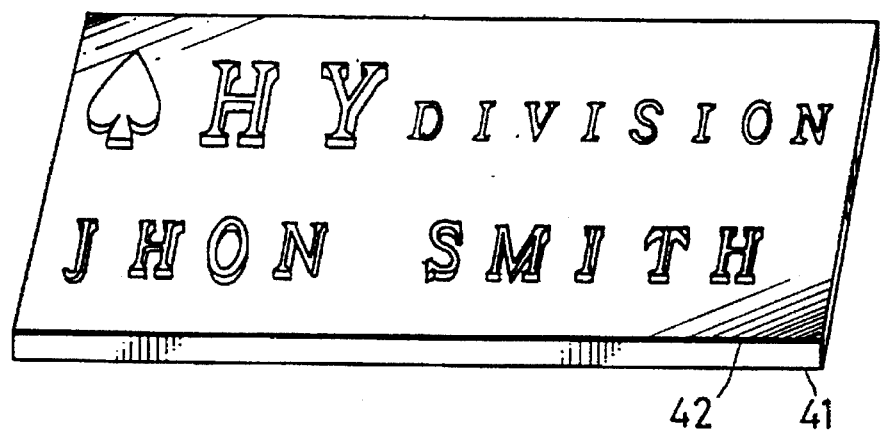
FIG. 11 is a perspective view of a name plate made by the first embodiment of the present invention.

FIGS. 9 to 11 illustrate examples of a seal, a door plate and a name plate made by this seal making device (namely, the first embodiment of the present invention), respectively.

FIG. 9 illustrates the example of the seal (or stamp). As shown in this figure, the seal face member 42, on the surface of which an alphabetical relief pattern "A & B" is formed, is fixed through the sponge member 43 to the stock having an ellipsoidal section.

FIG. 10 illustrates the example of the door plate or badge indicating a company, which is not required to have elasticity unlike the stamp. Thus, the seal face member 42, on which the alphabetical relief pattern is formed, is directly fixed to the stock 41. Incidentally, in the case of a room number plate fixed perpendicularly onto the frame of a door facing a passage, the relief figure as shown in FIG. 10 is formed on each of the front and back surfaces of the door.

FIG. 11 illustrates the example of the name plate which does not need to have elasticity. Thus, the seal face member 42, on which the alphabetical relief pattern is formed, is directly fixed to the stock 41.

Incidentally, in the cases of the door plate or badge of FIG. 10 and the name plate of FIG. 11, it is preferable for increasing the visual discriminability thereof that the color of the ultraviolet setting resin layer 42b is made to be different from the color of the base layer 42a and the stock (or base plate) 41.

As described above, in the case of this embodiment, an operation of making a negative film is unnecessary unlike the conventional device. Moreover, information corresponding to an original picture can be easily created by using the keying input portion 11 or the like. Therefore, a person other than a specialist in making a seal can make a desired seal (or relief or intaglio figure plates such as a door plate, a badge indicating a company and a name plate) easily and quickly. Incidentally, even in the case of using the conventional seal making device, an original picture can be made by a word processor or the like. However, in such a case, for instance, an operation of copying the original picture onto tracing paper is necessary. In this respect, in the case of using the conventional device, more operations are needed as compared with a case of using this embodiment of the present invention.

Further, FIGS. 3 and 4 illustrate a fundamental process flow. This embodiment, however, has an information processing system. Therefore, on the middle of the fundamental process, the main body of the seal (thus, the size of the imprint) and the attributes of the imprint can be easily changed. For the similar reason, if the imprint figure information is once input, this embodiment can make or obtain various seals which are different in size from one another but have similar imprints.

Further, in the case of the aforementioned embodiment of the present invention, the hardened portions of the ultraviolet setting resin layer 42b, namely, the portions of the resin layer 42b left after the washing thereof by the predetermined liquid are used as convex portions composing the relief or intaglio imprint figure. Therefore, when each of the cells of the liquid crystal panel portions 51 is turned on or off, no conversion of the input imprint figure information is required. Namely, it is not necessary to perform a character inverting processing (namely, a character mirroring processing). Thus, the burden of the information processing system of this embodiment is small.

Incidentally, the present invention is not limited to the first embodiment. Various modifications of the present invention may be made. Examples of modifications of the first embodiment of the present inventions are as follows.

(1) The objective lens 52 may be composed of a zoom lens. Further, the expansion and reduction of the imprint may be performed by utilizing the function of the zoom lens. In this case, a drive system for moving a part of the zoom lens becomes necessary. Incidentally, in the case of performing the expansion and reduction of the imprint figure by using such an optical system, a smoothing of the contour of the imprint figure can be achieved far better than in a case where the expansion and reduction thereof is effected by performing an information processing on a bit map. Furthermore, a processing time can be reduced, in comparison with a case where the expansion and reduction thereof is effected by performing an information processing on a line map. Moreover, the magnification factor can be set freely.

(2) A composing element for carrying out a step of washing the setting resin layer 42b by using the predetermined kind of fluid may be provided in the seal making unit 45. For example, the main body 40 of the seal, the setting processing (namely, the imprint transferring processing) of which is completed, may be moved in such a fashion that an end portion thereof is dipped into the predetermined kind of liquid, thereby automatically removing portions other than the hardened portions thereof.

(3) The objective lens may be omitted. Further, the ultraviolet setting resin layer 42b of the main body 40 of the seal may be made to directly touch the surface of the liquid crystal panel portion 51 to harden a portion of the layer 42b corresponding to the imprint figure portion.

(4) Only the seal face member 42 separated from the stock 41 may be loaded into the seal making unit 45 and thereafter the hardening of the ultraviolet setting resin layer 42b may be performed. In this case, it is preferable to dispose an adhesive layer, which is usually covered by released paper, on one of the stock 41 and the seal face member 42, whereby the adhesion between the stock 41 and the seal face member 42 is facilitated.

(5) Information processing system put on sale may be employed as a part of composing elements of the device of the present invention. For example, a word processor, a personal computer and a tape printer may be employed as an information processing part of the device other than the optical system thereof for transferring the imprint. Further, information of the turning-on and turning-off of each of the cells of the liquid crystal panel portion 52 may given from the information processing part through cables thereto.

(6) The display liquid crystal unit 34 and the liquid crystal panel portion 51 may be implemented by using a single liquid crystal device.

Figure 6:
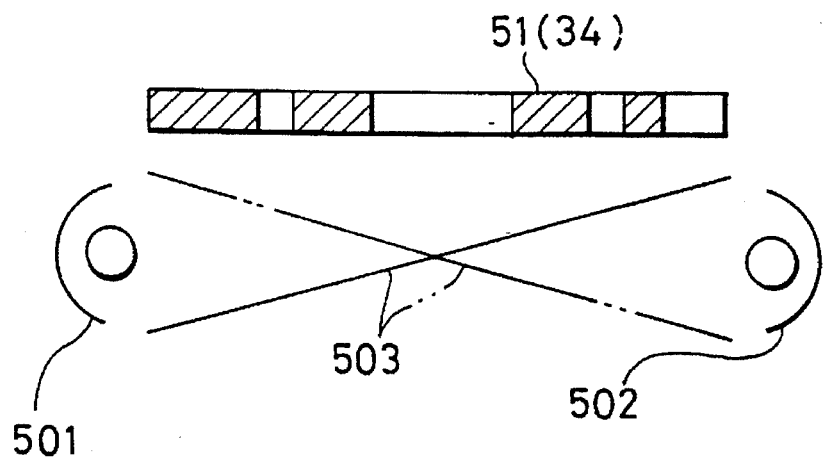
FIG. 6 is a schematic sectional view of an example of the modification of a light source of the first embodiment of the present invention.
Figure 7:
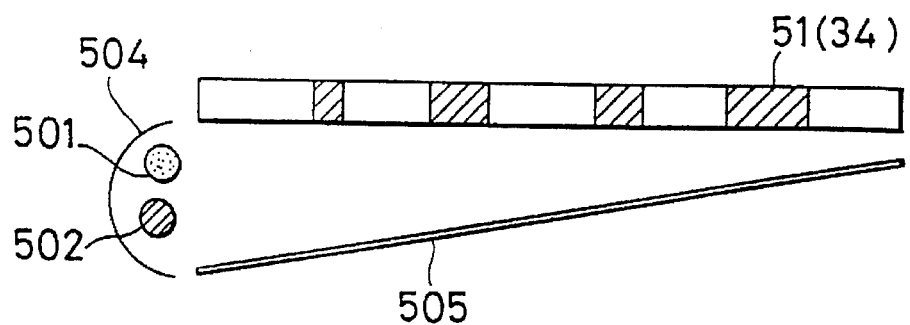
FIG. 7 is a schematic sectional view of another example of the modification of the light source of the first embodiment of the present invention.

For example, as illustrated in FIG. 6, a device capable of transmitting ultraviolet and visible light may be employed as the liquid crystal unit 51. Moreover, an ultraviolet irradiating light source 501 having a parabolic mirror and an visible light irradiating light source 502 may be disposed in the device separately from each other. Furthermore, when serving as a display unit, a back-lighting of the liquid crystal unit 51 (34) may be performed by a swinging mirror 503 using visible light which is irradiated from the visible light irradiating light source 502. When transferring the imprint, a back-lighting of the liquid crystal unit 51 may be performed by using ultraviolet light which is irradiated from the ultraviolet irradiating light source 501. Alternatively, as illustrated in FIG. 7, a device capable of transmitting ultraviolet and visible light may be employed as the liquid crystal unit 51 (34). Moreover, an ultraviolet irradiating light source 501 and a visible light irradiating light source 502, which have a parabolic mirror 504 in common, may be provided in the device. Furthermore, when serving as a display unit, a back-lighting of the liquid crystal unit 51 may be performed by a swinging mirror 505 using visible light which is irradiated from the visible light irradiating light source 502 and further reflected by the mirror 505. When transferring the imprint, a back-lighting of the liquid crystal unit 51 (34) may be performed by using ultrabiolet light which is irradiated from the ultraviolet irradiating light source 501 and further reflected by the mirror 505.

Figure 8:
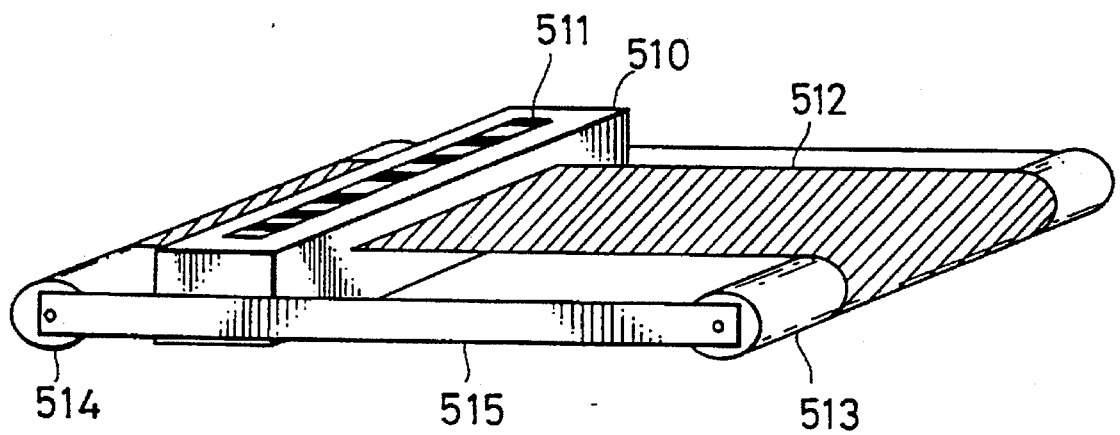
FIG. 8 is a schematic perspective view of an example of the modification of a liquid crystal panel portion for transferring the imprint of the first embodiment of the present invention.

(7) The liquid crystal panel portion 51 may have a one-dimensional configuration. Further, the imprint may be transferred in a secondary scanning direction by moving the seal face member 42 or the liquid crystal panel portion 51. Further, an example of the latter case is illustrated in FIG. 8. In a light source portion 510, a built-in ultraviolet irradiating light source having a parabolic mirror (not shown) is provided. Further, a one-dimensional liquid crystal panel portion illuminated with ultraviolet light coming from the ultraviolet irradiating light source is also provided therein. In FIG. 8, hatched black portions represent cells which do not transmit ultraviolet. The light source portion 510 is fixed to a belt 512 which is extended over two rollers 513 and 514 fixed to a guide frame 515 at a predetermined distance. One of the rollers 513 and 514 is driven by a drive means (not shown) and moves the light source portion 510 fixed to the belt 512 to the left or right, namely, in the secondary scanning direction, as viewed from this figure.

(8) A material, which can be hardened by a physical factor other than ultraviolet light, may be employed as the setting resin layer 42b. For example, a visible-light setting resin or a thermosetting resin may be used as the setting resin layer 42*b*. In the case of using the visible light setting resin, it is preferable that the main body 40 of the seal, of which the visible-light setting resin layer is covered by released paper, is distributed and the released paper is peeled off only when transferring the imprint. Further, in the case of using the thermosetting resin, a panel portion having a one-dimensional or two-dimensional arrangement of heat emission control elements employed in a thermal transfer printer or the like should be used in place of the liquid crystal portion 51. Moreover, similarly as in the case of the modification (3), a setting resin layer should be made to be in contact with the panel portion directly.

(9) A resin, the physically stimulated portion of which can be removed by the predetermined kind of liquid, for instance, a resin which is broken down by irradiating ultraviolet light thereon may be employed as a resin composing the seal face member.

(10) Only one of the image reading or input method and the keying input method may be employed as a method for inputting the imprint figure. For example, in the case of the seal making device which employs only the image reading method, image information read by the image reading portion may be given to the liquid crystal panel portion without any change. In such a case, the CPU itself may be omitted. Alternatively, the input control or transfer control to be performed by the CPU may be omitted.

Next, another seal making device embodying the present invention, namely, a second embodiment of the present invention will be described hereunder in detail by referring to FIGS. 12 to 15.

Figure 13:
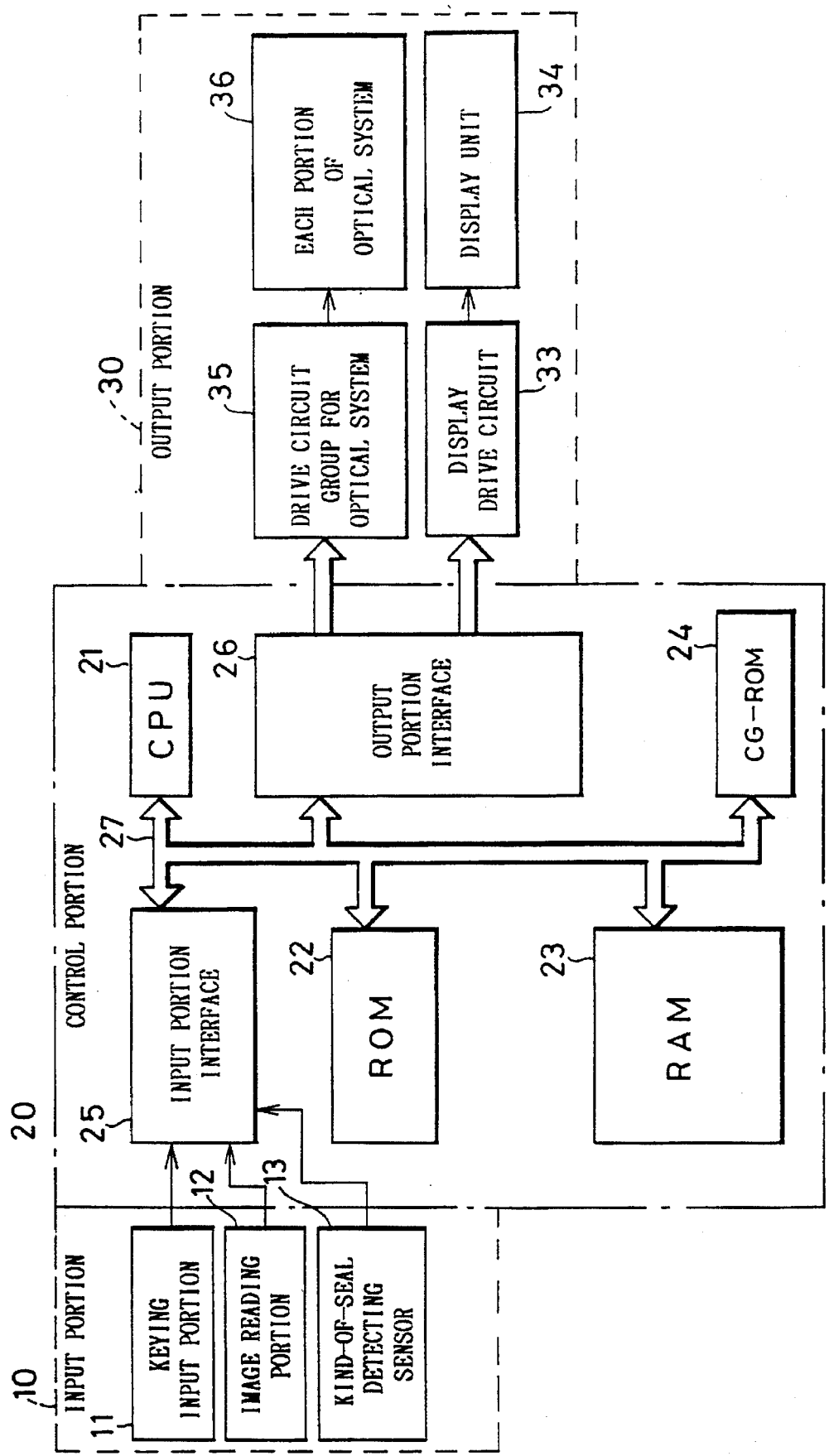
FIG. 13 is a block diagram for illustrating the configuration of an electrical system of the second embodiment of the present invention.
Figure 14:
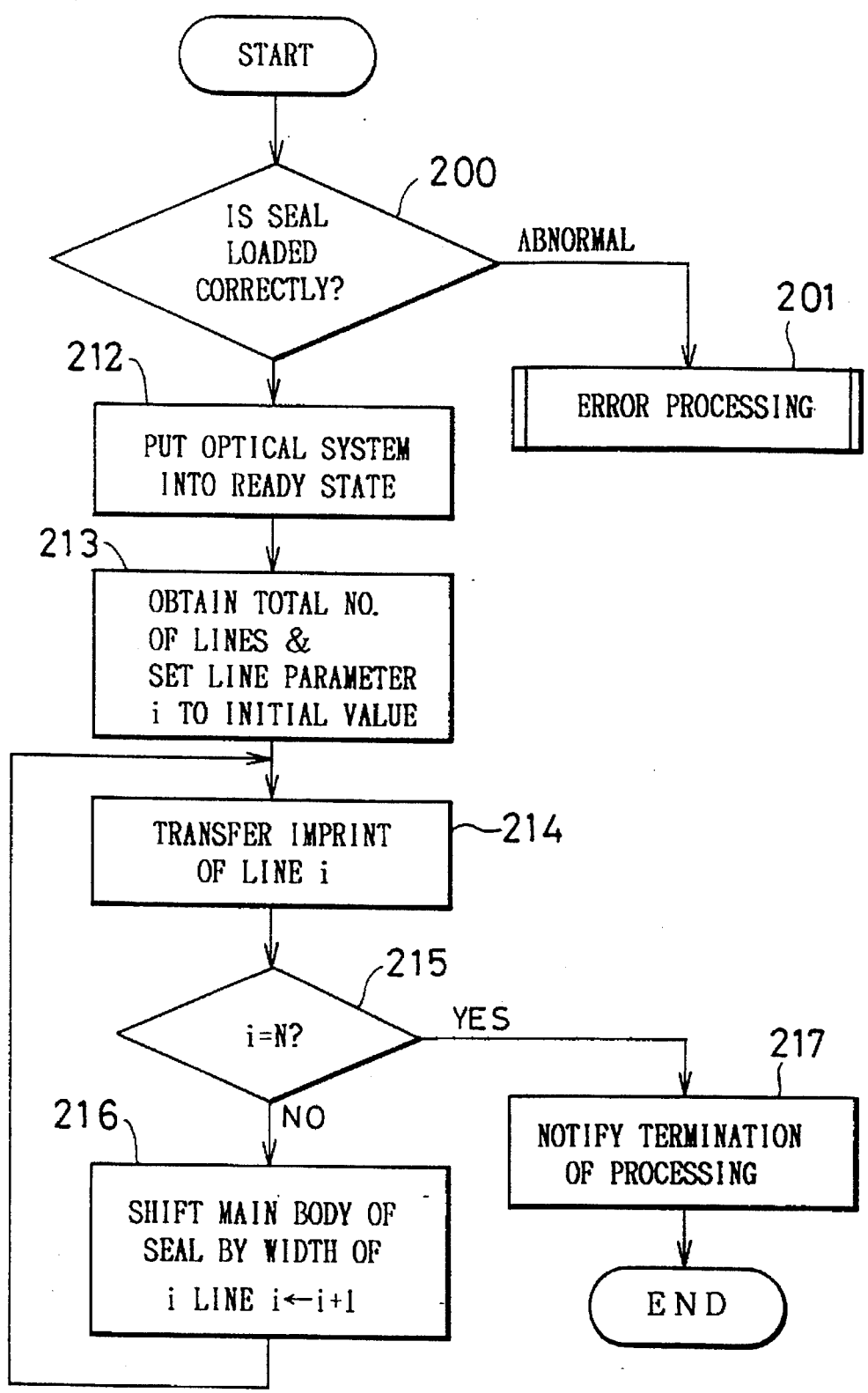
FIG. 14 is a flowchart for illustrating a fundamental process for making a seal in the case of the second embodiment of the present invention.

In the case of this embodiment, the imprint figure or pattern of the seal is formed on the seal face member 42 there of by using scanning rays unlike the first embodiment. This embodiment, namely, this seal making device is composed of the main body of the seal and the seal making unit, similarly as in the case of the first embodiment. Further, the seal making unit is primarily comprised of an electrical system of FIG. 13 (which comprises an information processing portion and an imprint transfer controlling portion) and an optical system of FIG. 12 for transferring the imprint. Incidentally, FIG. 12 also shows the main body of the seal. Further, the appearance of the seal making device of this embodiment is similar to that of the first embodiment of FIG. 3. Moreover, FIG. 14 is a flowchart for illustrating the fundamental process of making a seal.

First, the electrical system of this embodiment will be described hereinbelow with reference to FIG. 13.

This electrical system comprises an input portion 10, a control portion 20 and an output portion 30, similarly as in the case of the first embodiment. The configurations of the input portion 10 and the control portion 20 are the same as in the case of the first embodiment. Therefore, the detail descriptions of the configurations thereof are omitted.

The output portion 30 is composed of an optical system drive circuit group 35 for driving and controlling each part of the optical system for transferring the imprint and a drive circuit 33 for driving the display unit 34. Each of the circuits 33 and 35 drives the corresponding composing elements under the control of the control portion 20.

Incidentally, the optical system drive circuit group 35 comprises various drive circuits. However, these drive circuits are shown in this figure as one unit for the brevity of illustration. As will be described later, some of composing elements of the optical system require a drive control. Practically, a drive circuit is provided correspondingly to each of such composing elements.

Next, the configurations of the optical system for transferring the imprint and the main body of the seal will be described hereinbelow by referring to FIG. 12.

Figure 12:
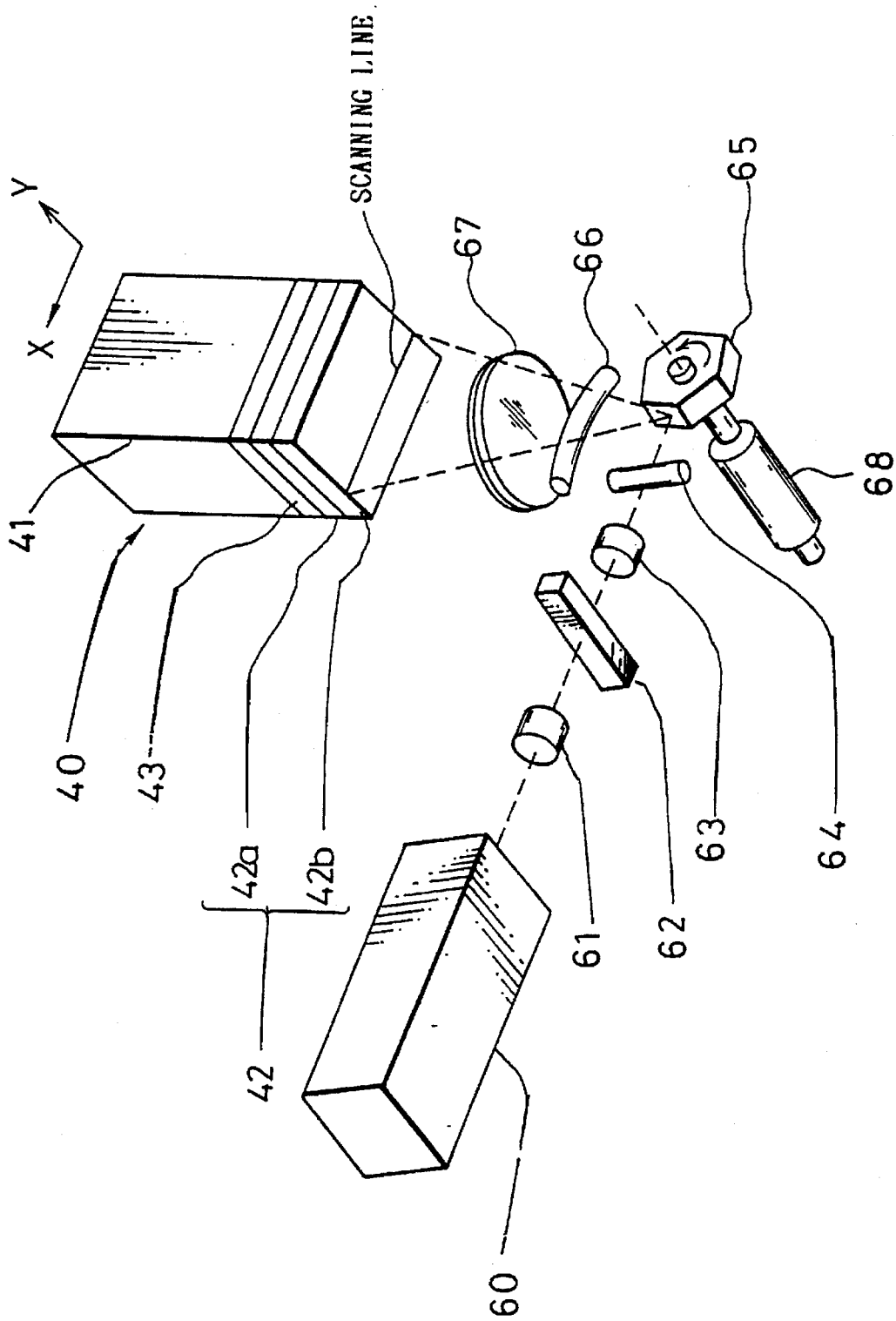
FIG. 12 is a block diagram for illustrating the configuration of an optical system for transferring an imprint of a second embodiment of the present invention.

The structure of the main body 40 of the seal is similar to that of the main body illustrated in FIG. 12. Incidentally, a fixture (not shown) for fixing the main body of the seal can be moved at a predetermined (line) pitch in Y-direction (namely, in the secondary scanning direction) shown in FIG. 12.

The optical system for transferring the imprint comprises an ultraviolet irradiating laser light source 60, a beam collector 61, an optical switch 62, a beam expander 63, a cylindrical lens 64, a polygon mirror 65, an fθ lens 66 and an objective lens 67, which are arranged in this order.

Further, the ultraviolet irradiating laser light source 60 is driven by a drive circuit (not shown (see the circuit indicated by reference character 35 in FIG. 13)) and oscillates and outputs ultraviolet laser beam for a period of time, in which the control portion 20 instructs to output. The laser beams output in this way are converged by the beam collector 61 and then, the converged beams are incident on the optical switch 62. This optical switch 62 is driven by a drive circuit ((not shown (see the circuit indicated by reference character 35 in FIG. 13)) and turns on and off the laser beams. A control command for the optical switch to perform such an operation is issued by the control portion 20. Incidentally, this optical switch 62 may be omitted, if the ultraviolet irradiating laser light source 60 itself is of the type that it can be controlled in response to a control signal representing whether or not laser beams should be emitted therefrom, namely, of the type that a laser beam is emitted like a pulse. The laser beam turned on and off is then made by the beam expander 63 to have a predetermined spot shape. Subsequently, the compensation of change in shape of the spot, which would be caused by the reflection of the beam by the polygon mirror 65, is performed by the cylindrical lens 64 and thereafter, the compensated laser beam is incident on the polygon mirror 65.

The polygon mirror 65 is rotated at a regular speed by a drive circuit (not shown (see the circuit indicated by reference character 35 in FIG. 13) and a drive mechanism (namely, a motor) 68. Further, the polygon mirror 65 performs a deflection scanning of the rectilinearly propagated laser beam in X-direction (namely, in the primary scanning direction), as is well known. The rotation of the polygon mirror is effected under the control of the control portion 20 in synchronization with the operations of turning-on and turning-off of the optical switch 62. The scanning laser beam reflected by the polygon mirror 65 is converted by the fθ lens 66, which is constituted by, for example, a toroidal lens, in such a manner that the scanning speed becomes constant on an object to be irradiated (namely, the ultraviolet setting resin layer 42*b*). Thereafter, the scanning laser beam is irradiated through the objective lens 66, which is constituted by a double spherical lens, onto the ultraviolet setting resin layer 42*b*, the surface of which coincides with the focal plane of the objective lens 66.

Therefore, the turning-on and turning-off of the laser beam by the optical switch 62 is performed according to information for 1 line of the imprint figure in a predetermined direction (the primary scanning direction). Then, a similar operation is repeated by shifting the main body 40 of the seal in the secondary direction by the width of 1 line. Thereby, ultraviolet light can be selectively irradiated only to portions of the ultraviolet setting resin layer 42*b* corresponding to the imprint figure. Namely, the imprint figure can be transferred to the ultraviolet setting resin layer 42*b*.

Next, an operation of this embodiment will be described hereinafter by referring to FIG. 14. Similarly as illustrated in the flowchart of FIG. 5, if the validity of the loaded main body 40 of the seal is confirmed in step 200, the oscillation of the ultraviolet irradiating laser light source is initiated when the optical switch 62 is closed. Then, the rotation of the polygon mirror 65 is commenced. Moreover, a mechanism for driving the main body 40 of the seal placed in an initial position in the secondary scanning direction is put into a ready state. Thus, the optical system for transferring the imprint is put into a ready state (step 212).

When the laser oscillation and the rotation of the polygon mirror 65 are stabilized, the total number N of the scanning lines corresponding to the kind of the seal is obtained. Moreover, a line position parameter i is set to an initial value (namely, 1) thereof (step 213).

Then, image data (binary data) of line i of the imprint figure, which is a current object, is read and the turning-on and turning-off of the optical switch 62 are controlled in synchronization with the rotation of the polygon mirror 65. Subsequently, the scanning and irradiating of beams representing the imprint figure of line i onto the position, which corresponds to line i, of the ultraviolet setting resin layer 42b is carried out. Thus parts of the layer 42b corresponding to line i are hardened (step 214). Incidentally, in a case where the ultraviolet setting resin layer 42b is not sufficiently hardened by performing a scanning only once, the scanning of the same line should be repeated a plurality of times. When such scanning and transferring (namely, hardening) of the line i are finished, it is checked whether or not the scanning and transferring processing of all of the lines is completed. If not, the main body 40 of the seal is shifted by the width of one line and moreover, the line parameter i is incremented by 1. Then, the program returns to step 214 (see steps 215 and 216).

Thereafter, the transferring processing (namely, a hardening processing) is performed repeatedly on all of the lines. Upon completion of such a processing of all of the lines, the result of the checking in step 215 becomes affirmative. At that time, the CPU 21 instructs the display unit 33 to display messages indicating that the transferring processing is completed and that the ultraviolet setting resin layer 42b of the main body 40 of the seal should be washed by the predetermined kind of liquid (water). Thus, the sequence of steps for transferring the imprint figure is finished (step 217).

Thus, after the hardening processing is finished, the maker of the seal washes the ultraviolet setting resin layer 42b of the main body 40 of the seal by using the predetermined liquid. Thereby, portions of the layer 42b other than the portions corresponding to the imprint figure are removed therefrom to form convex and concave portions thereof representing the relief or intaglio imprint figure. Finally, the seal is completed.

In the case of the second embodiment, the operation of making the negative film as required in the case of the conventional device becomes unnecessary and the information corresponding to an original picture can be easily created by using the keying input portion 11 or the like, similarly as in the case of the first embodiment. Thus, any other person other than a specialist in making a seal can make a desired seal (and relief or intaglio figure plates such as a door plate, a badge representing a company, a name plate or the like) easily in short time.

Incidentally, the present invention is not limited to this embodiment and the previously described embodiment. Further, examples of modifications of the second embodiment of the present inventions are as follows.

Figure 15:
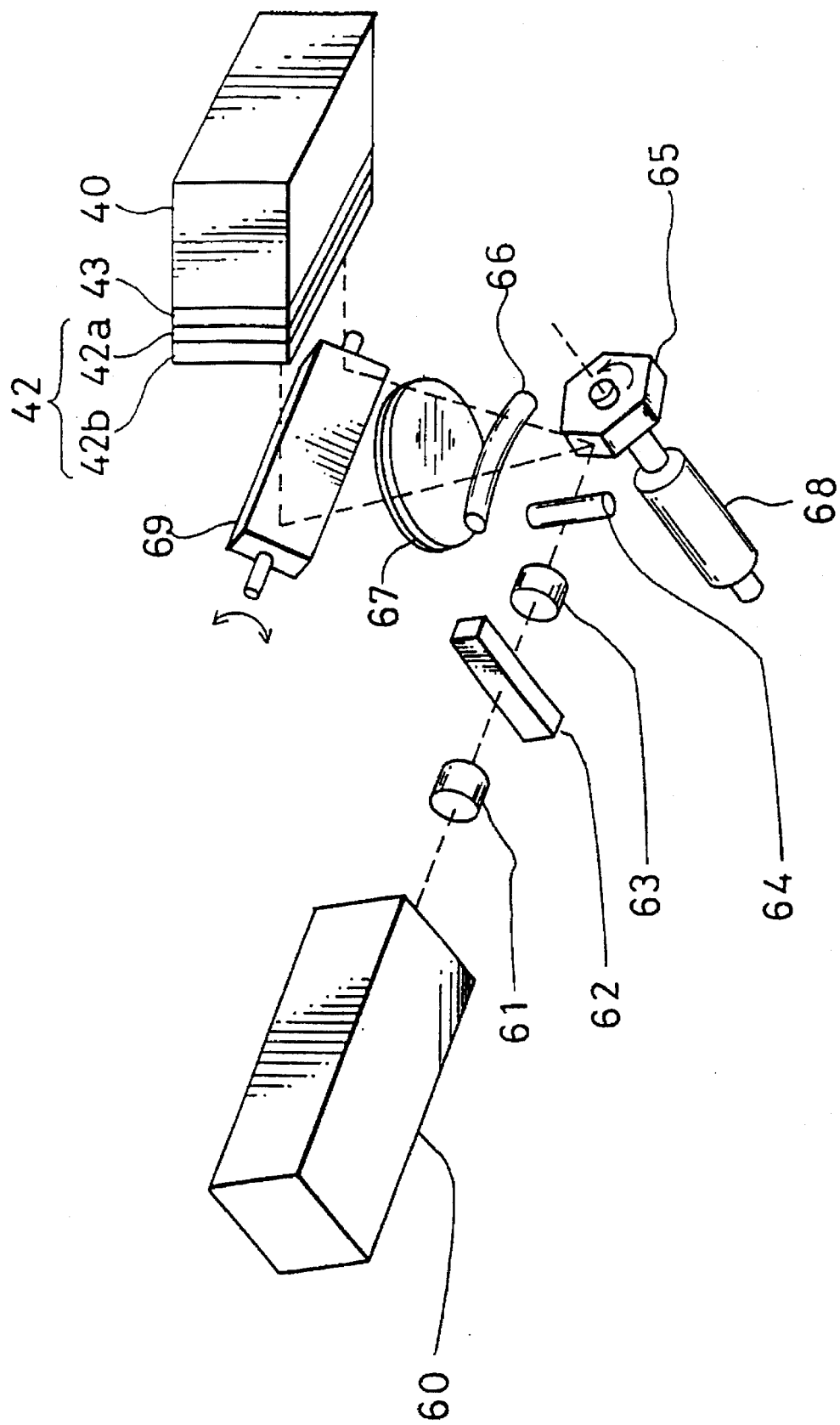
FIG. 15 is a block diagram for illustrating the configuration of an optical system for transferring an imprint in the case of an example of the modification of the second embodiment of the present invention.

(11) The transferring in the secondary direction may be performed by moving all of the optical portions from the laser light source 60 to the objective lens 67 instead of moving the main body 40 of the seal. Further, the laser beam having passed through the objective lens 67 may be scanned in the secondary direction on the main body 40 of the seal by providing an oscillating mirror 69, which changes an oscillating angle in the secondary direction, in the device as illustrated in FIG. 15.

(12) The expansion and reduction of the imprint figure may be performed by effecting an optical processing instead of performing an information processing. The expansion and reduction of the imprint figure can be achieved by suitably combining changes in regular rotation speed of the polygon mirror 65, in fundamental period of turning-on and turning-off of the optical switch 62 and in quantity of a shift in the secondary direction Next, a further seal making device embodying the present invention, namely, the third embodiment of the present invention will be described hereinafter by referring to FIGS. 16 to 19.

In the case of this embodiment, ultraviolet light is irradiated after an imprint figure is printed by using ink formed in such a manner not to transmit ultraviolet light.

Figure 18:
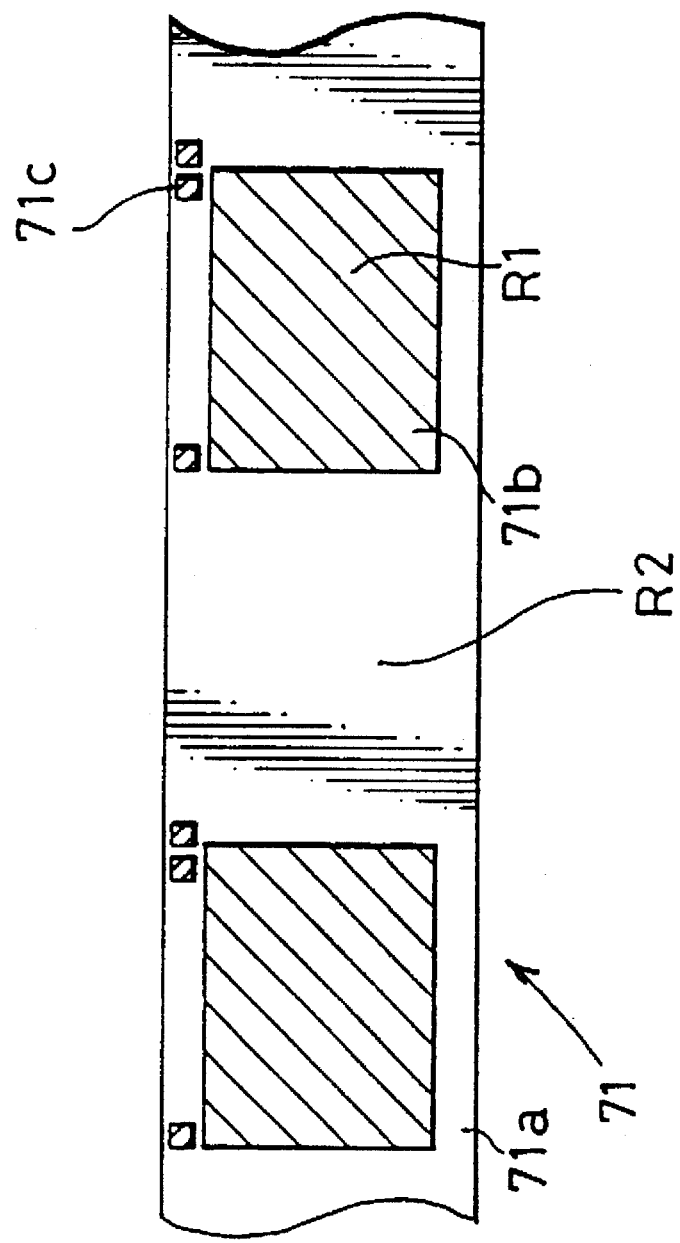
FIG. 18 is a plan view of what is called an ink ribbon.
Figure 19:
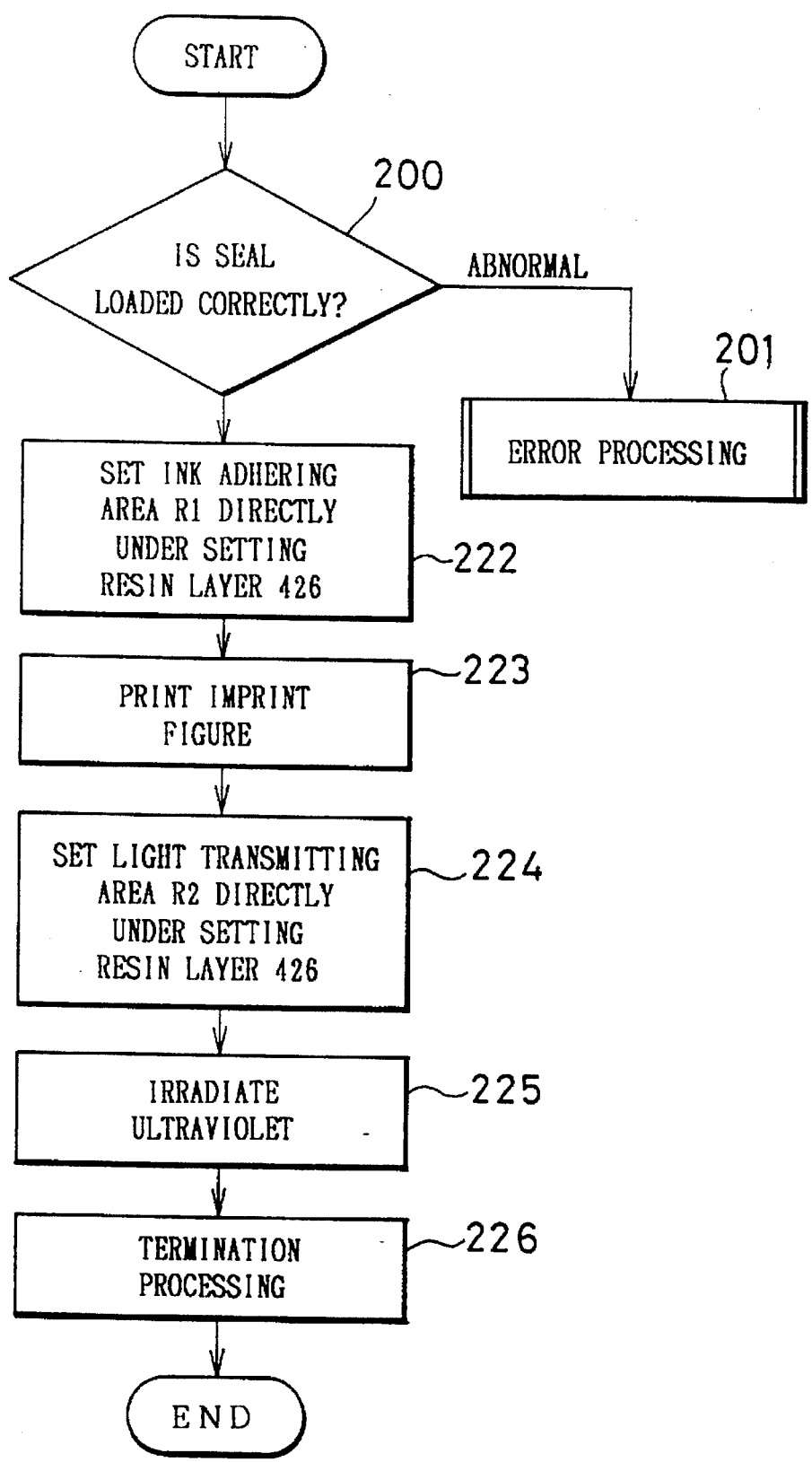
FIG. 19 is a flowchart for illustrating a fundamental process to be performed by a control portion of the third embodiment of the present invention.

This seal making device embodying the present invention is composed of the main body of the seal and the seal making unit. Further, the seal making unit is primarily comprised of an electrical system of FIG. 17 (namely, an information processing portion, an imprint transfer controlling portion or the like) and a mechanismic optical system of FIG. 16 (namely, a printing portion and a light ray irradiating portion or the like). Incidentally, FIG. 16 also illustrates the configuration of the main body of the seal. Further, FIG. 18 is a plan view of an ink ribbon. FIG. 19 is a flowchart for illustrating a fundamental processing to be performed by a control portion of this embodiment.

This electrical system comprises an input portion 10, the control portion 20 and an output portion 30, similarly as in the case of the first embodiment. The input portion 10 and the control portion 20 are similar to the corresponding portions of the first embodiment. Therefore, the detail description of these portions is omitted here for the simplicity of description.

Further, the output portion 30 is composed of a mechanismic optical system drive circuit group 35' for driving and controlling each portion of the mechanismic optical system and a drive circuit 33 for driving a display unit 34. Moreover, each of the mechanismic optical system drive circuit group 35' and the drive circuit 33 drives the corresponding composing portions under the control of the control portion 20.

Incidentally, the mechanistic optical system drive circuit group 35' is constituted by various drive circuits. However, such drive circuits are illustrated as one unit. As will be described later, various composing elements of the mechanistic optical system require drive controls. Practically, a drive circuit is provided correspondingly to each of such composing elements thereof.

Figure 16:
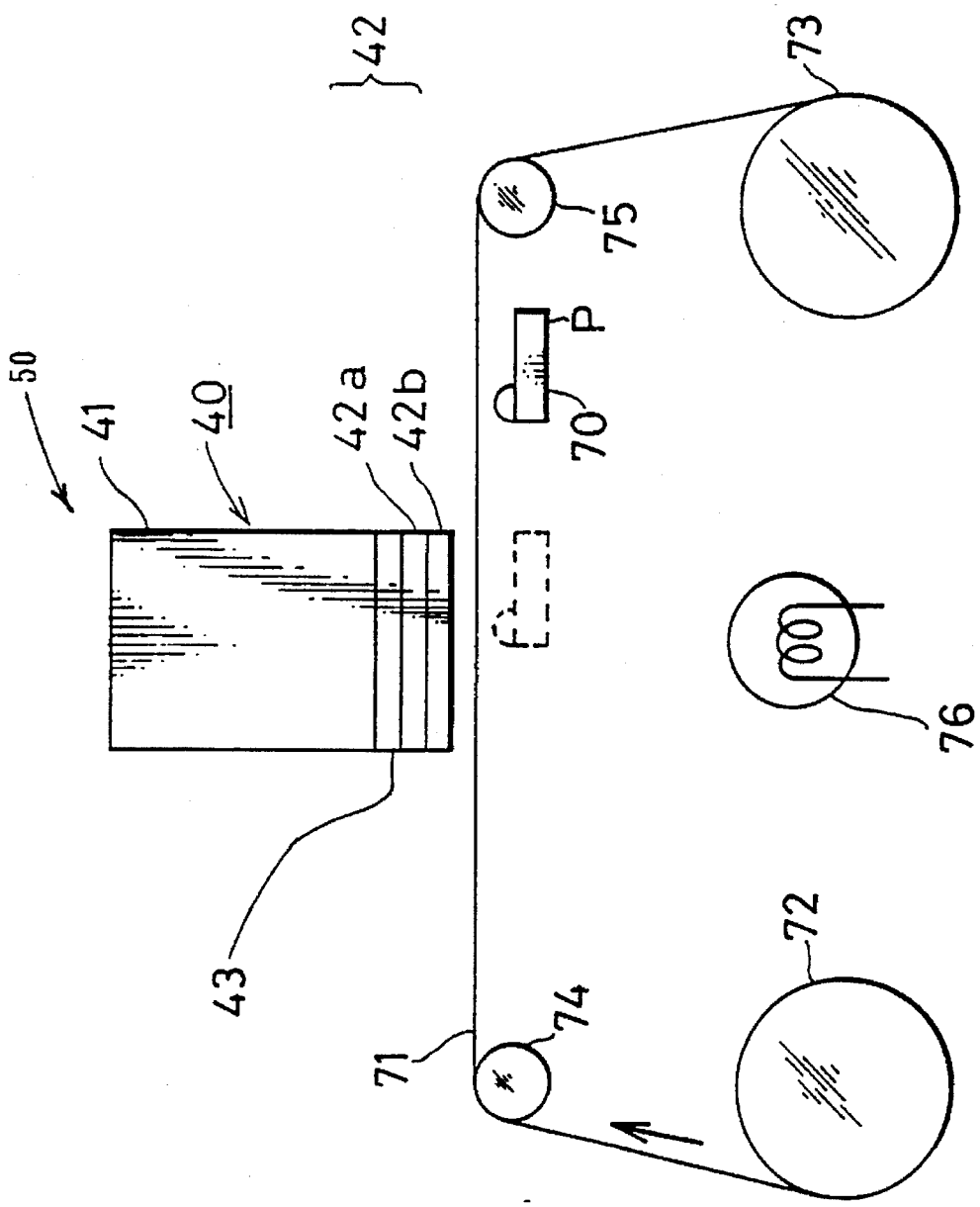
FIG. 16 is a block diagram for illustrating the configuration of an optical system for transferring an imprint of a third embodiment of the present invention.

The mechanistic optical system of FIG. 16 is primarily composed of a print unit and an ultraviolet light irradiating unit.

The print unit is of, for example, a thermal transfer type and employs an ultraviolet setting resin layer 42b as an object to be printed. Further, the print unit comprises, a movable type print head 70, an ink ribbon 71, a supply reel 72 for supplying the ink ribbon 71, a take-up reel 73 for taking up the ink ribbon and rollers 74 and 75 for changing the direction in which the ink ribbon 71 moves forward.

The movable type print head 70 generates heat and transfers ink of the ink ribbon 71 onto the ultraviolet setting resin layer 42b when a heat-generation driving circuit (see the circuit indicated by reference character 35' in FIG. 17) performs a drive operation under the control of the control portion 20. Further, the print head 70 moves under the control of the control portion 20 when the movement drive circuit (see the circuit indicated by reference character 35' in FIG. 17) moves. Incidentally, in the case of this embodiment, the home position P of the movable type print head 70 being in a stand-by state is set at a position being apart from a region connecting the ultraviolet setting resin layer 42b with an ultraviolet irradiating light source 76 (to be described later) in such a manner not to prevent an irradiating operation (to be described later).

The ink ribbon is constituted by making ink 71b selectively adhere to a sheet member 71a which is able to transmit ultraviolet light, as is seen from a plan view thereof illustrated in FIG. 18. Further, a mark 71c, which should be detected by an ink ribbon position detecting sensor (not shown) for identifying which of the ink adhering area R1 and the light transmitting area R2 an area facing the ultraviolet setting resin layer 42b is, is formed on the ink ribbon 71. Here, ink (for example, black ink) preventing the transmission of ultraviolet light is selected as the ink 71b. Further, the size of the ink adhering area R1 is set to be equal to or greater than the area of the ultraviolet setting resin layer 42b attached to the maximum main body 40 of the seal. Moreover, the size of the light transmitting area R2 is set to be equal to or greater than that of the ink adhering area R1.

Incidentally, a pressure is applied from the main body 40 of the seal onto the sheet member 71a, though the magnitude thereof may depend on the structure of the fixture for fixing the main body 40 of the seal. Thus, it is preferable to employ a material resistant to the pressure applied perpendicularly thereto, which is higher than that of an ordinary material of the sheet member of the ink ribbon.

For example, an ultraviolet irradiating light source 76 constituted by a fluorescent lamp is provided in the mechanismic optical system in, for instance, a fixed manner, as the ultraviolet light irradiating unit. Further, the turning-on and turning-off thereof is controlled by the control portion 20. Incidentally, a lens system and a mirror system for converging irradiated light to the ultraviolet setting resin layer 42b may be provided in the unit.

Figure 17:
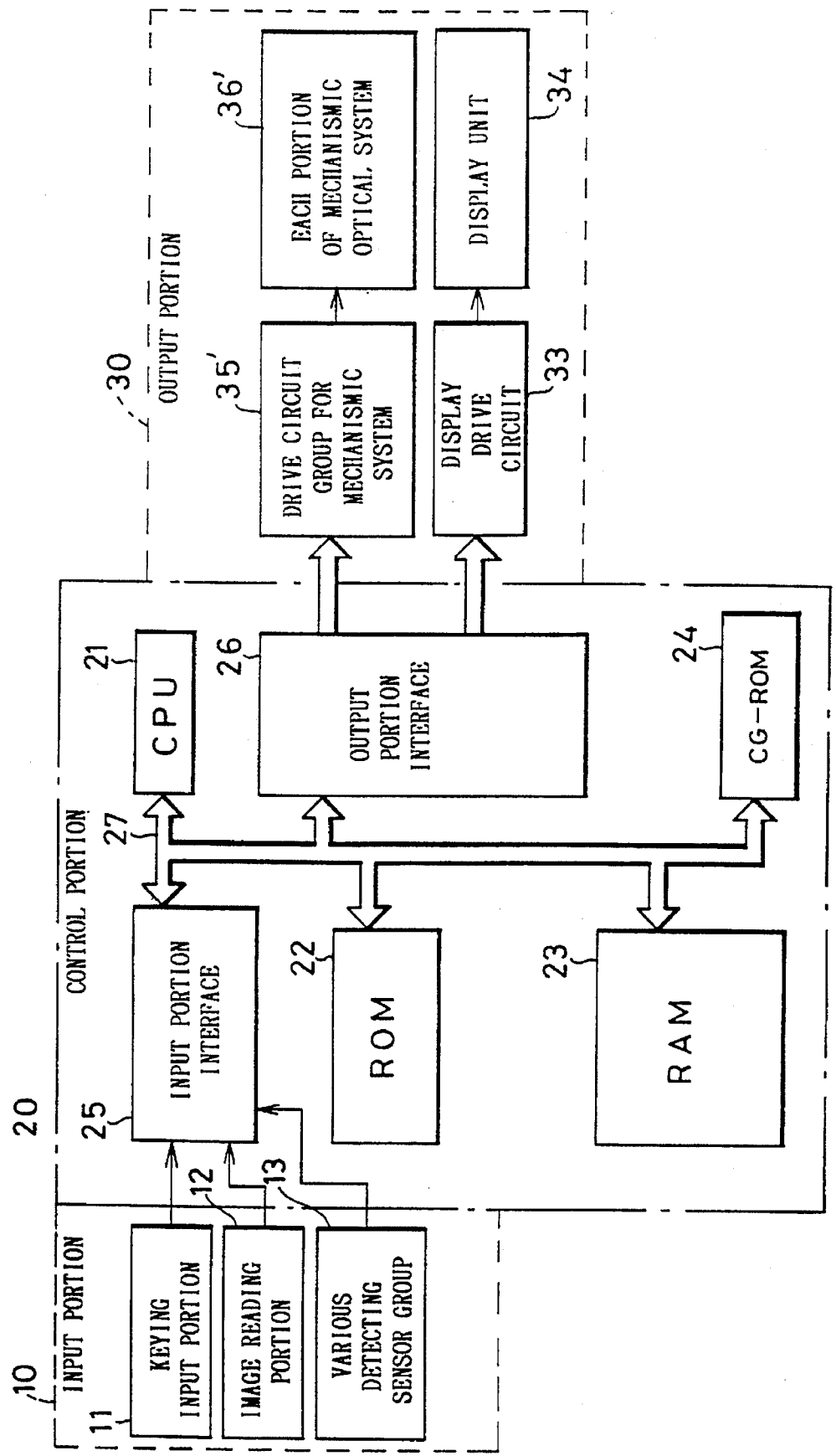
FIG. 17 is a block diagram for illustrating the configuration of an electrical system of the third embodiment of the present invention.

The seal making device provided with the electrical system of FIG. 17 and the mechanismic optical system of FIG. 16 has an appearance similar to that of the first embodiment as illustrated in FIG. 3.

Next, an operation of this embodiment will be described hereinafter by referring to FIG. 19. When the validity of the main body 40 of the seal loaded into the unit in step 200 similarly as in the cases of the first and second embodiments, the ink ribbon 71 is moved to a position where the ink adhering area R1 overlaps the ultraviolet setting resin layer 42b. Thereafter, the print head 70 is driven and the ink 71b adheres to portions of the ultraviolet setting resin layer 42b, which correspond to a mirror image of a figure obtained as a result of performing a reversal between white portions and black portions of the imprint figure (steps 222 and 223). Subsequently, the ink ribbon 71 is moved to a position where the light transmitting area R2 thereof overlaps the ultraviolet setting resin layer 42b. Then, the ultraviolet irradiating light source 76 is put on for a predetermined period of time (steps 224 and 225).

Finally, the CPU 21 instructs the display unit 34 to display messages indicating that the transferring processing is completed and that the ultraviolet setting resin layer 42b of the main body 40 of the seal should be washed by a predetermined liquid (water). Thereafter, the CPU 21 finishes the sequence of steps for transferring the imprint figure (step 226).

After such a transfer processing, the maker of the seal washes the ultraviolet setting resin layer 42b of the main body 40 of the seal by using the predetermined liquid. Thereby, portions of the layer 42b other than those corresponding to the imprint figure are removed to form convex and concave portions composing the relief or intaglio imprint figure. Further, when washing this layer, the adhering ink 71b is also removed. As the result, the seal is completed.

Incidentally, it is preferable that after that, the main body 40 of the seal is once again loaded into the seal making unit and further ultraviolet light is irradiated again onto the main body 40 thereof to ensure the hardening of the setting resin layer.

In the case of the third embodiment of the present invention, similarly as in the cases of the first and second embodiments, a person other than a specialist in making a seal can make a desired seal (or relief or intaglio figure plates such as a door plate, a badge indicating a company and a name plate) easily and quickly, as compared with a case of using the conventional device.

Further, FIG. 19 illustrates merely the fundamental process and the third embodiment is provided with an information processing system. Therefore, the size of the main body of the seal (thus, the size of the imprint figure), as well as the attributes of the imprint figure, can be changed easily on the middle of producing the seal. For similar reasons, if the imprint figure information is once input, the third embodiment can obtain various seals which are different in size from one another but have similar imprints.

Furthermore, in the case of the third embodiment, the ink 71b adheres directly to the ultraviolet setting resin layer 42b and thereafter ultraviolet light is irradiated thereon (thus the shape of inked portion corresponds to an image of the imprint figure represented in a negative film). Consequently, in the case of the third embodiment, the imprint figure can be transferred more precisely, in comparison with the conventional case of irradiating ultraviolet onto the setting resin layer through an intermediate product such as a negative film.

Incidentally, the present invention is not limited to this embodiment and the previously described embodiments. Further, examples of modifications of the third embodiment of the present inventions are as follows.

(13) The print processing may be performed on the ultraviolet setting resin layer 42b of the seal face member 42 by using a fixed print head and moving the seal face member 42 instead of moving the print head 70.

(14) Ink ribbons which are cut like sheets in accordance with the size of the face of the seal may be employed instead of the roll-type ink ribbon. In such a case, the light transmitting area R2 provided on the ink ribbon becomes unnecessary by ejecting such an ink sheet after the transfer of the imprint figure.

(15) The printing method is not limited to the thermal transfer method. Ink jet printing method or wire dot printing method may be applied to the device. In the case of applying the ink jet printing method to the device, it is not necessary to supply and take up an ink ribbon. Thus, the size of the device is expected to be small.

Figure 21:
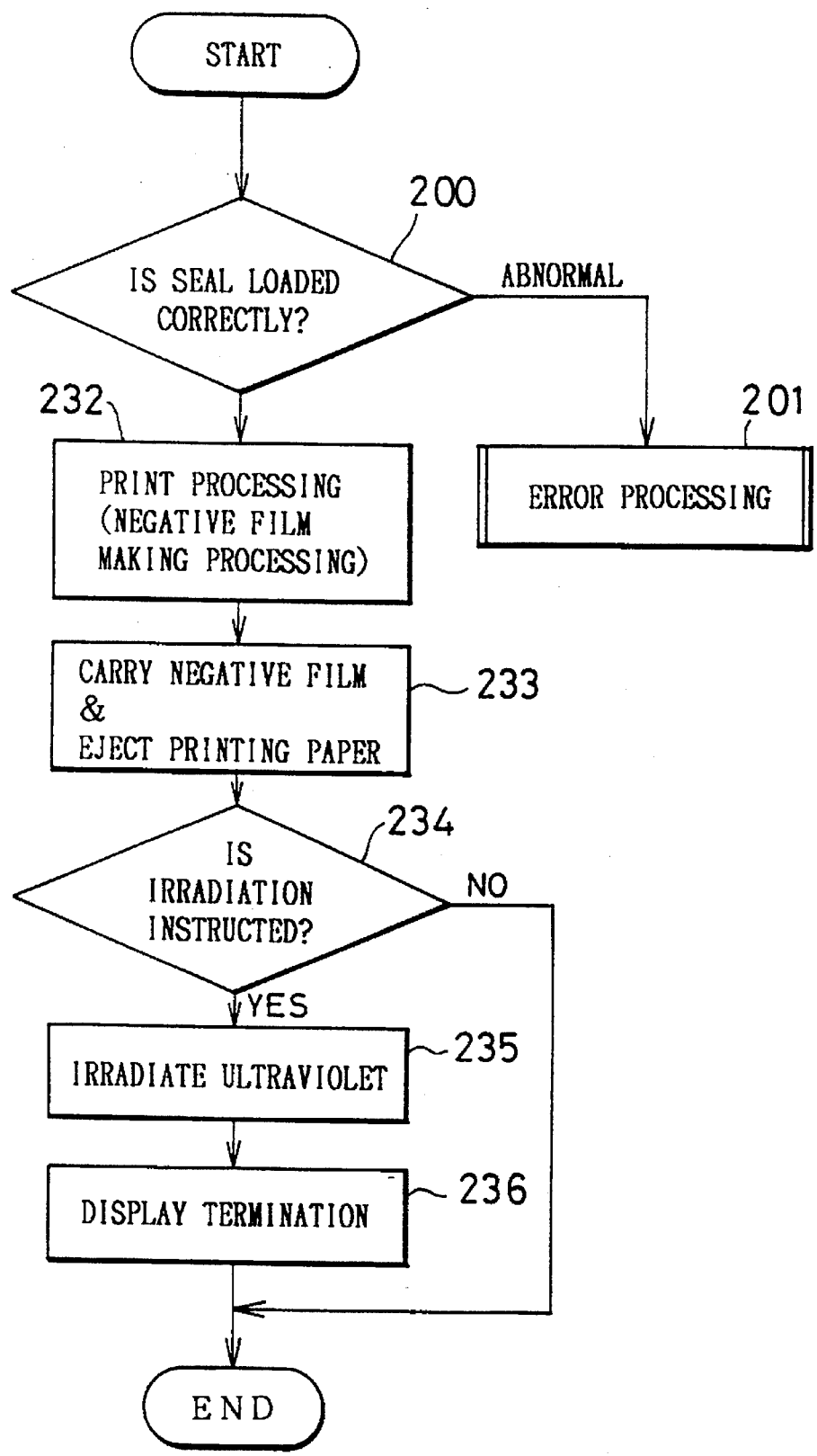
FIG. 21 is a flowchart for illustrating a fundamental process to be performed by a control portion of the fourth embodiment of the present invention.

Next, still another seal making device embodying the present invention, namely, a fourth embodiment of the present invention will be described in detail hereunder by referring to FIGS. 20 to 22.

In the case of this embodiment, ultraviolet light is irradiated on a seal face member 42 through a film which transmits the ultraviolet light partly according to an imprint figure unlike the third embodiment in which the imprint figure is directly printed on the seal face member 42.

In the case of this embodiment, the seal making device is comprised of the main body of the seal and the seal making unit. Further, the seal making unit is primarily composed of an electrical system which is fundamentally similar to that of FIG. 17 and a mechanismic optical system of FIG. 20 (namely, a printing portion and a light ray irradiating portion or the like). Incidentally, FIG. 20 further illustrates the configuration of the main body of the seal. Moreover, FIG. 21 is a flowchart for illustrating a fundamental processing to be performed by a control portion 20 of this embodiment.

The electrical system of the fourth embodiment has basically the same configuration as the electrical system of the third embodiment of FIG. 17. Therefore, the description of the configuration of the electrical system of the fourth embodiment is omitted here. Thus, the configuration of the mechanismic optical system of this embodiment will be described hereinafter by referring to FIG. 20. The mechanismic optical system of FIG. 20 primarily comprises a print unit and an ultraviolet light irradiating unit.

The print unit is of the thermal transfer type and employs a fixed type print head 80, a platen roller 81, an ink ribbon 82, a printing paper ribbon 83, a supply reel 84, a take-up reel 85 and rollers 86 and 87 for changing the direction in which the ink ribbon 82 moves forward.

The printing paper ribbon 83 is put upon the ink ribbon 82 and these ribbons are wound around the supply reel 84 of the fourth embodiment. Further, these ribbons are pulled out of the supply reel 84 in a state where they are overlapped to each other and advance to a printing position between the print head 80 and the platen roller 81.

The print head 80 generates heat and transfers ink of the ink ribbon 82 onto the printing paper ribbon 83 under the control of the control portion 20 when a heat-generation driving circuit (not shown) performs a drive operation.

Here, note that in the ink ribbon of the thermal transfer type, portions of the ink ribbon having transferred by heat lose ink and become transparent. Namely, after the transfer processing is performed, the ink ribbon 82 is composed of a part being capable of transmitting ultraviolet light (that is, a part from which ink is removed) and another part preventing the transmission of ultraviolet light (that is, a part on which ink remains). Thus, in the case of the fourth embodiment, after the printing of the imprint figure is effected and the portions of the ink ribbon corresponding to the imprint figure become transparent, such an ink ribbon 82 is utilized as a negative film.

The printing paper ribbon 83 and the ink ribbon 82, which remain overlapped, pass through a printing portion comprising the print head 80 and the platen roller 81 and thereafter reach the roller 86. Then, the printing paper ribbon 83 is separated from the ink ribbon 82 by the roller 86 (and a ribbon separation mechanism associated with the roller 86).

The separated ink ribbon 82 then proceeds directly under the ultraviolet setting resin layer 42b of the main body 40 of the seal. Thereafter, the direction, in which the ink ribbon 82 advances, is changed by the roller 87. Subsequently, the ribbon is taken up by the take-up reel 85. Incidentally, when performing an optical transfer processing (to be described later) of the imprint figure for hardening portions of the ultraviolet setting resin layer 42b corresponding to the imprint figure, the ink ribbon 82 stops in a position where the transparent part (namely, the negative film) of the ink ribbon 82 corresponding to the imprint figure is placed just under the ultraviolet setting resin layer 42b.

On the other hand, the separated printing paper ribbon 83, on which the imprint figure is printed, is pulled out of the seal making unit through an ejection opening portion 88. Then, the ribbon 83 is cut by a manual or automatic cutter (not shown). A portion of the ink ribbon 83 cut in this manner is utilized for checking the imprint figure. Further, the cut portion of the ink ribbon 83 in attached to the top portion of the main body 40 of the seal, which enables to visually check what imprint figure the main body 40 of the seal has.

For instance, an ultraviolet irradiating light source 90 constituted by a fluorescent lamp is provided in the mechanismic optical system in, for instance, a fixed manner, as the ultraviolet irradiating unit. Further, the turning-on and turning-off thereof is controlled by the control portion 20. Moreover, a transparent plate 91, which is translationally moved by an advancement/retreat mechanism, is provided facing a surface of the ink ribbon 82, the other surface of which is opposite to the ultraviolet setting resin layer 42b of the seal face member 42. Namely, ultraviolet light emitted from the ultraviolet irradiating light source 90 reaches the ultraviolet setting resin layer 42b by way of the transparent plate 91 and the ink ribbon 82. Further, the transparent plate 91 is so adapted to enhance the close contact of the ink ribbon 82 serving as the negative film with the ultraviolet setting resin layer 42b in an advancement position thereof. In contrast, the transparent plate 91 is placed in a retreat position thereof in such a manner not to obstruct the ink ribbon 82.

Both of end portions of the transparent plate 91 in the direction, in which the ink ribbon 82 runs, are rounded off in such a fashion not to damage the ink ribbon 82 when coming in contact therewith. Further, the rounded end portions of the transparent plate 91 protrude slightly from the top surface thereof in such a manner to serve to increase the tension of the ink ribbon and contact more closely to the layer 42b when the transparent plate 91 advances to the ink ribbon 82 and makes this ribbon come in contact with the seal face member 42 of the seal.

Incidentally, a lens system and a mirror system for converging irradiated light to the ultraviolet setting resin layer 42b may be provided between the ultraviolet irradiating light source 90 and the transparent plate 91.

Further, large pressure is applied onto the ink ribbon 82, though the magnitude thereof may depend on the structure of the fixture for fixing the main body 40 of the seal. Therefore, it is preferable to form the ink ribbon 82 made of a sheet member resistant to the pressure applied perpendicularly thereto, which is higher than that of an ordinary material of the sheet member of the ink ribbon.

Next, an operation of this embodiment will be described hereunder by referring to FIG. 21. When the validity of the main body 40 of the seal loaded into the unit in step 200 similarly as in the cases of the previously described embodiments, the print processing of the imprint figure is performed by driving the running mechanism of the print head 80 and the ribbons. Thus, a part serving as the negative film is formed in the ink ribbon 82 (step 232).

Thereafter, the printing paper ribbon 83, on which the imprint figure is printed, is ejected and cut. Moreover, the part serving as the negative film contact closely to the ultraviolet setting resin layer 42b to thereby complete preparations for an optical transfer. Further, a message requesting a final checking of the imprint figure is displayed in the display unit 33 to thereby prompt the maker of the seal to instruct the device about whether or not an optical transfer should be effected. Thereafter, the device judges what instruction is input from the keying input portion 11 according to the maker's response to the message (steps 233 and 234). The maker makes a final check, based on the ejected and cut printing paper ribbon 83, as to whether or not the imprint figure has desired size and shape. If having proper size and shape, the maker instructs the device to perform an optical transfer. In contrast, if not, the maker instructs a forced termination of the transfer processing.

Incidentally, it is usual that the imprint figure displayed by the display unit 34 at the time of inputting thereof is somewhat different in size and character spacing pitch from the imprint figure which is subjected to the print processing so as to be formed on the seal face member 42.

When instructing the forced termination, the CPU 21 immediately stops performing the sequence of steps for transferring the imprint figure. In contrast with this, when instructing the device to perform the optical transfer, the CPU 21 puts on the ultraviolet irradiating light source 90 for a predetermined period of time (step 235).

Further, finally, the CPU 21 instructs the display unit 34 to display messages indicating that the transferring processing is completed and that the ultraviolet setting resin layer 42b of the main body 40 of the seal should be washed by a predetermined liquid (for instance, water). Thereafter, the CPU 21 finishes the sequence of steps for transferring the imprint figure (step 236).

After such a transfer processing, the maker of the seal washes the ultraviolet setting resin layer 42b of the main body 40 of the seal by using the predetermined liquid. Thereby, portions of the layer 42b other than those corresponding to the imprint figure are removed to form convex and concave portions composing the relief or intaglio imprint figure. As the result, the seal is completed.

Incidentally, it is preferable that after that, the main body 40 of the seal is once again loaded into the seal making unit and further ultraviolet light is irradiated again onto the main body 40 thereof to ensure the hardening of the setting resin layer.

In the case of the fourth embodiment of the present invention, similarly as in the cases of the first and second embodiments, a person other than a specialist in making a seal can make a desired seal (or relief or intaglio figure plates such as a door plate, a badge indicating a company and a name plate) easily and quickly, in comparison with a of using the conventional device.

Next, a fifth embodiment of the present invention, which is a modification of the fourth embodiment of the present invention, will be described in detail by referring to FIG. 22. Here, note that FIG. 22 illustrates a mechanismic optical system (namely, a printing portion and a light ray irradiating portion or the like) and same reference numerals indicate same or corresponding parts of FIG. 22.

The fifth embodiment is characterized in that a negative film is automatically made by utilizing the print processing, similarly as in the case of the fourth embodiment. Most salient difference between the fifth and fourth embodiments of the present invention resides in that these embodiments use different ribbons each serving as the negative film, respectively. Incidentally, the electrical system of the fifth embodiment is substantially the same as that of the fourth embodiment. Therefore, the mechanismic optical system of the fifth embodiment will be mainly described hereinbelow.

Figure 22:
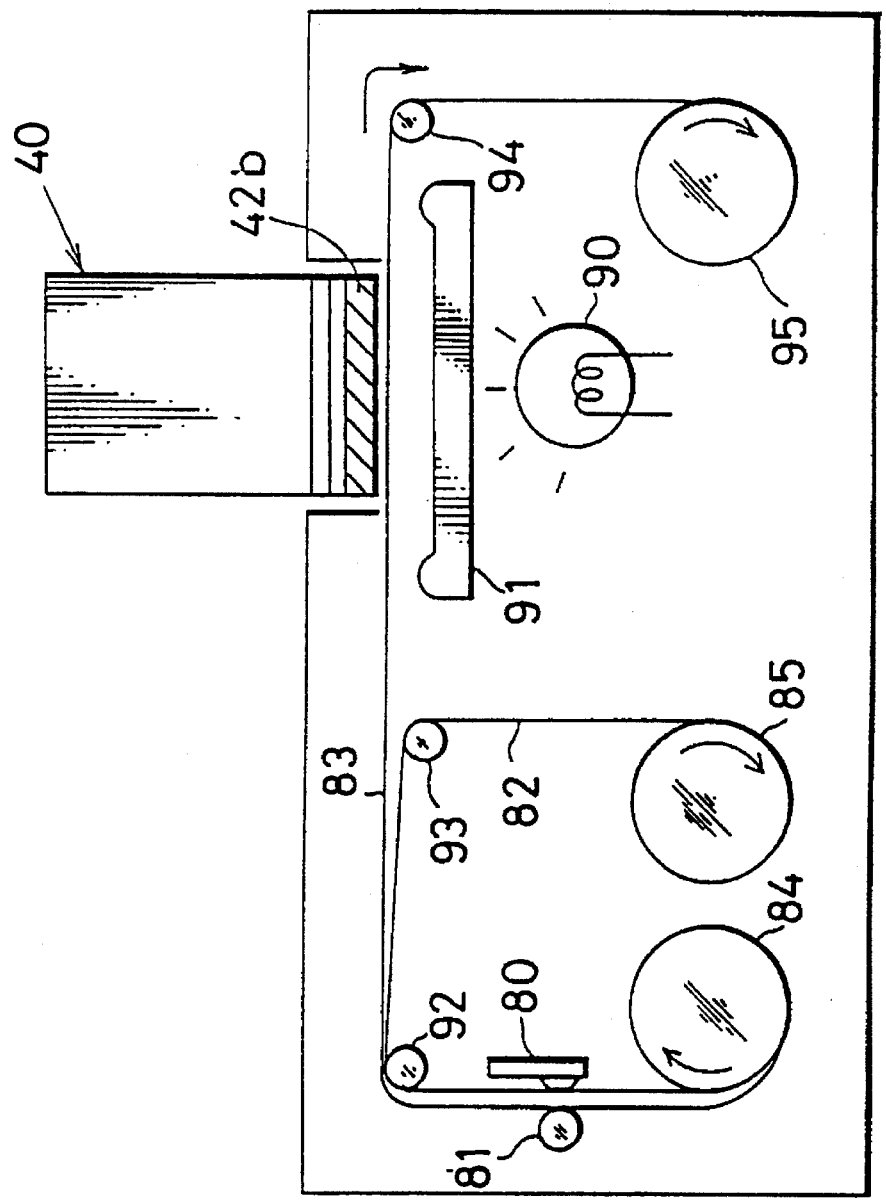
FIG. 22 is a block diagram for illustrating the configuration of an optical system for transferring an imprint of a fifth embodiment of the present invention.

In the device of FIG. 22, a printing paper ribbon 83 of the fifth embodiment is constituted by a transparent sheet (incidentally, the expression "paper" may be unsuitable from this viewpoint). The ribbon 83 is not ejected during the print processing and even after the imprint figure is transferred, and runs together with the ink ribbon 82 and reaches the roller 93 through the roller 92. The roller 93 has a ribbon separation mechanism associated therewith (not shown) and separates the ink ribbon 82 from the printing paper ribbon 83. After is separated from the ribbon 83 and changes the course, the ink ribbon 82 is taken up by the take-up reel 85.

In contrast, the separated printing paper ribbon 83 goes straight on. Then, the ribbon 83 passes directly below the ultraviolet setting resin layer 42b of the main body 40 of the seal. Thereafter, the direction, in which the ribbon 83 runs, is changed by the roller 94. Subsequently, the ribbon 83 is taken up by the take-up reel 95. Incidentally, when an optical transfer processing of the imprint figure (to be described later) is performed for hardening portions of the ultraviolet setting resin layer 42b corresponding to the imprint figure, the printing paper ribbon 83 is stopped in such a manner that an area of the printing paper ribbon 83, on which the imprint figure is printed by performing a reversal between black and white portions, is placed just under the ultraviolet setting resin layer 42b.

The ultraviolet light irradiating unit of the fifth embodiment is similar to that of the fourth embodiment, except that unlike the fourth embodiment, the ultraviolet light irradiating unit of the fifth embodiment faces the ultraviolet setting resin layer 42b thereof, and the printing paper ribbon intervenes therebetween.

The processings to be performed by the CPU 21 are similar to those in the case of the fourth embodiment. Thus, the description thereof is omitted. Incidentally, the imprint figure to be printed in the fifth embodiment is an image obtained by performing a reversal between white and black portions of the imprint figure image to be printed in the fourth embodiment.

Therefore, in the case of the fifth embodiment, a negative film (namely, a part of the printing paper ribbon 83) is automatically made by performing the print processing and then the transfer of the imprint figure onto the ultraviolet setting resin layer 42b is performed. Consequently, similarly as in the case of the fourth embodiment, a person other than a specialist in making a seal can make a desired seal (or relief or intaglio figure plates such as a door plate, a badge indicating a company and a name plate) easily and quickly.

Incidentally, the present invention is not limited to the fourth and fifth embodiments and the previously described embodiments. Further, examples of modifications of the fourth and fifth embodiments of the present inventions are as follows.

(16) The print processing is performed by a movable head instead of the fixed head 80.

(17) The printing method is not limited to the thermal transfer method. Ink jet printing method or wire dot printing method may be applied to the device. Incidentally, the ink jet printing method can not be applied to the fourth embodiment.

(18) In the case of the fifth embodiment, the printing paper ribbon 83 may be ejected and cut after the print processing, so that such a printing paper ribbon 83 can be preserved and the preserved printing paper ribbon can be loaded into the ultraviolet light irradiating unit and can be utilized later again.

(19) In the cases of the fourth and fifth embodiments, the negative film contacts closely to the ultraviolet setting resin layer 42b and then the imprint figure is transferred thereto. However, the imprint figure may be transferred by separating the negative film from the ultraviolet setting resin layer and further providing an optical system such as an objective lens therebetween.

(20) In the case of the fourth and fifth embodiments, the ink ribbon or the printing paper ribbon, which corresponds to the negative film, is carried to an irradiation position without changing the continuous ribbon-like shape thereof. The ink ribbon or the printing paper ribbon may be cut into a piece having a predetermined length before carried to the irradiation position.

(21) In the cases of the fourth and fifth embodiments, the printing position (namely, the position where negative film is made) is apart from a position of the negative film, at which ultraviolet light is irradiated on the negative film (namely, an ultraviolet light irradiating position). However, the imprint figure may be printed at the ultraviolet light irradiating position by using a movable print head and a platen roller.

(22) The negative film may be made to contact closely to the seal face member 42 by fixing the transparent plate 91 and making the main body 40 of the seal advance or retreat.

Figure 24:
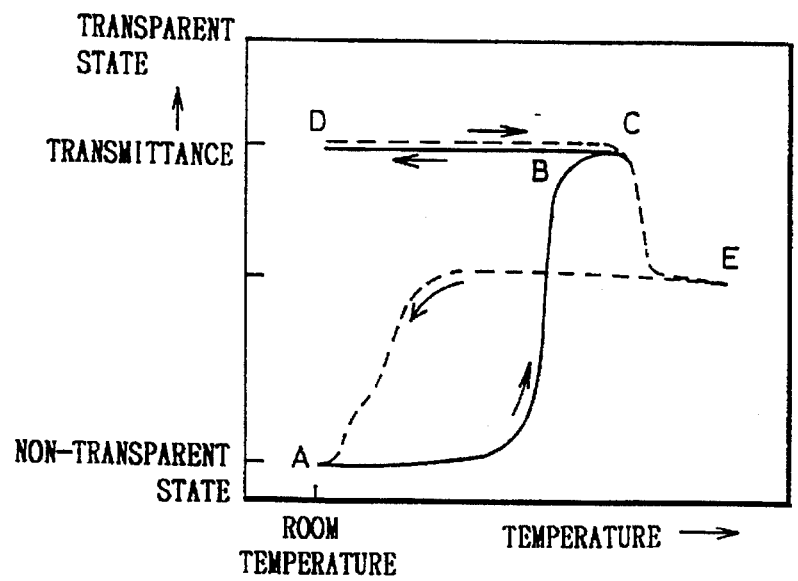
FIG. 24 is a characteristic curve diagram for illustrating a temperature-transmittance characteristic of a heat reversible transmittance changing film.
Figure 25:
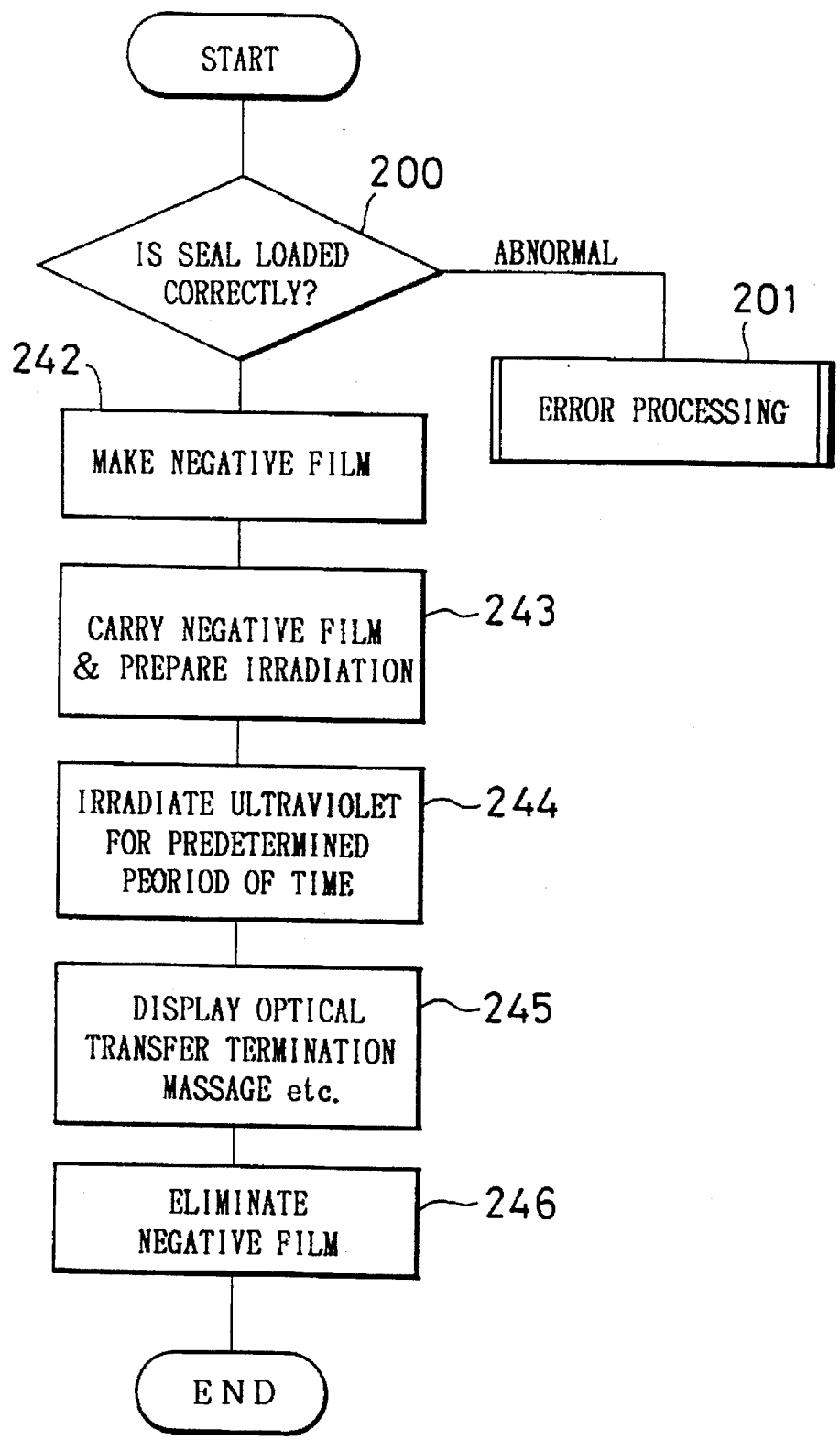
FIG. 25 is a flowchart for illustrating a fundamental process to be performed by a control portion of the sixth embodiment of the present invention.

Next, yet another seal making device embodying the present invention, namely, a sixth embodiment of the present invention will be described in detail by referring to FIGS. 23 to 25.

In the case of this embodiment, a heat reversible transmittance changing film is employed instead of the film of the fourth and fifth embodiments, which partially transmits ultraviolet correspondingly to the imprint figure, and ultraviolet light is irradiated on an ultraviolet setting resin layer through the heat reversible transmittance changing film.

The seal making device of this embodiment is composed of the main body of the seal and the seal making unit. Further, the seal making unit is primarily comprised of an electrical system, which has a configuration similar to the configuration of the electrical system of the third embodiment as illustrated in FIG. 17, and a mechanismic optical system of FIG. 23 (namely, a printing portion and a light ray irradiating portion or the like). Incidentally, FIG. 23 further shows the configuration of the main body of the seal. Further, FIG. 24 is a characteristic curve diagram for showing an example of temperature-transmittance-characteristics of the heat reversible transmittance changing film. Moreover, FIG. 25 is a flowchart for illustrating a fundamental processing to be performed by a control portion of this embodiment. The electrical system of this embodiment has basically the same configuration as the electrical system of the third embodiment of FIG. 17. Therefore, the description of the configuration of the electrical system of the sixth embodiment is omitted here.

Figure 23:
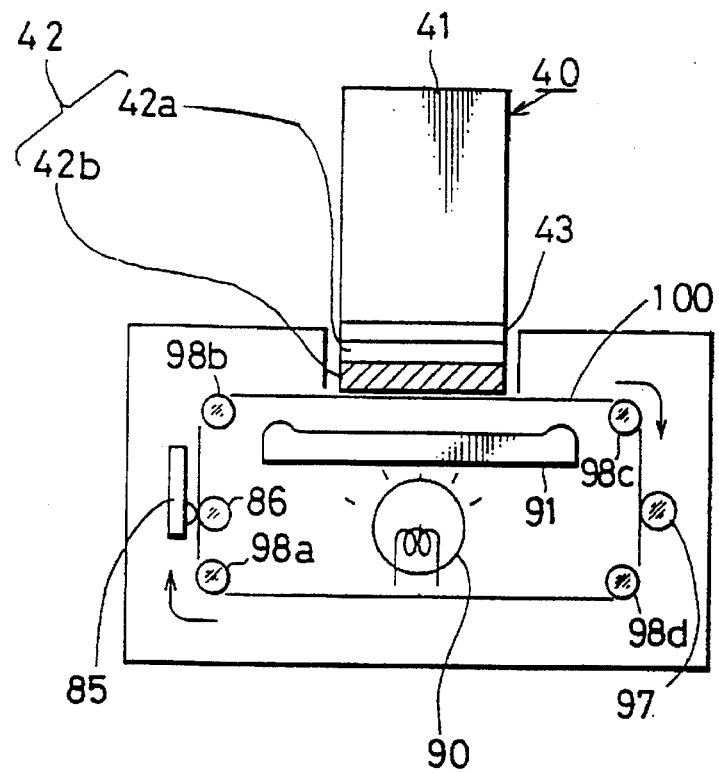
FIG. 23 is a block diagram for illustrating the configuration of an optical system for transferring an imprint of a sixth embodiment of the present invention.

The mechanismic optical configuration of FIG. 23 is primarily composed of a negative film making unit and an ultraviolet irradiation/elimination unit.

The ultraviolet irradiation/elimination unit comprises a heat reversible transmittance changing film 100, four rollers 98a to 98d, a thermal head 85 for making a negative film, a platen roller 86 and a heating roller 97 for eliminating the negative film.

The heat reversible transmittance changing film 100 of this embodiment is an endless film which is extended and put around the four rollers 98a to 98d and is circularable therearound in the predetermined direction (for instance, clockwise). The heat reversible transmittance changing film 100 can assume a transparent state and non-transparent state (to ultraviolet) at, for example, a room temperature. Further, as illustrated in FIG. 24, the transition from the transparent state to the non-transparent state D-E-A, as well as the transition from the non-transparent to the transparent state A-B-C-D, can be realized by performing heating and natural cooling.

Recently, there has been proposed a heat reversible information representing film on which a character to be displayed is black. Such a heat reversible information representing film is employed as the heat reversible transmittance changing film 100.

Further, the heat reversible transmittance changing film 100 put in, for example, the transparent state is fed to a position between the thermal head 85 for making a negative film and the platen roller 86. The thermal head 85 is similar to, for instance, a thermal head of the thermal transfer printing type. Dot elements of the thermal head 85 driven by a heat generation driving circuit (not shown) generate heat under the control of the control portion 20. As the result, the state of a portion of the heat reversible transmittance changing film 100, which portion corresponds to the background of the imprint figure, is selectively changed into a non-transparent state. Incidentally, an area of the heat reversible transmittance changing film 100 being in a transparent state is a portion serving as a negative film.

On the other hand, the heat reversible transmittance changing film 100, in which transparent and non-transparent portions coexist, is fed to the heating roller for eliminating the negative film. The heating roller 97 puts all of portions of the heat reversible transmittance changing film 100, which portions have passed through this roller, into the transparent state. Namely, the heating roller 97 eliminates the portions serving as the negative film from such a heat reversible transmittance changing film 100.

For example, an ultraviolet irradiating light source 90 constituted by a fluorescent lamp is provided in the mechanismic optical system in, for instance, a fixed manner, as the ultraviolet light irradiating unit. Further, the turning-on and turning-off thereof is controlled by the control portion 20. Moreover, a transparent plate 91, which is translationally moved by an advancement/retreat mechanism, is provided facing a surface of the heat reversible transmittance changing film 100, the other surface of which is opposite to the ultraviolet setting resin layer 42b of the seal face member 42. Namely, ultraviolet emitted from the ultraviolet irradiating light source 90 reaches the ultraviolet setting resin layer 42b by way of the transparent plate 91 and the heat reversible transmittance changing film 100. Further, the transparent plate 91 is so constructed to enhance close contact of the heat reversible transmittance changing film 100 serving as the negative film with the ultraviolet setting resin layer 42b at an advancement position thereof. The transparent plate 91 is placed at a retreat position thereof in such a manner not to obstruct the running of the heat reversible transmittance changing film 100. Both of end portions of the transparent plate 91 in the direction, in which the heat reversible transmittance changing film 100 runs, are rounded off in such a fashion not to damage the heat reversible transmittance changing film 100 when coming in contact therewith. Further, the rounded end portions of the transparent plate 91 protrude slightly from the top surface thereof in such a manner to serve to increase the tension of the heat reversible transmittance changing film 100 and contact more closely to the layer 42b when the transparent plate 91 advances to the heat reversible transmittance changing film 100 and makes this film come in contact with the seal face member 42 of the seal.

Incidentally, a lens system and a mirror system for converging irradiated light to the ultraviolet setting resin layer 42b may be provided between the ultraviolet irradiating light source 90 and the transparent plate 91.

Next, an operation of this embodiment will be described hereinbelow by referring to FIG. 25. When the validity of the main body 40 of the seal loaded into the unit in step 200 similarly as in the cases of the previously described embodiments, the print processing of the imprint figure is performed by driving the running mechanism of the print head 80 and the heat reversible transmittance changing film 100. Thus, a part serving as the negative film is formed in the heat reversible transmittance changing film 100 by putting a part thereof corresponding to the imprint figure into the transparent state (step 242).

Thereafter, the part of the heat reversible transmittance changing film 100, which part serves as the negative film, is fed to a position just under the seal face member 42. Subsequently, the part of the heat reversible transmittance changing film 100, which part serves as the negative film, contacts closely to the ultraviolet setting resin layer 42b to thereby complete preparations for an optical transfer (step 243). Then, the CPU 21 puts on the ultraviolet irradiating light source 90 for a predetermined period of time. When the predetermined period of time for putting on the light expires, the CPU 21 instructs the display unit 33 to display messages indicating that the transferring processing is completed and that the ultraviolet setting resin layer 42b of the main body 40 of the seal should be washed by a predetermined liquid (water) and so on (steps 244 and 245). Further, finally, the part of the heat reversible transmittance changing film 100, which part serves as the negative film, is made to pass the position of the heating roller. Thus, the entire part of the heat reversible transmittance changing film 100, which part serves as the negative film, is put back into the transparent state. Then, the CPU 21 finishes the sequence of steps for transferring the imprint figure (step 246).

After such a transfer processing, the maker of the seal washes the ultraviolet setting resin layer 42b of the main body 40 of the seal by using the predetermined liquid. Thereby, portions of the layer 42b other than those corresponding to the imprint figure are removed to form convex and concave portions composing the relief or intaglio imprint figure. As the result, the seal is completed.

Thus, in the case of the sixth embodiment, the part serving as a negative film (like the part of the printing paper ribbon 83) is automatically made by performing the print processing and then the transfer of the imprint figure onto the ultraviolet setting resin layer 42b is performed. Consequently, similarly as in the case of the fourth embodiment, a person other than a specialist in making a seal can make a desired seal (or relief or intaglio figure plates such as a door plate, a badge indicating a company and a name plate) easily and quickly.

Figure 29:
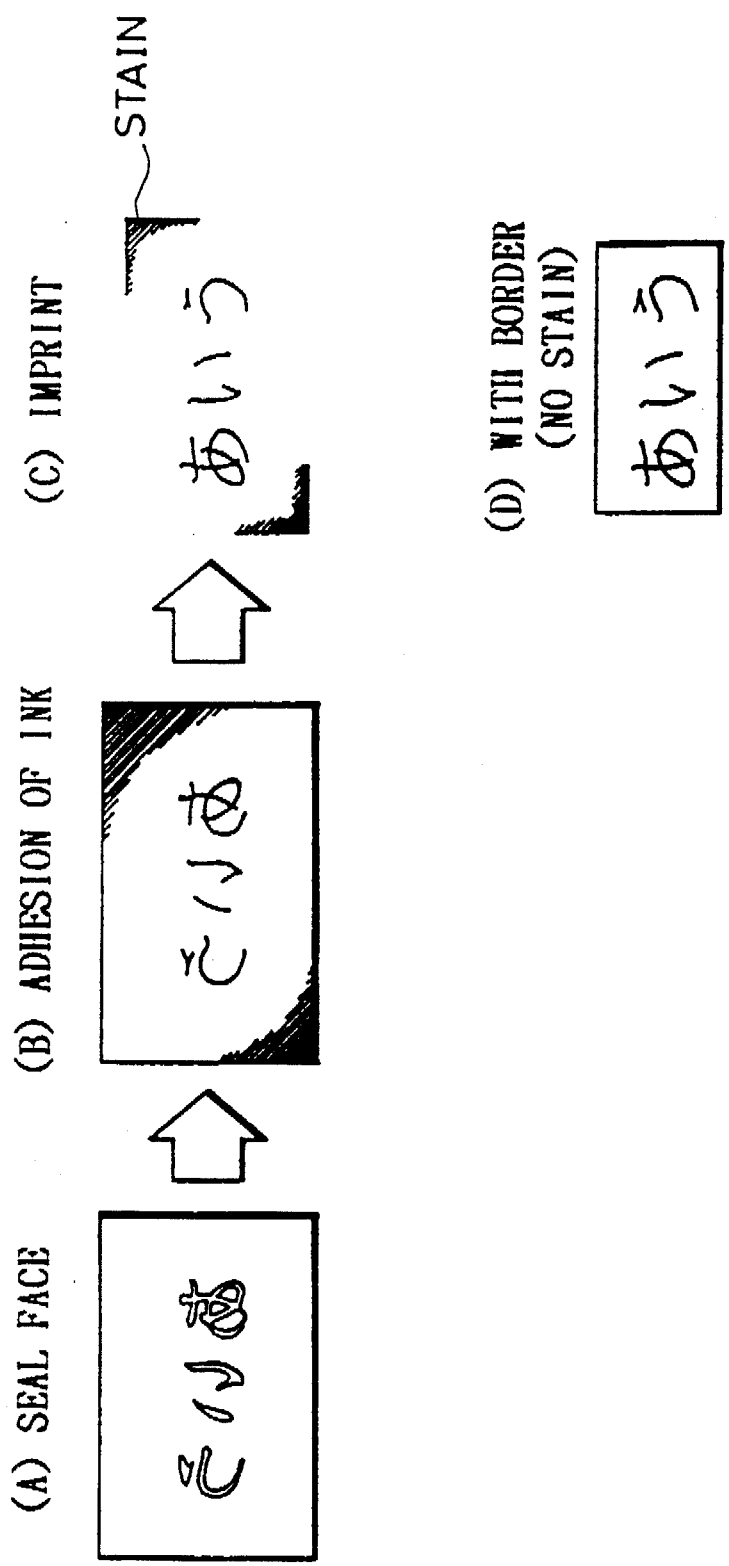
FIG. 29 is a diagram for illustrating problems to be solved by the seventh embodiment of the present invention.

Meanwhile, in the case where, as illustrated in FIG. 29(A), convex portions corresponding to the imprint figure formed on the face of the seal huddle up in the central area of the face of the seal and thus there are large empty areas in the peripheral portions of the face thereof, seal ink adheres not only to the convex portions of the face of the seal but also the peripheral empty areas thereof as illustrated in FIG. 29(B) when making the seal ink adhere to the face of the seal. Therefore, when putting the seal to an object such as paper, the seal ink adhering to the peripheral empty area of the face of the seal may be transferred to the object as a stain.

To prevent such a stain from being transferred thereto, it has been devised that the convex portions corresponding to the imprint figure are made to be sufficiently large to the extent that a part of the convex portions are placed in the peripheral areas of the face of the seal. However, when the imprint figure information is input by performing a character input method by use of the keying input portion in the seal making device in which the part serving as a negative film is automatically made by inputting the imprint figure information by use of an information processing means, parameters such as a character spacing pitch, a line spacing pitch and the size of each character are specified. Practically, choices for each parameter are graded severally. Consequently, even a part of the convex portions can not be always placed in the peripheral areas of the face of the seal.

Further, it has been also devised that an object to be imprinted with a seal can be prevented from being stained by putting a border around the imprint figure as illustrated in FIG. 29(D). In the case of the seal making device which makes a part serving as a negative film by taking in imprint figure information by use of information processing means, information representing a border can be included in the imprint figure information. In the case where the information processing means of the seal making device is similar to an ordinary information processing unit of a word processor, an input mode is changed into a border input mode upon completion of inputting characters composing an imprint figure when taking in (or making) the imprint figure. Then, the border is gradually formed by designating a starting point, an end point or the like one after another.

Thus, for the maker of the seal, the inputting of information representing an imprint figure with a border is work that takes plenty of time and labor.

Incidentally, not only in the case of preventing an object from being stained with seal ink but in the case of making some kind of a seal, it is natural that a border is included in an imprint figure. For instance, in the case of making a seal for imprinting a name, which seal has a circular or ellipsoid face, it is natural that an imprint figure formed on the face of the seal contains a border. Even in such a case, the maker of the seal should input information on the border. This takes time and labor.

Thus, another seal making device, namely, a seventh embodiment of the present invention, by which the maker of a seal can input information representing an imprint figure quickly and easily, will be described hereunder.

The seventh embodiment of the present invention can be realized by slightly modifying each of the first to sixth embodiments.

Namely, the above described problem can be solved by selecting one of the following four modes of the seventh embodiment and applying the selected mode to each of the first to sixth embodiments. In the case of a mode (A) of the seventh embodiment, a border inhibiting instruction means for instructing the inhibition of adding of a border to an imprint figure is provided in the device. Thereby, the information processing means automatically adds the border to the input imprint figure to make a final imprint figure except a case where the border inhibiting instruction means instructs that a border should not be added to an imprint figure. In the case of another mode (B) thereof, a border inhibiting instruction means for instructing the inhibition of adding of a border to an imprint figure is similarly provided in the device. Further, an applying means having predetermined physical characteristics performs an application operation on a resin seal face member by adding a border to an imprint figure, except a case where the border inhibiting instruction means instructs that the border should not be added to the imprint figure. Moreover, in the case of a further mode (C) thereof, a border instruction means for instructing whether or not a border should be added to an imprint figure is provided in the device. Thereby, in a case where the border inhibiting instruction means instructs that a border should be added to an imprint figure, the information processing means automatically adds the border to the input imprint figure to make a final imprint figure. Furthermore, in the case of still another mode (D) thereof, a border instruction means for instructing whether or not a border should be added to an imprint figure is similarly provided in the device. Thereby, in a case where the border inhibiting instruction means instructs that a border should be added to an imprint figure, an applying means having predetermined physical characteristics performs an application operation on a resin seal face member by adding a border to an imprint figure.

Figure 27:
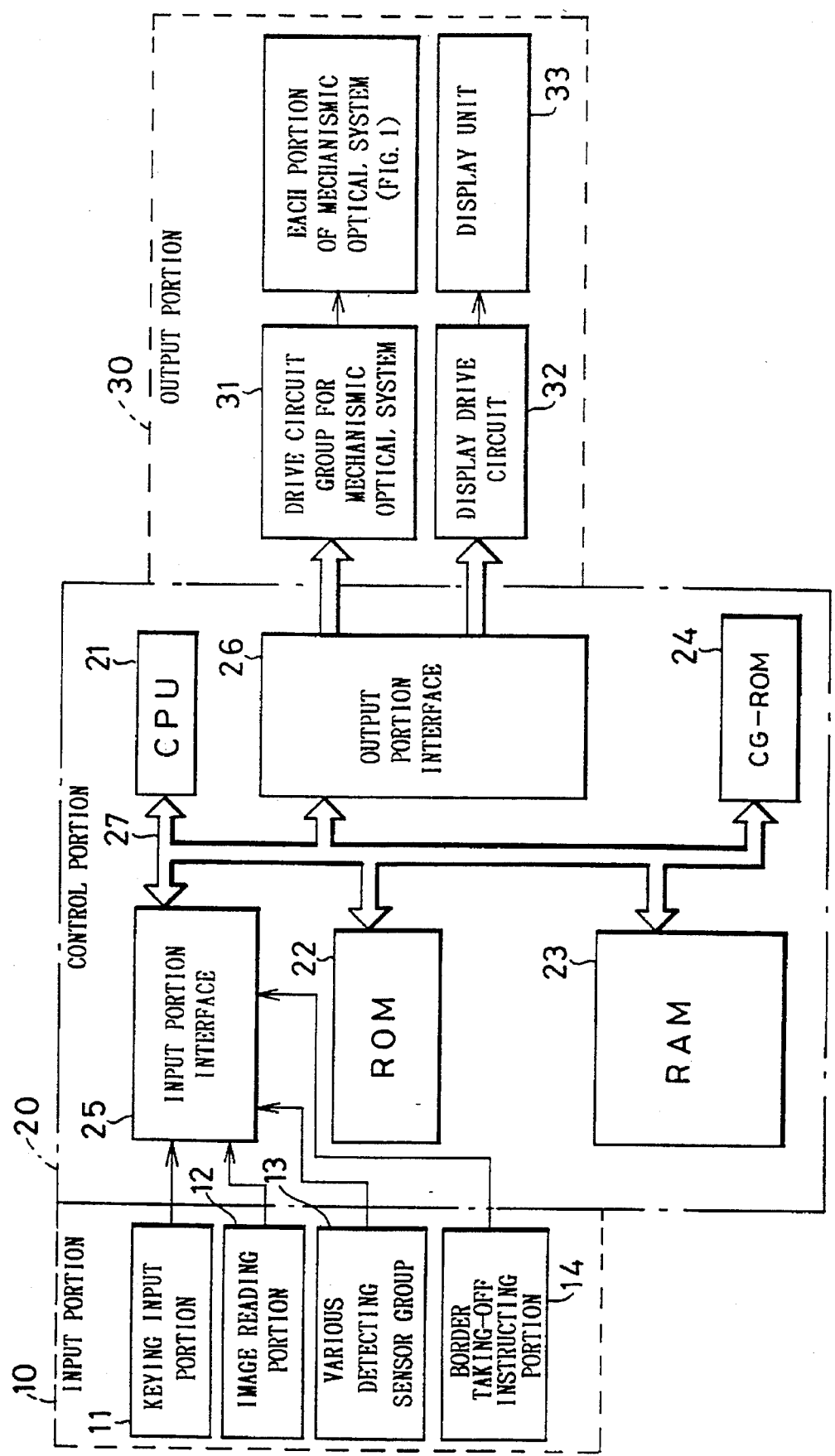
FIG. 27 is a block diagram for illustrating the configuration of an electrical system of the seventh embodiment of the present invention.
Figure 28:
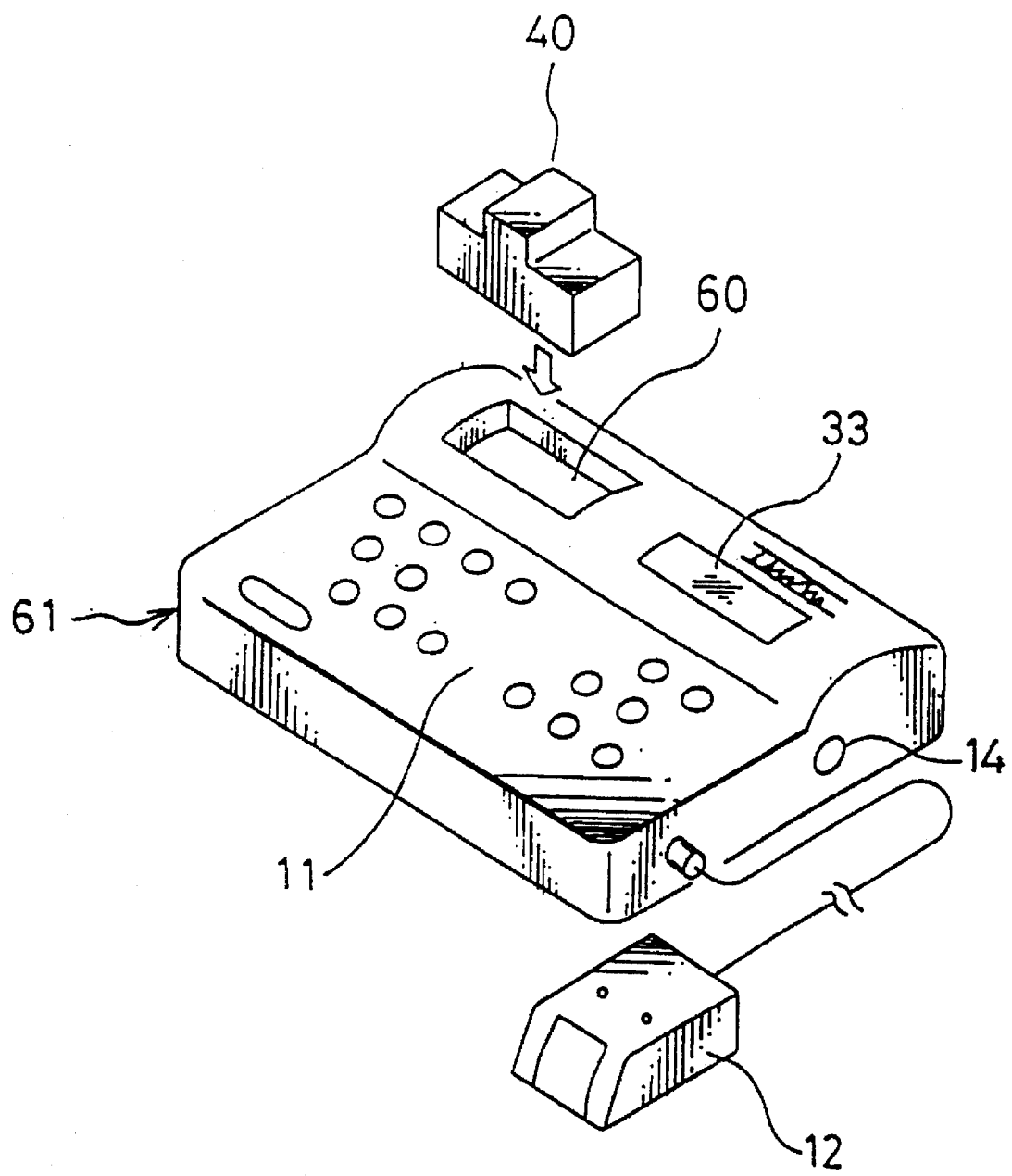
FIG. 28 is a perspective view of the appearance of a seal making device in the case of the seventh embodiment of the present invention.

Hereinafter, the seventh embodiment will be described in detail by referring to FIGS. 26 to 28. In the case of this embodiment, the seal making device comprises the main body of a seal and a seal making unit. Further, the seal making unit is primarily comprised of an electrical system of FIG. 27 (namely, an information processing portion and an imprint transfer controlling portion) and a mechanismic optical system as illustrated in the case of each of the first to sixth embodiments. In the seventh embodiment, a border forming means is added to optionally produce a border formed along the contour of the seal face.

First, the electrical system of this embodiment will be described by referring to FIG. 27.

This electrical system is basically similar to that illustrated in the case of each of the first to sixth embodiments except that a border taking-off instructing portion 14 is newly provided in the system.

The border taking-off instructing portion 14 of a keying input portion 11 is newly provided in the system of this embodiment. In the case of this embodiment, a border is automatically added to an imprint figure input by the maker of the seal, as will be described later. The border taking-off instructing portion 14 is operated when inhibiting an automatic addition of the border to the imprint figure. Such an instruction is effective if issued only for a single seal which will be made hereafter. Incidentally, the border taking-off instructing portion 14 may be implemented by, for example, an automatic reset push-button.

Next, an example of an imprint figure information taking-in operation to be performed mainly by the CPU 21 will be described by referring to FIG. 26.

Figure 26:
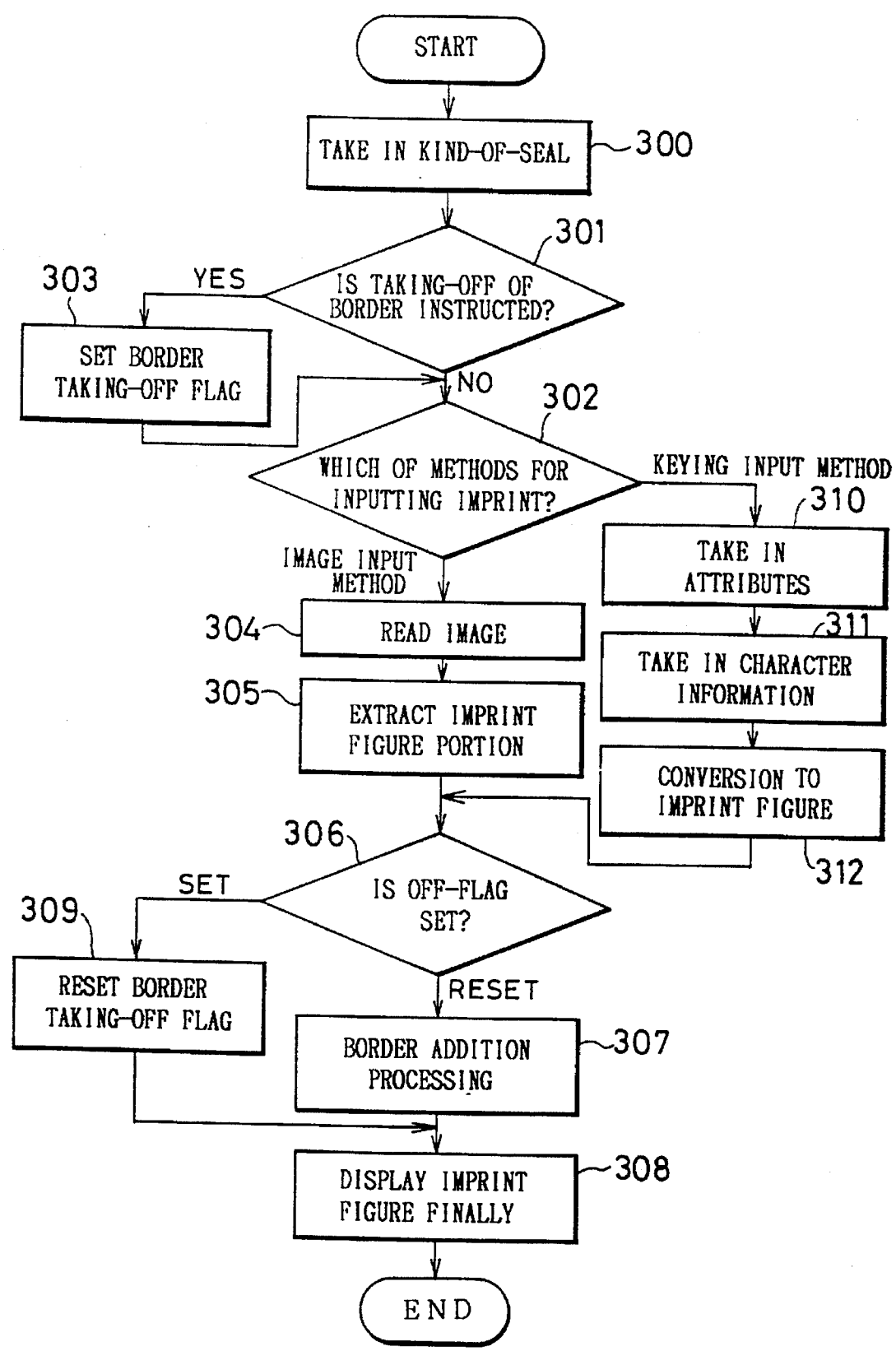
FIG. 26 is a flowchart for illustrating a fundamental process to be performed by a control portion of the seventh embodiment of the present invention.

For example, when it is ordered by the keying input portion 11 that an operation of reading the imprint figure information should be performed, the CPU 21 starts executing a program which is stored in the ROM 22 and is used for performing the operation of reading the imprint figure information as illustrated in FIG. 26. First, the CPU 21 causes the display unit 33 to display kind-of-seal information and reads the kind-of-seal information selected by the maker of a seal through the keying input portion 11 (step 300). Here, it is supposed that kinds of seals are defined on the basis of the shape of the face of the seal (for example, a rectangle, a circle and an ellipsoid) and the size of the face of the seal (for instance, a large size, a middle size and a small size) and that the kinds of seals to be handled by this seal making device are preliminarily determined.

Next, the CPU 21 causes the display unit 33 to display a message indicating that if a border is unnecessary, the maker should first operate the border taking-off instructing portion 14 and thereafter should indicate which of a keying input method and an image input method the maker chooses and that if a border is necessary, the maker should immediately indicate which of a keying input method and an image input method the maker chooses. Then, the CPU 21 reads information input by the maker and makes a judgment on the contents of the input information (steps 301 to 303). In the case where the border taking-off instructing portion 14 is operated, a border taking-off flag is set and the CPU makes a judgement on a method for inputting imprint figure information (step 303).

If the image input method is selected, the CPU 21 causes the display unit 33 to display a message requesting the maker to set a draft in the image reading portion 12 and subsequently activate the image reading portion 12. Thereafter, the CPU 21 takes in image data read by the image reading portion 12 (step 304). Subsequently, the CPU 21 instructs the display unit 33 to display the read image and the contour of the face of a seal of the indicated kind by superposing the read image on the contour of the face. Further, the CPU 21 requests the maker to specify a portion of the read image to be used as an imprint figure. Then, the CPU 21 takes in data representing the indicated part to be used as the imprint figure (step 305). For example, when the maker manipulates a cursor key, the image of the contour of the face corresponding to the indicated kind of a seal is move to the direction indicated by the cursor key. When manipulating a defined key, a part of the read image surrounded by the displayed contour of the face of the seal at that time is input as an indicated imprint figure.

Thereafter, the value of the border taking-off flag is verified (step 306). In the case where the maker does not deny a border to an imprint figure, a border determined according to the kind of the seal or the like at that time is added to the imprint figure. Thus, a final imprint pattern is obtained. Further, the CPU instructs the display unit 33 to display the final imprint pattern. Then, an operation of inputting the imprint figure information is terminated (steps 307 and 308). In contrast, in the case where the border taking-off flag indicates that the maker denies a border to an imprint figure (namely, in the case where the border taking-off flag is set), the border taking-off flag is reset in order to enable the device to add a border to another imprint figure when taking in such an imprint figure later. Thereafter, the CPU instructs the display unit 33 to display an input imprint figure without a border as a final imprint pattern. Then, an operation of inputting the imprint figure information is terminated (steps 309 and 308).

In the case of this embodiment, only when denying the adding of a border to an imprint figure, the maker instructs the device to do so. However, when the maker issues no instruction, the device automatically adds a border to an imprint figure. Thus, when inputting imprint figures, each of which has a border, in succession, the efficiency in making seals can be high. Practically, there are many stamps each having an imprint figure with a border. Therefore, it is very useful that a seal making device is so constructed as to automatically add a border to the imprint figure of a seal. Further, this is very useful from the viewpoint of preventing an object from being stained when imprinting.

Incidentally, the present invention is not limited to the seventh embodiment and the previously described embodiments. Further, examples of modifications of the seventh embodiment of the present inventions are as follows.

(23) In the case of the seventh embodiment, when inputting an imprint figure, a border is automatically added to the imprint figure. Instead, the border may be added thereto when making a negative film (in the case of the above described embodiment, when performing the printing of the imprint figure on the seal face member 42).

(24) In the case of the seventh embodiment, it is premised that a border is added to an imprint figure. Further, only when a border is not added thereto, the maker issues an instruction to the device. Instead, it may be instructed by using a DIP switch or the like which of the operation of adding of a border thereto and the operation of denying of a border thereto, which operations are weighted equally. Moreover, it may be instructed correspondingly to each imprint figure whether or not a border should be added thereto.

(25) The function for adding a border to an imprint figure automatically may be built into a seal making device which employs only an image reading method as a method for inputting an imprint figure or into another seal making device which employs only a keying input method as the method for inputting an imprint figure.

Next, an eighth embodiment of the present invention will be described hereinafter in detail by referring to FIG. 30.

In the case of each of the first, third, fourth, fifth and sixth embodiments, namely, in the case of the seal making device in which the image reading device is provided in the main body thereof, the image reading device occupies large space. Moreover, a unit for irradiating ultraviolet light onto the resin seal face member also occupies large space. Thus, these embodiments have drawback in that the seal making devices thereof become large and expensive. Furthermore, in the case of each of such devices, which is provided with the image reading unit, the number of parts becomes large. As a result, these embodiments have another drawback in that a failure rate becomes high.

The eighth embodiment is created to eliminate the drawbacks of such devices. Further, the eighth embodiment provides a seal making device provided with at least an image reading device as an information processing means. Moreover, the eighth embodiment is characterized in that a light source portion of the image reading device is used also as a light source of a light ray irradiating means.

Furthermore, the seal making device of the eighth embodiment is further characterized by comprising a mechanismic optical system. Thus, the mechanismic optical system is mainly described hereinbelow. Incidentally, the electrical system of the fourth embodiment is a representative of electrical systems of the embodiments including the eighth embodiment. Therefore, the description of the electrical system of the fourth embodiment should be quoted and the detail description of the electrical system of the eighth embodiment is omitted.

In the case of the seal making device of the eighth embodiment, only an image reading portion is provided as a device for inputting or taking in an imprint figure. The appearance of the seal making device of the eighth embodiment is illustrated in FIG. 31.

Figure 31:
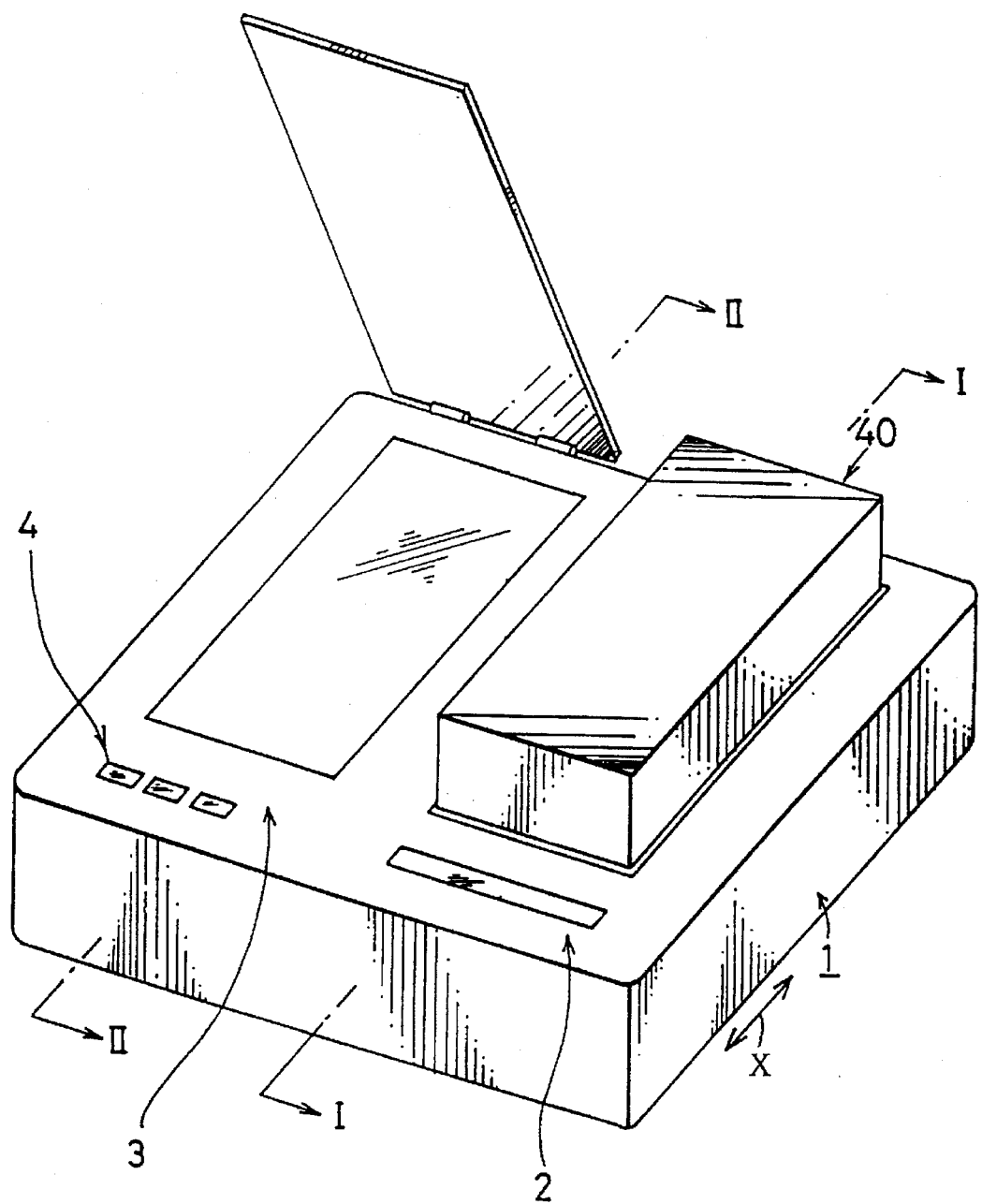
FIG. 31 is a perspective view of the appearance of a seal making device in the case of the eighth embodiment of the present invention.

As illustrated in FIG. 31, the main body 1 of the seal making device comprises a light ray irradiation portion 2 for irradiating light rays onto the main body 40 of a seal, an image reading portion 3 for reading an original picture (namely, an imprint figure) and a switch group 4 for activating the light ray irradiation portion (namely, an imprint figure optical transfer portion) 2 and the image reading portion 3.

Figure 32:
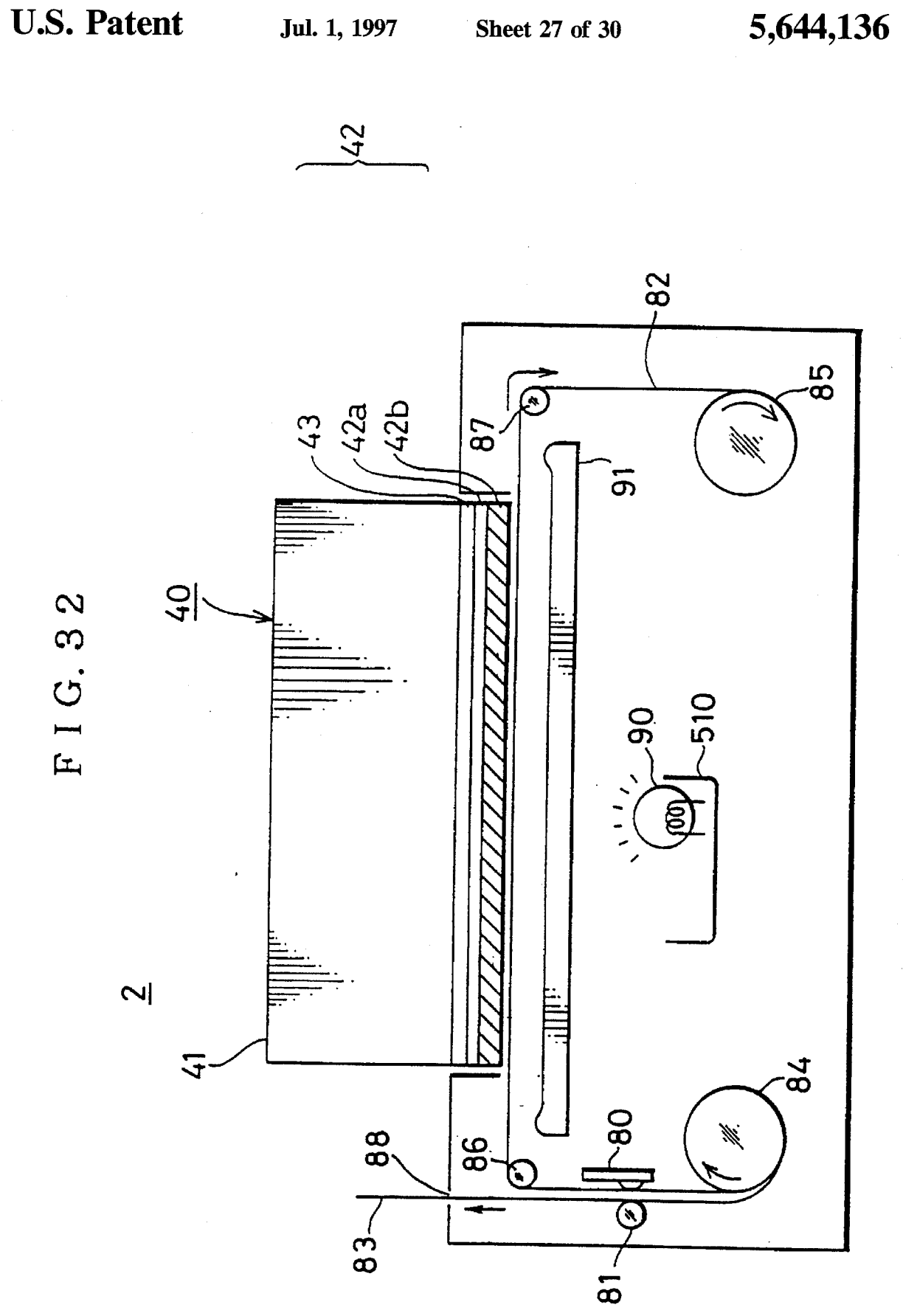

FIG. 32 is a schematic sectional view of the light ray irradiation portion 2 taken on line I—I of FIG. 31. Hereinafter, the configuration of the light ray irradiation portion 2 will be described by referring to FIG. 32.

The light ray irradiation portion (namely, the imprint figure optical transfer portion) 2 is primarily composed of a print unit and an ultraviolet light irradiating unit.

The configuration of this print unit is basically the same as that of the print unit of the fourth embodiment of the present invention, which is illustrated in FIG. 4. Therefore, the same reference characters designate the same composing elements illustrated in FIG. 20. Namely, the print unit comprises of a fixed type print head 80, a platen roller 81, an ink ribbon 82, a printing paper ribbon 83, a supply reel 84, a take-up reel 85 and rollers 86 and 87 for changing the direction in which the ink ribbon 82 moves forward.

The ink ribbon 82 and the printing paper ribbon 83 put upon the ink ribbon 82 are wound around the supply reel 84. Further, these ribbons remaining overlapped are pulled out of the supply reel 84 and advance to a printing position between the print head 80 and the platen roller 81.

The print head 80 generates heat under the control of a control portion (not shown) and transfers ink of the ink ribbon 82 onto the printing paper ribbon 83.

Here, note that portions of the ink ribbon 82 of the pthermal transfer type having been subject to the transferring of the imprint figure lose ink and become transparent. Namely, after the transfer processing is performed, the ink ribbon 82 is composed of a part being capable of transmitting ultraviolet light (that is, a part from which ink is removed) and another part preventing the transmission of ultraviolet light (that is, a part on which ink remains). Thus, after the printing of the imprint figure is effected and the portions of the ink ribbon corresponding to the imprint figure become transparent, such an ink ribbon 82 is utilized as a negative film.

The printing paper ribbon 83 and the ink ribbon 82, which remain overlapped, pass through a printing portion comprising the print head 80 and the platen roller 81 and thereafter reach the roller 86. Then, the printing paper ribbon 83 is separated from the ink ribbon 82 by the roller 86 (and a ribbon separation mechanism associated with the roller 86).

The separated ink ribbon 82 then passes directly under the ultraviolet setting resin layer 42b of the main body 40 of the seal. Thereafter, the direction, in which the ink ribbon 82 advances, is changed by the roller 87. Subsequently, the ribbon is taken up by the take-up reel 85. Incidentally, when performing an optical transfer processing of the imprint figure for hardening portions of the ultraviolet setting resin layer 42b corresponding to the imprint figure, the ink ribbon 82 stops in a position where the transparent part (namely, the negative film) of the ink ribbon 82 corresponding to the imprint figure is placed just under the ultraviolet setting resin layer 42b.

On the other hand, the separated printing paper ribbon 83, on which the imprint figure is printed, is pulled out of the main body 1 of the seal making device through an ejection opening portion 88. Then, the ribbon 83 is cut by a manual or automatic cutter (not shown). A portion of the printing paper ribbon 83 cut in this manner is utilized for checking the imprint figure. Further, it can be visually checked by attaching the cut portion of the printing paper ribbon 83 to the top portion of the main body 40 of the seal what face the main body 40 of the seal has.

For instance, an ultraviolet irradiating light source 90 constituted by a fluorescent lamp is provided in the mechanismic optical system in, for instance, a fixed manner, as the ultraviolet light irradiating unit. Further, the turning-on and turning-off thereof is controlled by the control portion (not shown). Moreover, a transparent plate 91, which is caused by an advancement/retreat mechanism (not shown) to advance or retreat, is provided facing a surface of the ink ribbon 82, the other surface of which is opposite to the ultraviolet setting resin layer 42b of the seal face member 42. Namely, ultraviolet light emitted from the ultraviolet irradiating light source 90 reaches the ultraviolet setting resin layer 42b by way of the transparent plate 91 and the ink ribbon 82. Further, the transparent plate 91 is moved upwardly so as to closely contact to the ink ribbon 82 serving as the negative film and to the ultraviolet setting resin layer 42b. Upon completion of light irradiation processing, the transparent plate 91 is moved downwardly to such a position that the ink ribbon 82 is not obstructed.

Both of end portions of the transparent plate 91 in the direction, in which the ink ribbon 82 runs, are rounded off in such a fashion not to damage the ink ribbon 82 when coming in contact therewith. Further, the rounded end portions of the transparent plate 91 protrude slightly from the top surface thereof in such a manner to serve to increase the tension of the ink ribbon and contact more closely to the layer 42b when the transparent plate 91 goes up to the ink ribbon 82 and makes this ribbon come in contact with the seal face member 42 of the seal.

Figure 33:
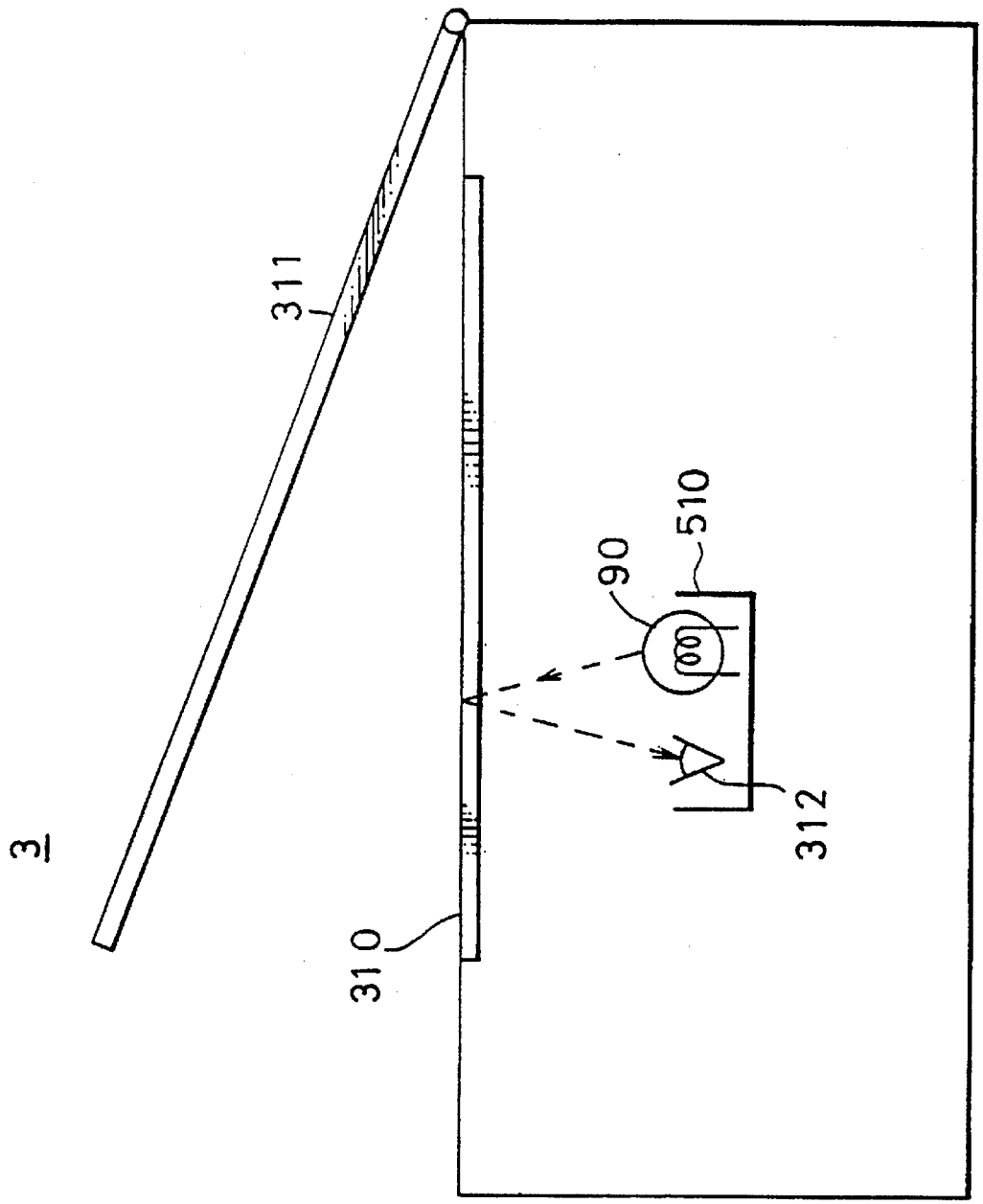
FIG. 33 is a schematic sectional view of an image reading portion 2 taken on line II—II of FIG. 31.

FIG. 33 is a schematic sectional view of an image reading portion 3 taken on line II—II of FIG. 31. Hereunder, the configuration of the image reading portion 3 will be described by referring to FIG. 33.

The image reading portion 3 is provided with a transparent original-picture stage plate 310, on the top surface of which a sheet of an original picture (namely, an imprint figure) is laid by facing the written or drawn surface thereof down. The original-picture stage plate 310 has almost the same area and shape as those of the seal face member 42 of the maximum main body 40 of a seal, which the body 1 of the seal making device can handle. A cover 311 covers up the original-picture stage plate 310 so tightly that light rays for reading the original picture can not come therethrough. Thereby, the quality of an read image can be secured.

Further, under the original-picture stage plate 310, there are provided an irradiating light source 90 and a one-dimensional photoelectric conversion sensor 312 which are mounted on the movable mechanism 510 capable of advancing and retreating in X-direction. Further, the one-dimensional photoelectric conversion sensor 32 receives light which is emitted from the irradiating light source 90 and further reflected from the original picture laid on the original-picture stage plate 310. Then, the sensor 32 performs a photoelectric conversion on the received light and gives original-picture information (namely, imprint figure information) to an electrical processing portion (not shown) as a serial electric signal.

Figure 30:
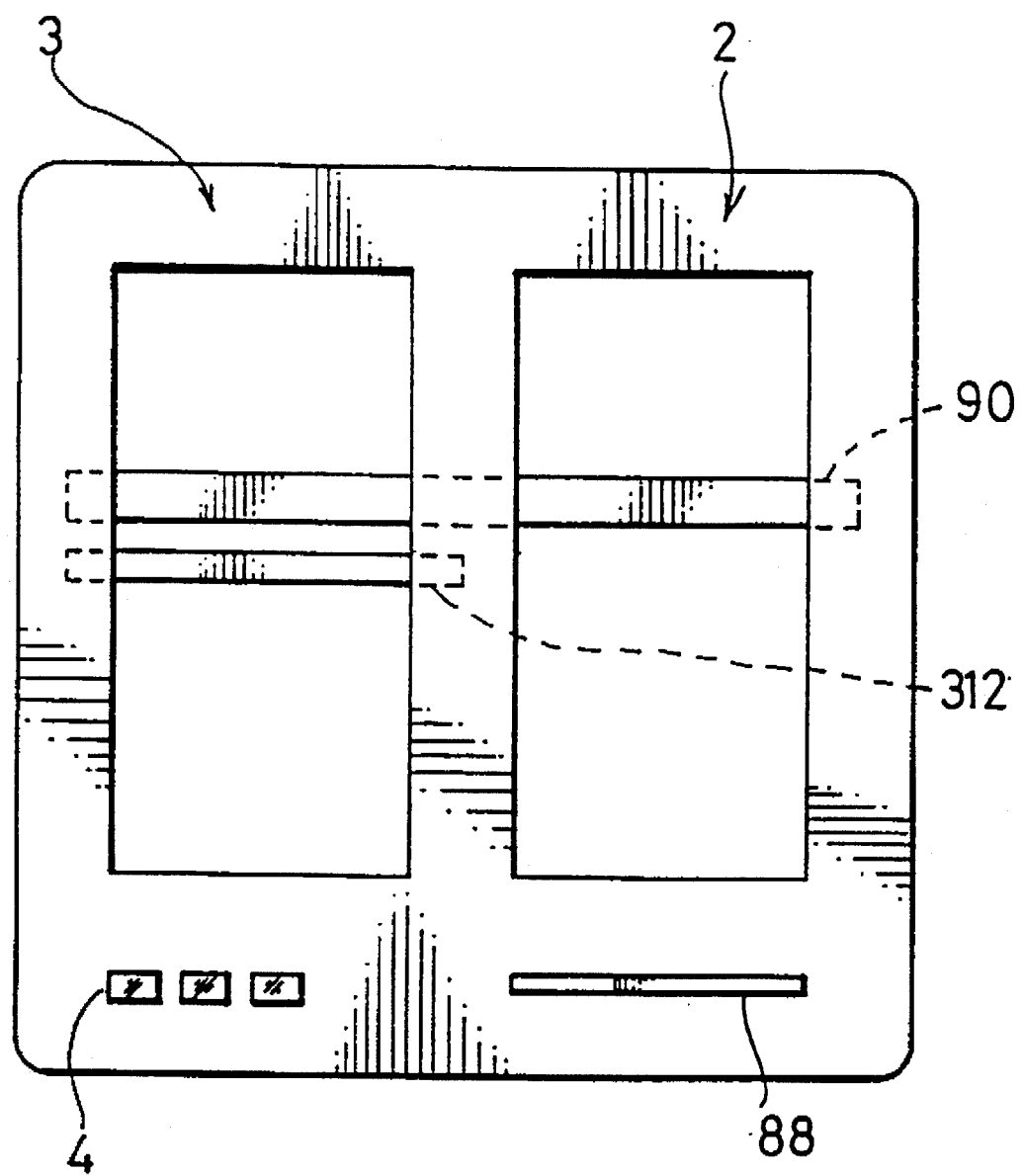
FIG. 30 is a top plan view of the appearance of a seal making device in case of the eighth embodiment of the present invention.

FIG. 30 is a schematic plan view of the appearance of the main body 1 of the seal making device being in a state in which the cover 311 is opened (but is omitted in FIG. 30) and the main body 40 of the seal is not loaded thereinto.

As shown in FIG. 30, the one-dimensional photoelectric conversion sensor 312 mounted on the movable mechanism 510 extends only under the image reading portion 3. The irradiating light source 90 mounted on the movable mechanism 510 extends over both of the light ray irradiation portion 2 and the image reading portion 3 and is used as a light source for reading an image and also as a light source for irradiating light rays onto the seal face member 42. The irradiating light source 90 may be positioned at a fixed place when irradiating light rays onto the seal face member 42. Incidentally, when the irradiating light source 90 is fixed, it is more effective to provide a reflector (namely, a reflecting plate) thereabout to diffuse light.

Further, it is preferable that light emitted by the irradiating light source 90 includes both of ultraviolet and visible light. This is because of the facts that ultraviolet emitted therefrom functions effectively as light emitted from a light source for irradiating light onto the seal face member 42 and that visible light emitted therefrom functions effectively as light emitted from a light source for reading an image (incidentally, the ultraviolet may be used for reading an image).

The seal making device comprising the composing portions described hereinabove makes a seal by performing the following procedure.

First, the maker of the seal puts an original picture on the original-picture stage plate 310 by facing the surface of a sheet of an original picture, on which a desired imprint figure is drawn, down thereon. Then, the maker closes the cover 311 and further pushes down a reading instruction switch (indicated by reference numeral 4) to instruct the device to read an image of the imprint figure. Thereby, the image reading portion 3 is activated and performs an operation of reading an image. Thereafter, the read image information (namely, the read imprint figure information) is temporarily stored in a memory (not shown). Incidentally, when reading the image, the irradiating light source 90 is activated naturally.

Next, the maker depresses a negative film making instruction switch (also indicated by reference numeral 4) to instruct the device to make a part serving as a negative film. Thereby, a print processing is performed by the print head 80 according to the imprint figure information stored temporarily. Then, the printing paper 83 having the imprint figure similar to that of a negative film is ejected from the device. Moreover, a part of the ink ribbon 82, which part serves as a negative film, is carried to a position just under the seal face member 42 of the main body 40 of the seal.

After having checked the imprint figure, which should be materialized on the main body 40 of the seal, on the basis of the ejected printing paper 83, the maker loads the main body 40 of the seal into the main body 1 of the seal making device. Then, the maker instructs the device to perform an optical transfer of the imprint figure onto the seal face member 42 by depressing a face member irradiating instruction switch (also indicated by reference numeral 4). At that time, the transparent plate 91 goes up to make the ink ribbon 82 contact closely to the ultraviolet setting resin layer 42b. Thereafter, the irradiating light source 90 emits light for a predetermined period of time. Incidentally, the irradiating light source 90 may be made to move gradually in X-direction.

As the result of such irradiation of light, an irradiated part (an imprint figure part) of the ultraviolet setting resin layer 42b of the seal face member 42 hardens. For example, during the irradiation of the light, an irradiation-in-progress indication lamp constituted by, for instance, an LED (not shown) is turned on. When the predetermined period of time for the irradiation of the light expires, this lamp is turned off. When noticing the termination of the irradiation of the light from the turning-off of the lamp, the maker separates the main body 40 of the seal from the main body 1 of the seal making device. Then, the maker washes the ultraviolet setting resin layer 42b by the predetermined kind of liquid to remove parts thereof other than the hardened part thereof. Thereby, the uneven face of the seal is completed.

Incidentally, the main body 40 of the seal may be loaded again into the main body 1 of the seal making device again to thereby secure the fixation of the hardened part, namely, the imprint figure.

Hence, in the case of the eighth embodiment, the irradiating light source 90 is used as a light source for both of the image reading portion 3 and the light ray irradiating portion 2 (namely, the imprint figure optical transfer portion). Thus, the number of parts can be reduced. Consequently, the reliability of the device can be increased. Moreover, the size of the device can be small by further using a drive unit in common for the light source.

Next, yet another seal making device embodying the present invention, namely, a ninth embodiment of the present invention, which is a modification of the eighth embodiment of the present invention, will be described in detail by referring to the accompanying drawings. Incidentally, the configuration of the print unit is basically the same as that of the print unit of the third embodiment of the present invention, which is illustrated in FIG. 16. Therefore, the same reference characters designate the same composing elements illustrated in FIG. 16.

In the case of the seal making device of the ninth embodiment, only an image reading portion is provided as a device for inputting or taking in an imprint figure. The appearance of the seal making device of the ninth embodiment is illustrated in FIG. 34. Incidentally, in FIG. 34, the same reference characters designate the same or corresponding portions illustrated in the drawings described hereinbefore.

As illustrated in FIG. 34, the main body 1 of the seal making device comprises a light ray irradiation portion 2 for irradiating light rays onto the main body 40 of a seal, an image reading portion 3 for reading an original picture and a switch group 4 for activating the light ray irradiation portion (namely, an imprint figure optical transfer portion) 2 and the image reading portion 3, which are arranged in a line in X-direction.

FIG. 35 is a schematic sectional view of the light ray irradiation portion 2 and the image reading portion 3 taken on line III—III of FIG. 34. As shown in FIG. 35, the configuration of the image reading portion 3 is similar to that of the image reading portion of the eighth embodiment.

The light ray irradiation portion 2 is comprised of a light irradiating light source 90 and a print head 70 mounted on a movable mechanism 71 which advances and retreats in X-direction. The print head 70 is of the ink jet type and performs a printing of an imprint figure directly on an ultraviolet setting resin layer 42b of the main body 40 of a seal (namely, ink is made to adhere thereto). Therefore, the ink having adhered to the ultraviolet setting resin layer 42b serves as a negative film. Incidentally, the home position of the print head 70 in a standby time is set outside the range in which the movable mechanism 510 loaded with the irradiating light source 90 can move.

In the case of the ninth embodiment, the movable mechanism 510 loaded with the irradiating light source 90 is adapted to move over the light irradiation portion 2 and the image reading portion 3.

Further, a seal making procedure in the case of the ninth embodiment with the above described configuration is similar to that in the case of the eighth embodiment. Thus, the description of the seal making procedure is omitted.

Therefore, in the case of the ninth embodiment, the irradiating light source 90 is also used as the light source for the image reading portion 3 and for the light ray irradiation portion (namely, the imprint figure optical transfer portion) 2. Thus, the number of parts can be reduced. Consequently, the reliability of the device can be increased. Moreover, the size of the device can be small by further using a drive unit or the like in common for the light source.

Incidentally, the present invention is not limited to the eighth and ninth embodiments and the previously described embodiments. Further, examples of modifications of the eighth and ninth embodiment of the present inventions are as follows.

(26) Namely, characteristic features of the eighth and ninth embodiments can be applied to a seal making device which employs not only an image reading method but a character input method as a method for inputting imprint figure information.

(27) A method for making a part serving as a negative film is not limited to the method employed in the above described embodiments. For example, a liquid crystal display panel may be made to serve as a negative film by setting the turning-on and turning-off of each cell thereof. Alternatively, a part of the heat reversible transmittance changing film, which part corresponds to the imprint figure or the background of the imprint figure is selectively changed into a transparent state, may be made to serve as a negative film.

Moreover, the present invention is not limited to the embodiments described hereinabove. Further, examples of modifications connected with all or many of the first to ninth embodiments of the present inventions are as follows.

(28) A resin, which is hardened by visible light instead of ultraviolet, may be employed as a material for the seal face member. In this case, the range of the wavelength of the visible light irradiated from the irradiating light source is different from those employed in the cases of the embodiments. Moreover, a thermosetting resin may be employed as a material for the seal face member. Furthermore, a resin, from which a portion softened by applying ultraviolet, visible light or heat thereto can be removed, may be employed as a material for the seal face member. In this case, the remaining portions of the resin form an imprint figure. In the case of using the thermosetting or thermosoftening resin, the characteristic features of the aforesaid embodiments can be employed if the light energy of light rays is used as a heat source.

(29) Incidentally, in the case of each of the aforementioned embodiments, the operation of inputting or taking in the imprint figure by an image reading method and that of making a part serving as a negative film are performed separately. However, these operations may be performed concurrently. In such a case, the device may immediately transfer data obtained by the image reading to a portion for making a part serving as a negative film. Thus, a memory for storing imprint figure information can be saved or omitted. Alternatively, a memory having small capacity (corresponding to 2 or 3 lines of an image) can be used. Even in such a case, the irradiation of light for reading an image and that of light onto the seal face member are performed at different moments. Thus, a single light source can be used for both of the irradiation of light for reading an image and that of light onto the seal face member.

In the foregoing description, seal making devices have been mainly described. However, the characteristic features of such devices can be directly applied to a relief or intaglio figure plate making device for making a relief or intaglio figure plate in which convex and concave portions representing a figure such as a character are formed on the surface of a plate-like substrate such as a name plate and a door plate. Therefore, as previously stated, the term "seal making device" should be construed as including a relief or intaglio figure plate making device for making a plate, one or both of the front and back sides of which are engraved with relief or intaglio figures or patterns. Thus, the term "seal making device" recited in claims represents a concept including a relief or intaglio figure plate making device. Additionally, in the foregoing description, the terms "seal" and "stamp" are used. However, in a case where an object engraved with a relief or intaglio figure is a relief or intaglio figure plate, these terms should be construed as portions of the relief or intaglio figure plate, which portions correspond to a relief or intaglio figure.

As described above, the seal making device according to the present invention is suitable for easily and quickly making a desired relief or intaglio figure plate such as a seal or stamp, a name plate and a door plate, regardless of whether the relief or intaglio figure plate is for business use or for private use, and independent of the size and shape of the relief or intaglio figure.

What is claimed is:

1. A seal making device, comprising:

imprint figure information generating means for generating imprint figure information;

a seal face member structured to have an imprint figure formed thereon, and comprising an ultraviolet setting resin layer;

a light source disposed oppositely to the ultraviolet setting resin layer;

a liquid crystal panel portion for transferring an imprint, disposed between the light source and the seal face member;

lens means disposed between the liquid crystal panel portion and the ultraviolet setting resin layer, for converging light rays onto the ultraviolet setting resin layer, the light rays being emitted from the light source and being transmitted through the liquid crystal panel portion; and control means for controlling the liquid crystal panel portion so as to transfer imprint figure information onto the ultraviolet setting resin layer by selectively transmitting the light rays from the light source on the basis of the imprint figure information generated from the imprint figure information generating means;

the light source comprising an ultraviolet irradiating light source equipped with a first parabolic mirror, a visible light irradiating light source spaced apart from and disposed oppositely to the ultraviolet irradiating light source and equipped with a second parabolic mirror, and a swinging mirror disposed between the ultraviolet irradiating light source and the visible light irradiating light source so as to permit the liquid crystal panel portion to be back-lighted by a visible light and an ultraviolet light;

the liquid crystal panel portion being composed of a liquid crystal panel capable of transmitting the ultraviolet light and the visible light, respectively.

2. A seal making device according to claim 1, wherein the imprint figure information generating means generates the imprint figure information by reading an imprint figure from a sheet on which the imprint figure is preliminarily formed.

3. A seal making device according to claim 2, wherein the imprint figure information generating means comprises an imprint light source for emitting light rays having wavelengths which are within a predetermined range, a light scanning portion for causing light emitted from the imprint light source to scan the sheet, and photoelectric conversion means for receiving light reflected from the sheet and for generating an electric signal corresponding to the received light.

4. A seal making device according to claim 1, wherein the imprint figure information generating means comprises code information input means for inputting code information and pattern information generating means for generating pattern information corresponding to inputted code information.

5. A seal making device according to claim 1, wherein the lens means comprises a group of zoom lenses.

6. A seal making device according to claim 2, wherein the lens means comprises a group of zoom lenses.

7. A seal making device according to claim 3, wherein the lens means comprises a group of zoom lenses.

8. A seal making device according to claim 4, wherein the lens means comprises a group of zoom lenses.

9. A seal making device, comprising:

imprint figure information generating means for generating imprint figure information;

a seal face member structured to have an imprint figure formed thereon, and comprising an ultraviolet setting resin layer;

an ink ribbon composed of a sheet member capable of transmitting an ultraviolet light, wherein a first area and a second area are disposed alternately on the sheet member along a longitudinal direction of the sheet member, the first area being covered with ink which prevents the transmission of ultraviolet light, the first area covered with ink being at least equal to a surface area of the ultraviolet setting resin layer in size, the second area being a light transmitting area and substantially equal to the first area in size;

ink ribbon supply means comprising a supply reel which is wound with the ink ribbon so as to supply the ink ribbon;

take-up reel means comprising an ink ribbon take-up reel for causing the ink ribbon supply means to supply the ink ribbon, moving the supplied ink ribbon in association with the ink ribbon supply means and thereafter taking-up the ink ribbon;

a print head for transferring a pattern of imprint figure information onto a surface of the ultraviolet setting resin layer through the first area of the ink ribbon;

control means for controlling the print head so as to transfer the pattern onto the surface of the ultraviolet setting resin layer, the pattern being a mirror image of a figure obtained by performing a reversal between white portions and black portions of an imprint figure represented by the imprint figure information;

print head moving means for moving the print head between a stand-by home position and a position wherein the print head performs printing onto the ultraviolet setting resin layer;

take-up reel driving means for driving the take-up reel so as to move the ink ribbon in such a manner that the first area and the surface of the ultraviolet setting resin layer face each other, and that, upon completion of a transferring operation of the print head, the second area and the surface of the ultraviolet setting resin layer face each other; and ultraviolet light irradiating means for irradiating ultraviolet light through the second area onto the ultraviolet setting resin layer on which the pattern is transferred by the print head.

10. A seal making device according to claim 9, wherein the imprint figure information generating means comprises code information input means for inputting code information and pattern information generating means for generating pattern information corresponding to the inputted code information.

11. A seal making device according to claim 9, wherein the imprint figure information generating means generates the imprint figure information by reading an imprint figure from a sheet on which the imprint figure is preliminarily formed.

12. A seal making device according to claim 11, wherein the imprint figure information generating means comprises an imprint light source for emitting light rays having wavelengths which are within a predetermined range, a light scanning portion for causing light emitted from the imprint light source to scan the sheet, and photoelectric conversion means for receiving light reflected from the sheet and for generating an electric signal corresponding to the received light.

13. A seal making device according to claim 9, wherein an identification mark is disposed in the first area, and the take-up reel driving means positions the first area in a position wherein the first area faces the ultraviolet setting resin layer on the basis of the identification mark.

14. A seal making device according to claim 10, wherein an identification mark is disposed in the first area, and the take-up reel driving means positions the first area in a position wherein the first area faces the ultraviolet setting resin layer on the basis of the identification mark.

15. A seal making device according to claim 11, wherein an identification mark is disposed in the first area, and the take-up reel driving means positions the first area in a position wherein the first area faces the ultraviolet setting resin layer on the basis of the identification mark.

16. A seal making device according to claim 12, wherein an identification mark is disposed in the first area, and the take-up reel driving means positions the first area in a position wherein the first area faces the ultraviolet setting resin layer on the basis of the identification mark.

17. A seal making device, comprising:

imprint figure information generating means for generating imprint figure information;

a seal face member structured to have an imprint figure formed thereon, and comprising a resin layer which is hardened by light rays having wavelengths which are within a predetermined range;

a printing paper ribbon comprising a transparent sheet;

an ink ribbon covered with ink which prevents transmission of the light rays having wavelengths which are within the predetermined range;

ribbon supply means comprising a supply reel which is wound with the printing paper ribbon and the ink ribbon which overlap each other;

printing means for performing a printing process on the printing paper ribbon and the ink ribbon which are supplied from the supply reel to print an imprint figure corresponding to imprint figure information on the supplied printing paper ribbon;

control means for controlling the printing means so as to print on the printing paper ribbon an imprint figure corresponding to the imprint figure information generated from the imprint figure information generating means, the imprint figure being a figure in which a reversal between black portions and white portions of an imprint figure represented by the imprint figure information is preformed;

ribbon separation and take-up means for separating the printing paper ribbon and the ink ribbon, which are subjected to the printing process, from each other, and for taking-up the separated ink ribbon on a take-up reel;

means for conveying the printing paper ribbon, separated by the ink ribbon separation and take-up means, along a surface of the resin layer, and for positioning an area of an imprint figure printed on the printing paper ribbon so that the area faces the surface of the resin layer; and light ray irradiating means, disposed such that the printing paper ribbon is between the resin layer and the light ray irradiating means, for irradiating the light rays having wavelengths which are within a predetermined range on the surface of the resin layer through the area.

18. A seal making device according to claim 17, wherein the imprint figure information generating means comprises code information input means for inputting code information and pattern information generating means for generating pattern information corresponding to the inputted code information.

19. A seal making device according to claim 17, wherein the imprint figure information generating means generates the imprint figure information by reading an imprint figure from a sheet on which the imprint figure is preliminarily formed.

20. A seal making device according to claim 19, wherein the imprint figure information generating means comprises an imprint light source for emitting light rays having wavelengths which are within a predetermined range, a light scanning portion for causing light emitted from the imprint light source to scan the sheet, and photoelectric conversion means for receiving light reflected from the sheet and for generating an electric signal corresponding to the received light.

21. A seal making device, comprising:

imprint figure information generating means for generating imprint figure information;

a seal face member structured to have an imprint figure formed thereon, and comprising a resin layer which is hardened by light rays having wavelengths which are within a predetermined range;

imprint figure writing means for selectively irradiating the light rays on the seal face member and for writing an imprint figure on the resin layer; and imprint figure transfer controlling means for controlling the imprint figure writing means so as to irradiating the light rays on the resin layer according to imprint figure information generated from the imprint figure information generating means;

the imprint figure information generating means comprising:

image data generating means for reading an image from a draft, and for generating data of the read image;

instruction means for instructing a contour of the seal face which is determined by shape and size of the seal face to be made;

first storage means for storing a surrounding frame defined by the contour instructed by the instruction means, the surrounding frame being intended to be formed along the contour of the seal face;

second storage means for storing the image data generated from the image data generating means;

imprint figure indicating means for reading the image data and the surrounding frame from the second storage means and the first storage means, respectively, and for indicating the image data to be displayed within the surrounding frame as an imprint figure;

third storage means for storing the imprint figure indicated by the imprint figure indicating means;

surrounding frame taking-off instructing means for instructing a prohibition against automatically adding the surrounding frame to the imprint figure;

surrounding frame taking-off flag setting means for setting a surrounding frame taking-off flag in a fourth storage means when an instruction of prohibition against automatically adding the surrounding frame is inputted by the surrounding frame taking-off instructing means;

judgment means for judging whether or not the surrounding frame taking-off flag is set in the fourth storage means; and image synthesizing means for reading the imprint figure and the surrounding frame from the third storage means and the first storage means, respectively, and for synthesizing the read imprint figure and the read surrounding frame to thereby output an imprint figure information which is composed of an imprint figure surrounded by the surrounding frame, when the judgment means judges that the surrounding frame taking-off flag is not set.

22. A seal making device, comprising:

imprint figure information generating means for generating imprint figure information;

a seal face member intended to have an imprint figure formed thereon, and comprising a resin layer which is hardened by light rays having wavelengths which are within a predetermined range;

imprint figure writing means for selectively irradiating the light rays on the seal face member and for writing an imprint figure on the resin layer; and imprint figure transfer controlling means for controlling the imprint figure writing means so as to irradiating the light rays on the resin layer according to the imprint figure information generated from the imprint figure information generating means;

the imprint figure information generating means comprising:

code information inputting means for inputting code information;

character information generating means for generating character information corresponding to the code information inputted from the code information inputting means;

instruction means for instructing a contour of the seal face which is determined by shape and size of the seal face to be made;

first storage means for storing a surrounding frame defined by the contour instructed by the instruction means, the surrounding frame being intended to be formed along the contour of the seal face;

second storage means for storing character information generated from the character information generating means as an imprint figure;

surrounding frame taking-off instructing means for instructing a prohibition against automatically adding the surrounding frame to the imprint figure;

surrounding frame taking-off flag setting means for setting a surrounding frame taking-off flag in a third storage means when an instruction of prohibition against automatically adding the surrounding frame is inputted by the surrounding frame taking-off instructing means;

judgment means for judging whether or not the surrounding frame taking-off flag is set in the third storage means; and image synthesizing means for reading the imprint figure and the surrounding frame from the second storage means and the first storage means, respectively, and for synthesizing the read imprint figure and the read surrounding frame to thereby output an imprint figure information which is composed of an imprint figure surrounded by the surrounding frame when the judgment means judges that the surrounding frame taking-off flag is not set.

23. A seal making device, comprising:

a casing;

a transparent plate disposed on a first opening in such a manner as to cover the first opening, for allowing an original-picture to be mounted thereon, the first opening being formed on a first portion of a top surface of the casing;

a seal face member intended to have an imprint figure formed thereon, and comprising a resin layer which is hardened by light rays having wavelengths which are within a predetermined range;

a second opening disposed on a second portion of the top surface, for mounting the seal face member in the second opening in such a manner that the seal face member is juxtaposed to the transparent plate;

a cover disposed on the casing so as to be operable and closable, for covering the original-picture and the transparent plate after the original-picture is mounted on the transparent plate;

an irradiation light source constructed to cross longitudinal axes of the first and second openings and to extend from the first opening to the second opening, for irradiating the light rays on the original-picture mounted on the transparent plate, and for irradiating the light rays on the resin layer of the seal face member mounted in the second opening;

photoelectric conversion means provided with an one-dimensional photoelectric conversion sensor formed so as to extend in a direction where the photoelectric conversion sensor crosses the longitudinal axis of the first opening, for receiving light reflected from the original-picture and generating an electric signal corresponding to the reflected light;

a movable mechanism constructed to mount the irradiation light source and the photoelectric conversion sensor thereon and to be able to move along the longitudinal axes of the first and second openings;

printing means for printing a pattern, represented by an imprint figure of the original-picture, on a printing paper ribbon through an ink ribbon according to an output signal from the photoelectric conversion means; and ink ribbon positioning means for conveying the ink ribbon between the irradiation light source and the seal face member mounted on the second opening and for positioning an area of the ink ribbon in a position where the area faces the resin layer of the mounted seal face member, the area being a portion used for printing the pattern.

* * * * *